United States Patent
Morimura et al.

(10) Patent No.: US 6,438,257 B1
(45) Date of Patent: Aug. 20, 2002

(54) SMALL CAPACITANCE CHANGE DETECTION DEVICE

(75) Inventors: Hiroki Morimura; Satoshi Shigematsu; Katsuyuki Machida; Akihiko Hirata, all of Tokyo (JP)

(73) Assignee: Nippon Telegraph and Telephone Corporation (JP)

( * ) Notice: Subject to any disclaimer, the term of this patent is extended or adjusted under 35 U.S.C. 154(b) by 0 days.

(21) Appl. No.: 09/347,240

(22) Filed: Jul. 2, 1999

(30) Foreign Application Priority Data

| Jul. 2, 1998 | (JP) | 10-187227 |
| Jul. 8, 1998 | (JP) | 10-193455 |
| Aug. 19, 1998 | (JP) | 10-232689 |
| Aug. 20, 1998 | (JP) | 10-233858 |
| Aug. 20, 1998 | (JP) | 10-233867 |
| Jun. 4, 1999 | (JP) | 11-157755 |
| Jun. 4, 1999 | (JP) | 11-157763 |

(51) Int. Cl.[7] ............................... G06K 9/00
(52) U.S. Cl. .................. 382/124; 382/125; 382/126; 382/127; 382/108
(58) Field of Search ........................ 382/115, 124, 382/125, 126, 108, 127; 250/208.1; 348/294; 257/291, 292, 443; 361/278, 283.1

(56) References Cited

U.S. PATENT DOCUMENTS

| 4,353,056 A | | 10/1982 | Tsikos ................. 340/146.3 E |
| 5,325,442 A | | 6/1994 | Knapp |
| 5,778,089 A | | 7/1998 | Borza |
| 5,828,773 A | * | 10/1998 | Setlak et al. ................. 382/126 |
| 5,982,608 A | | 11/1999 | Kalnitsky et al. ........... 361/288 |
| 6,049,620 A | * | 4/2000 | Dickinson et al. .......... 382/124 |

FOREIGN PATENT DOCUMENTS

| EP | 0790479 | 2/1996 |
| EP | 0779497 A3 | 12/1996 |
| EP | 0779497 A2 | 12/1996 |

(List continued on next page.)

OTHER PUBLICATIONS

Marioli D. Et al. "Measurement of Small Capacitance Variations" vol. 40, No. 2, Apr. 1, 1991 pp. 426–428.
Database Inspec 'Online! Institute of Electrical Engineers, Stevenage, GB Rey P. Et al.: "A high density capacitive pressure sensor array for fingerprint sensor application." pp. 1453–1456.

(List continued on next page.)

*Primary Examiner*—Phuoc Tran
*Assistant Examiner*—Ali Bayat
(74) *Attorney, Agent, or Firm*—Blakely Sokoloff Taylor & Zafman

(57) ABSTRACT

A small capacitance change detection device includes a capacitance detection element, signal generation circuit, signal amplification circuit, and output circuit. The signal amplification circuit includes a first transistor and first to third voltage sources. The second or third voltage source is connected to the other output terminal of the first transistor via a first switch. A voltage to be applied from the second voltage source to the other output terminal is set to have a value equal to or larger than a value obtained by subtracting a threshold voltage of the first transistor from a voltage of the first voltage source while a voltage to be applied from the third voltage source to the other output terminal is set to have a value equal to or smaller than a value obtained by subtracting the threshold voltage from the voltage of the first voltage source. The output circuit is connected to a connection point between the other output terminal of the first transistor and the first switch and, after a voltage of the second or third voltage source is applied to the connection point in an ON state of the first switch, receives the voltage at the connection point on the basis of an OFF state of the first switch and charge control by the signal generation circuit after the first switch is turned off.

59 Claims, 33 Drawing Sheets

FOREIGN PATENT DOCUMENTS

| | | | |
|---|---|---|---|
| EP | 0786745 | 1/1997 | |
| EP | 779497 | 6/1997 | |
| JP | 58055732 A | 4/1983 | ............. G01L/9/12 |
| JP | 05067965 A | 8/1991 | ........... G06F/15/64 |
| JP | 4-229716 | 8/1992 | |
| JP | 9-126918 | 5/1997 | ............. G01L/5/00 |
| JP | 52-97646 | 8/1997 | ........... G06F/15/20 |
| JP | 11118415 A | 10/1997 | ............ G01B/7/28 |
| JP | 10-163826 | 6/1998 | |
| JP | 10-163829 | 6/1998 | |
| JP | 11-508800 | 8/1999 | ........... A61B/5/117 |
| WO | 97/40744 | 11/1997 | ........... A61B/5/117 |
| WO | WO 98/52135 | 11/1998 | |

OTHER PUBLICATIONS

Database Inspec 'Online! Institute of Electrical Engineers, Stevenage, GB Jeong–Woo Lee et al: "A 600–dpi Capacitive Fingerprint Sensor Chip and Image Synthesis Technique".

Database Inspec 'Online! Institute of Electrical Engineers, Stevenage, GB Inglis C et al. "A robust, 1.8 V 250 mu W direct–contact 500 dpi fingerprint sensor".

\* cited by examiner

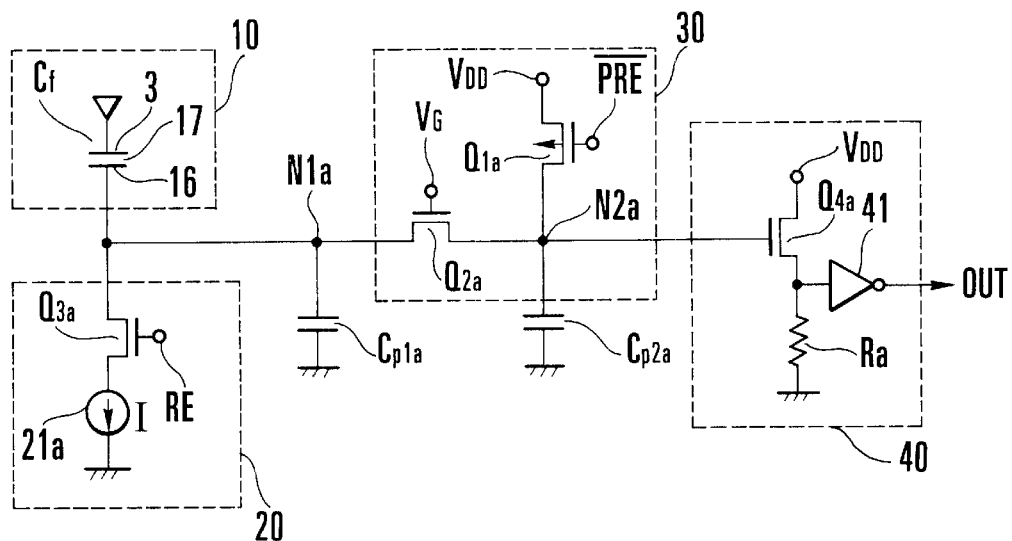
FIG. 4
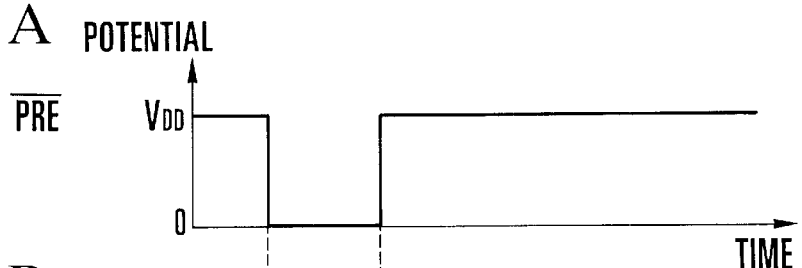
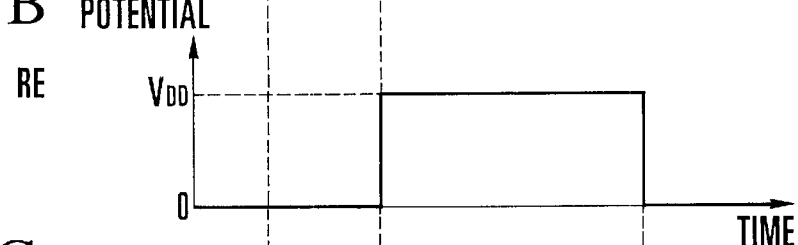
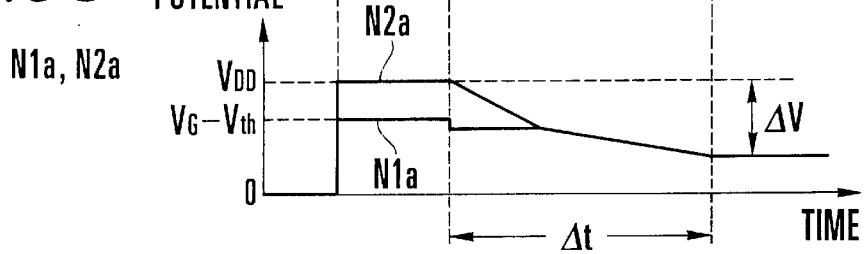

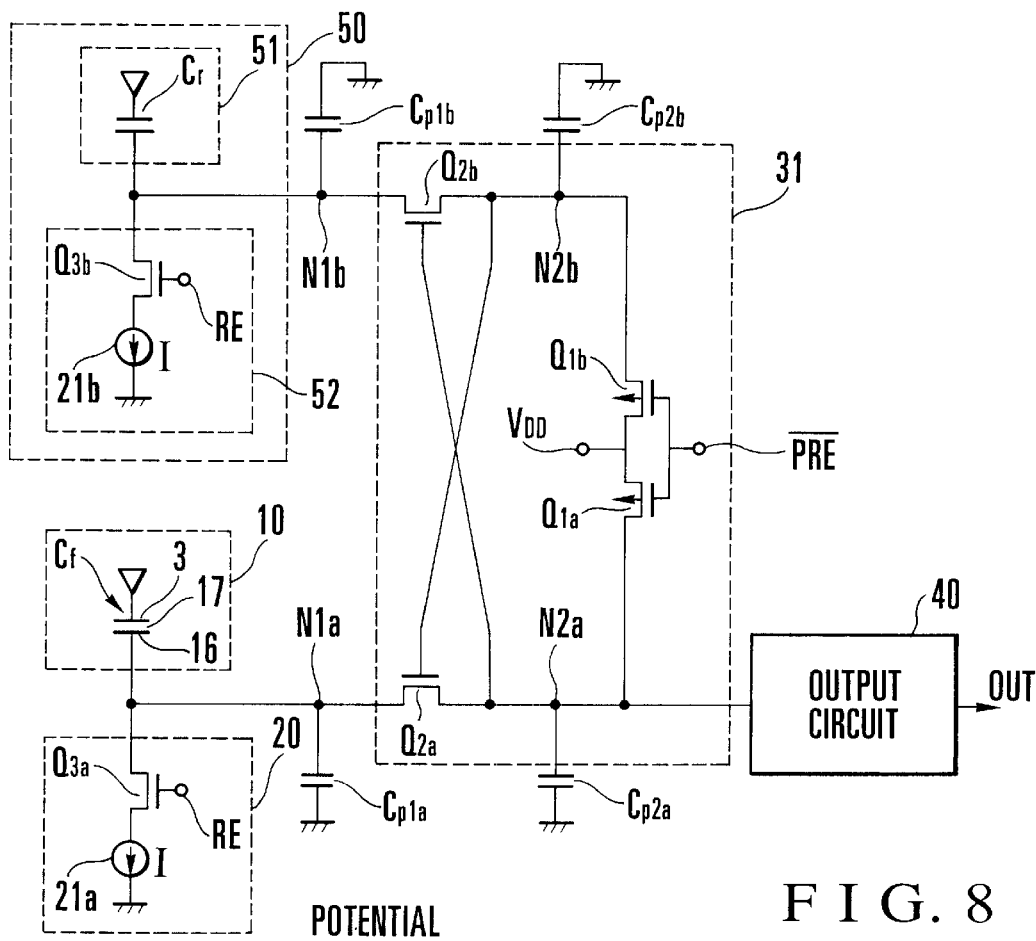
FIG. 8
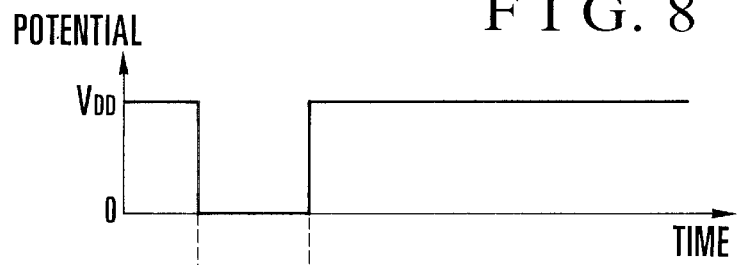
FIG. 9A $\overline{PRE}$
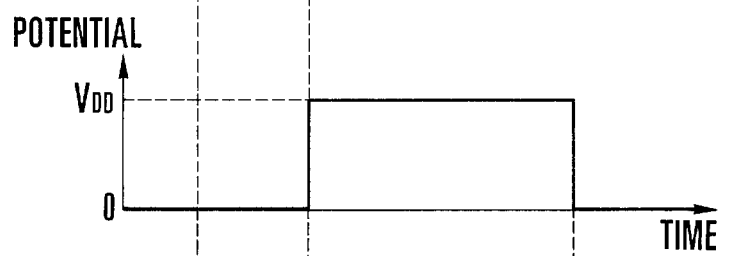
FIG. 9B RE
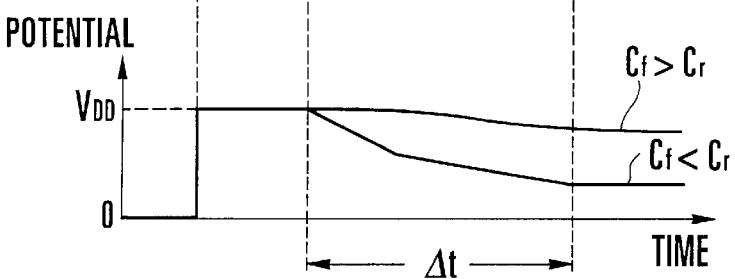
FIG. 9C N2a

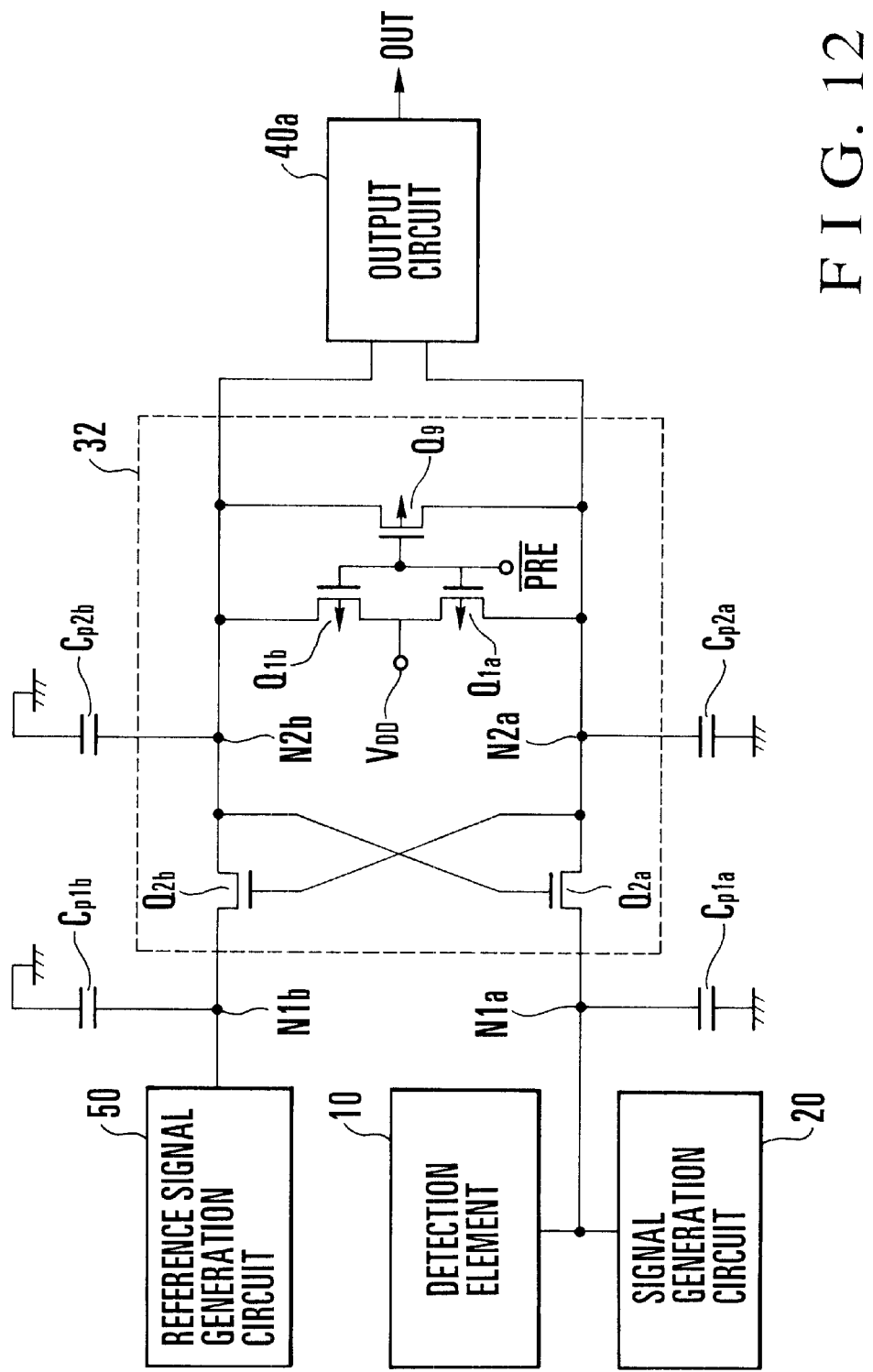
F I G. 12

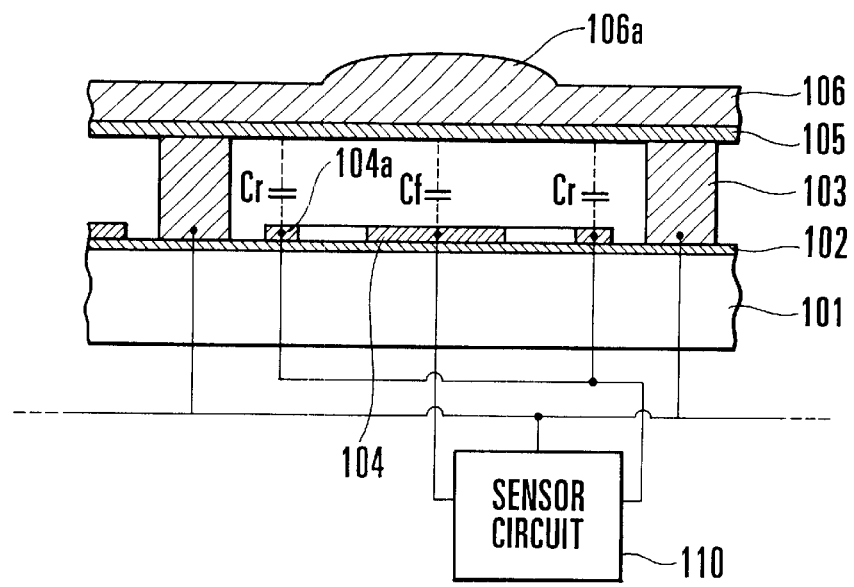
F I G. 18A
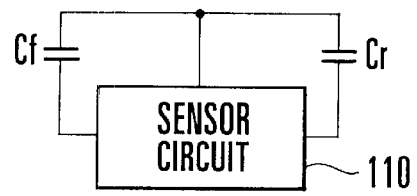
F I G. 18B
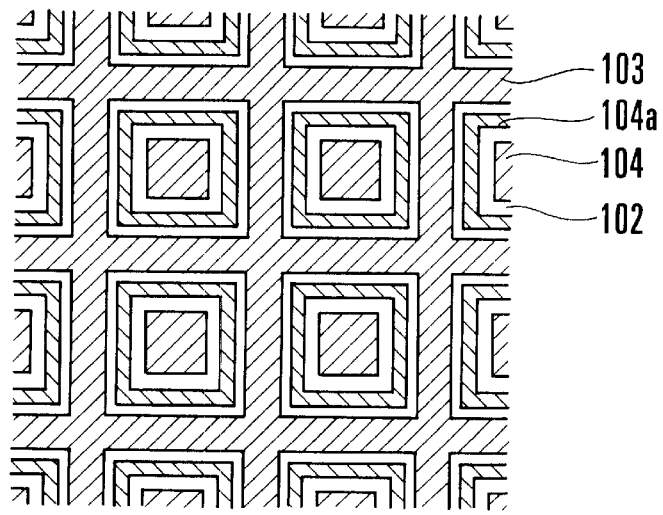
F I G. 19

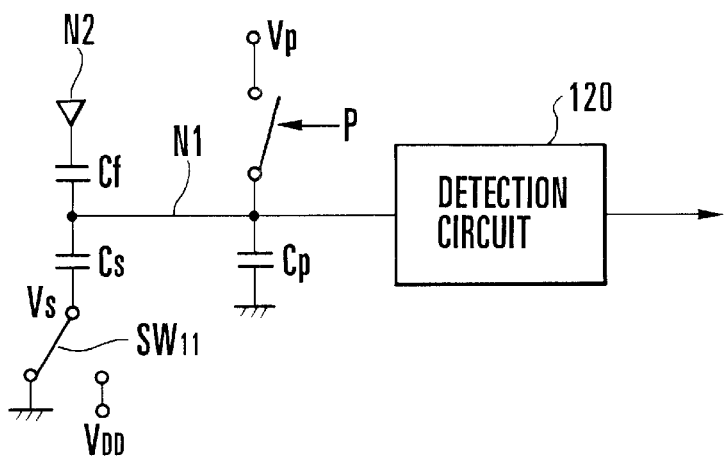
F I G. 22
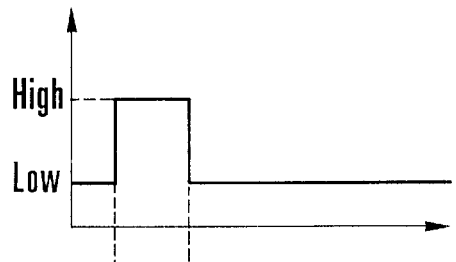
F I G. 23A
POTENTIAL P
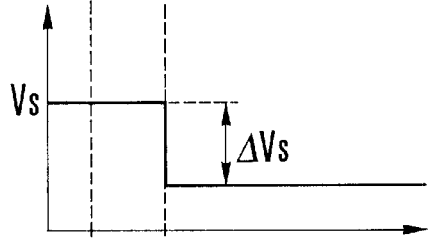
F I G. 23B
POTENTIAL Vs
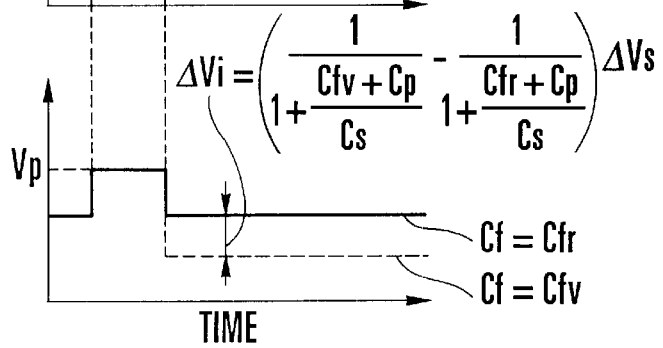
F I G. 23C
POTENTIAL AT N1

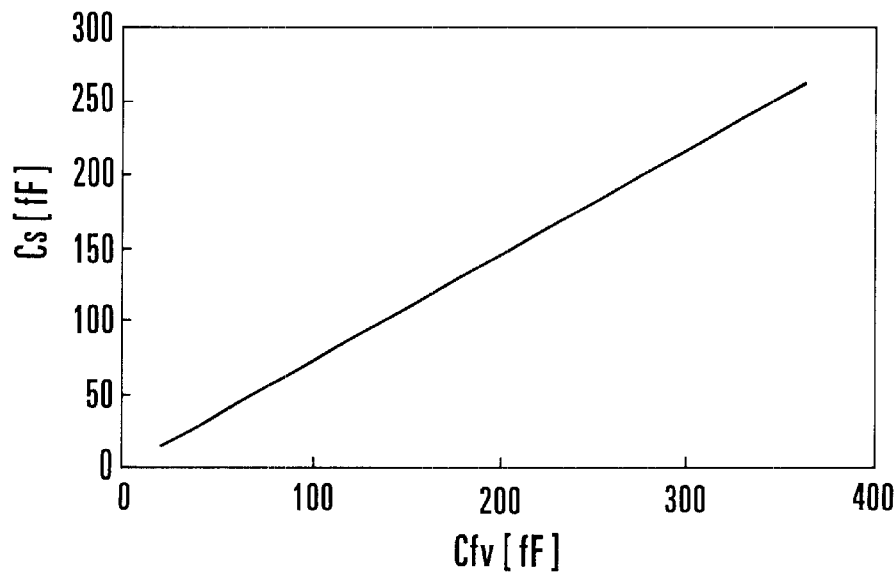
F I G. 26
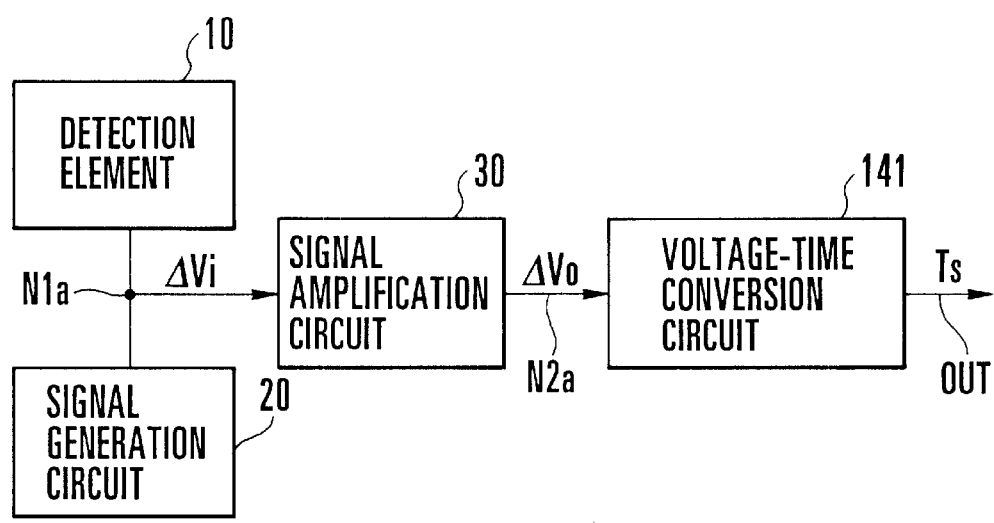
F I G. 27

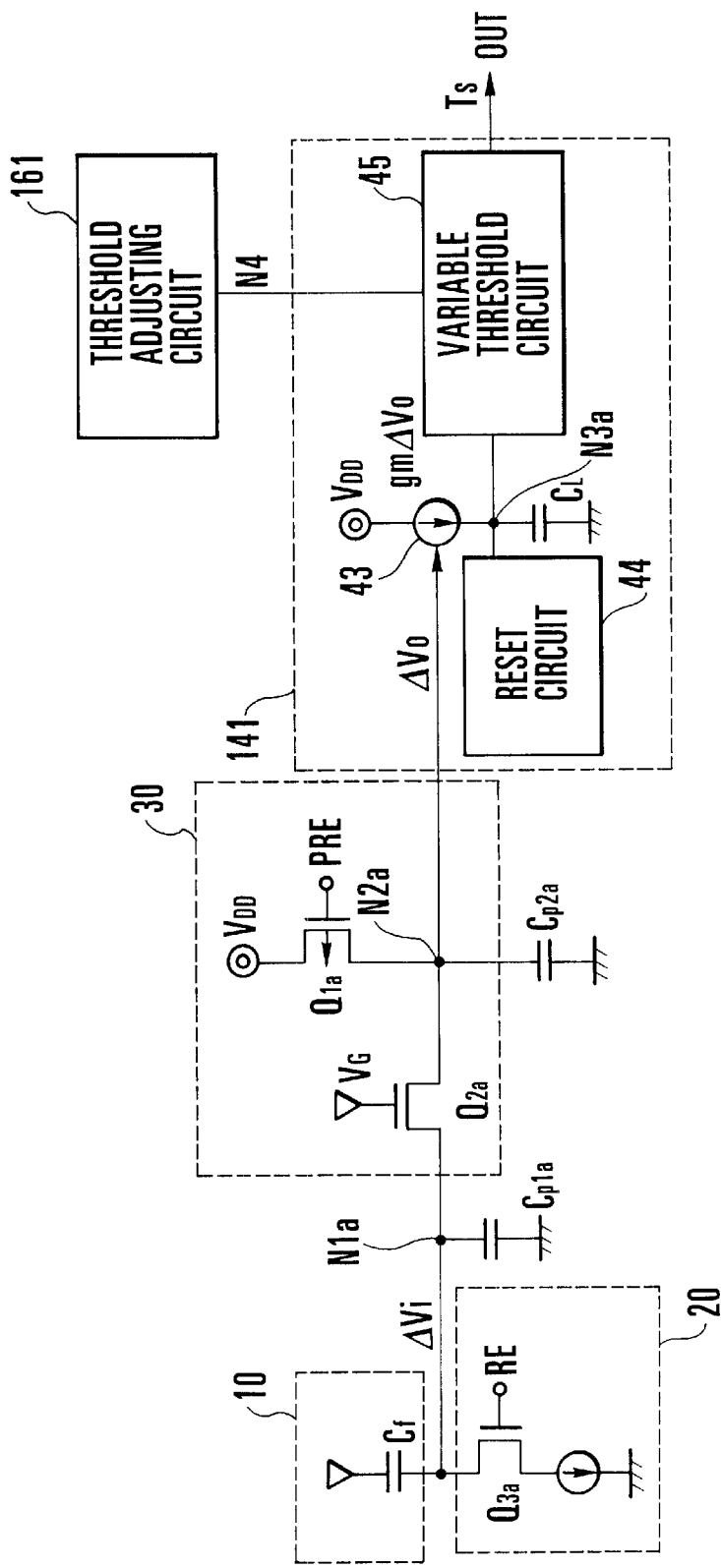
F I G. 34

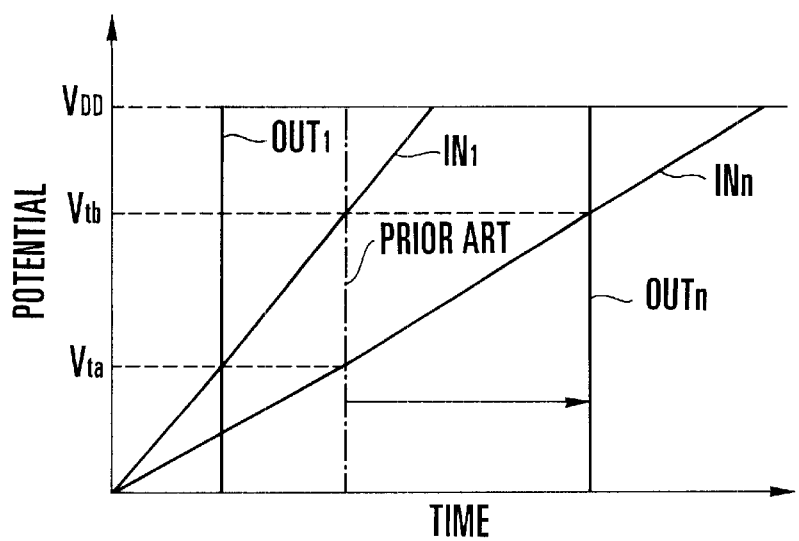
F I G. 40
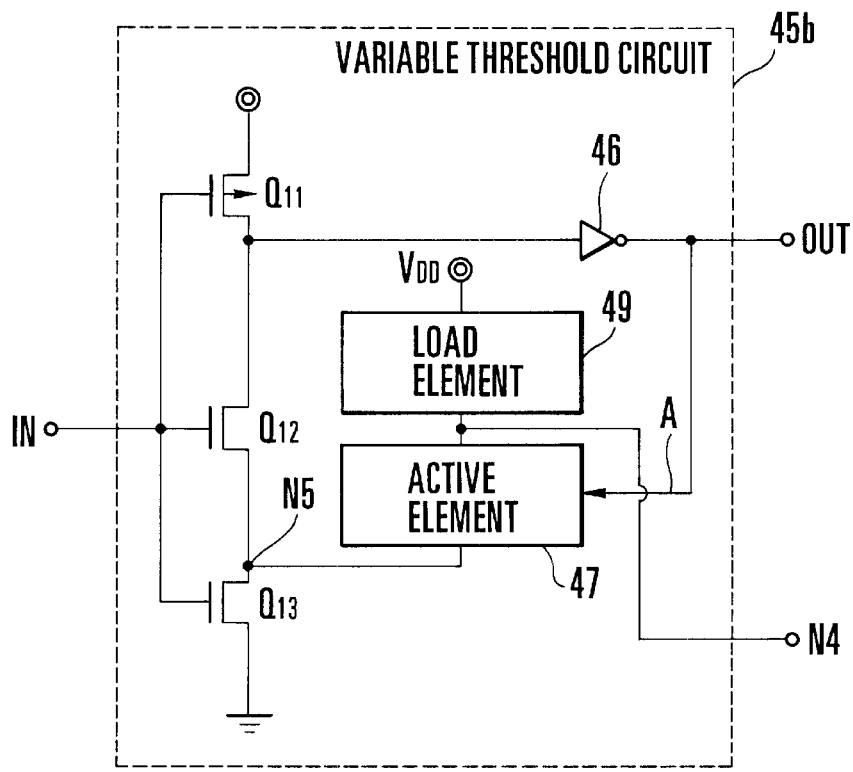
F I G. 41

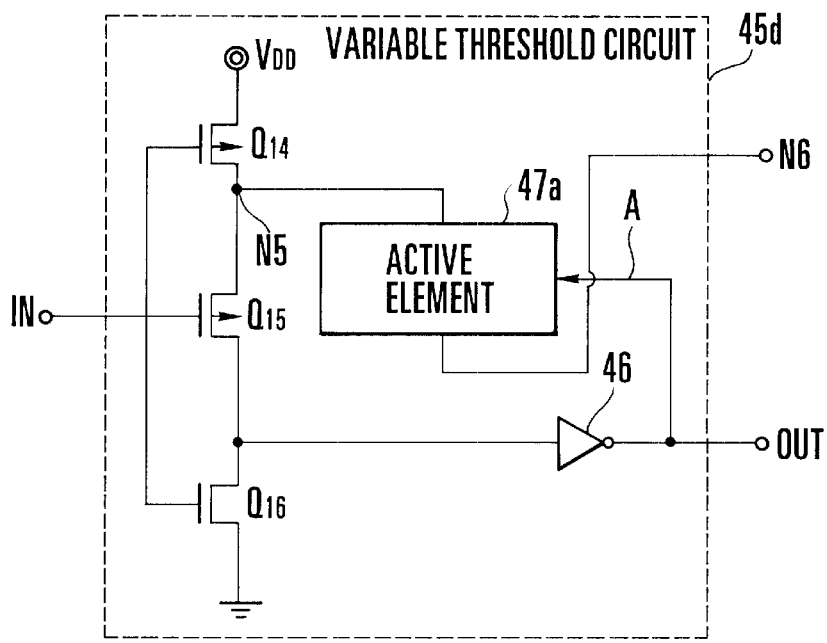
F I G. 44
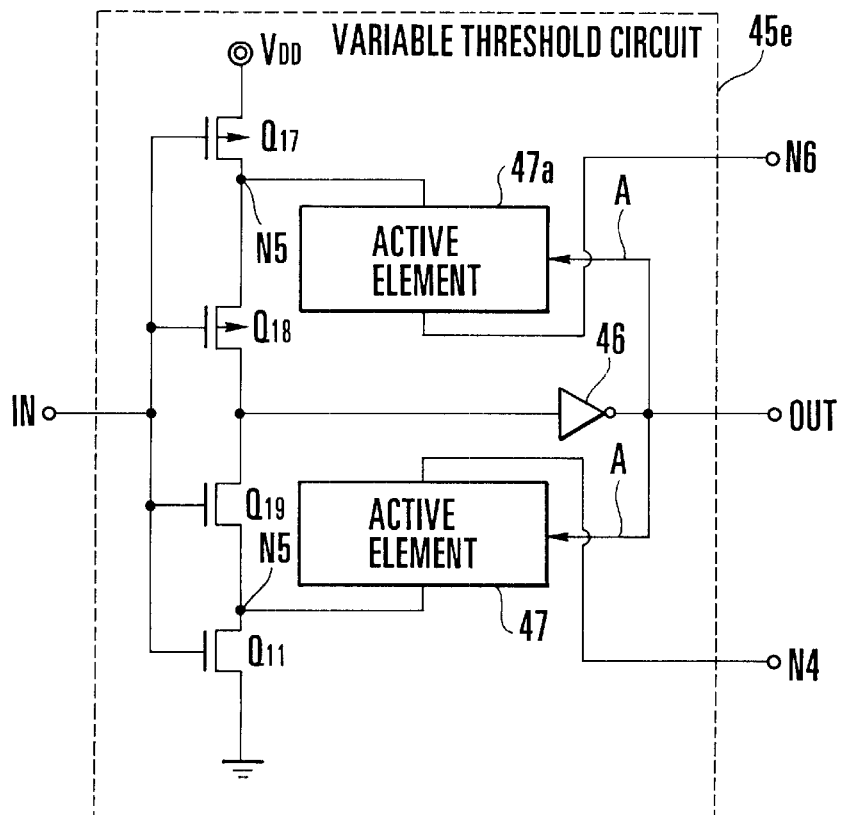
F I G. 45

FIG. 47A POTENTIAL P
FIG. 47B POTENTIAL Vs
FIG. 47C POTENTIAL AT N1
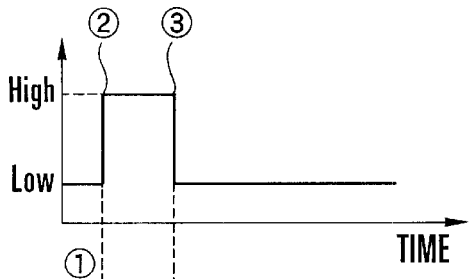
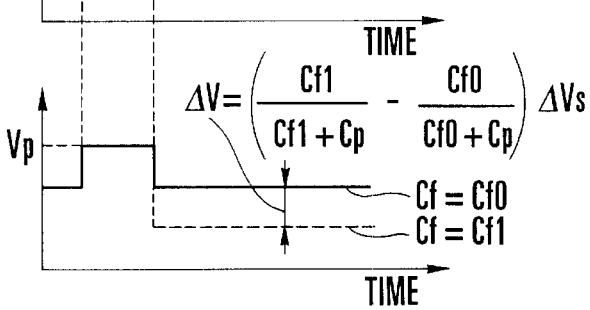
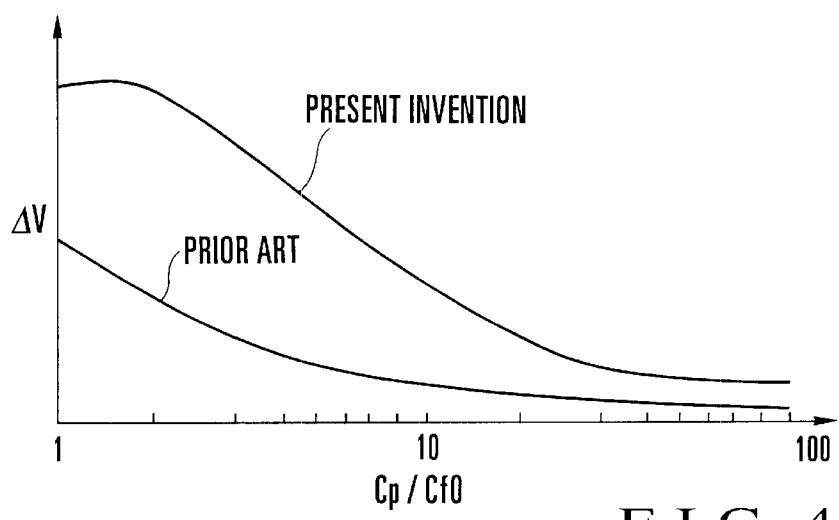
FIG. 48

FIG. 50A POTENTIAL P
FIG. 50B STATE OF F
FIG. 50C POTENTIAL AT N1
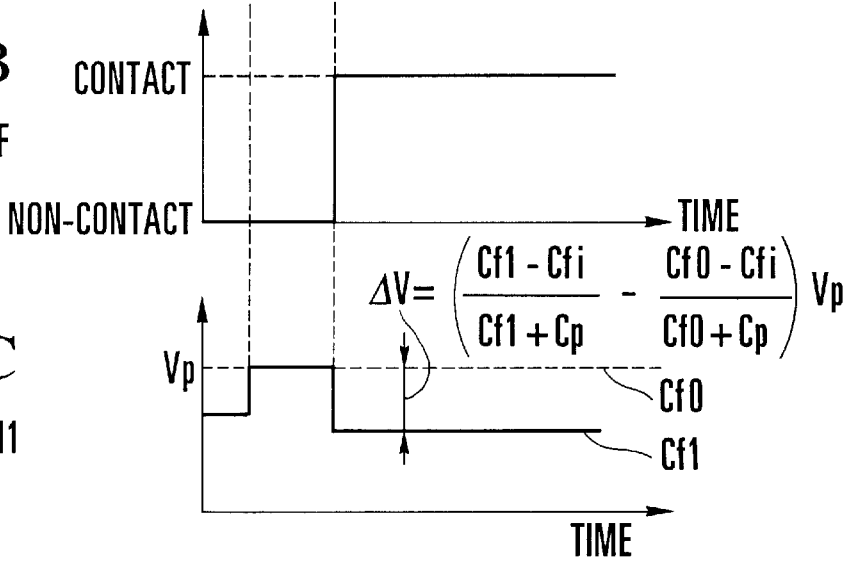
$$\Delta V = \left( \frac{Cf1 - Cfi}{Cf1 + Cp} - \frac{Cf0 - Cfi}{Cf0 + Cp} \right) Vp$$
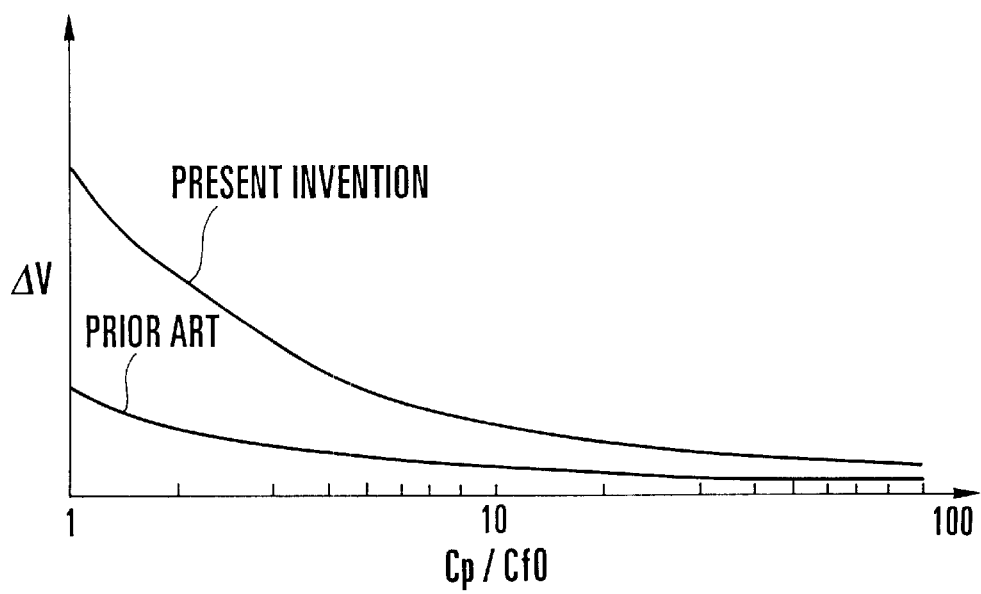
FIG. 51

PRE

RE

N1

SMALL CAPACITANCE CHANGE DETECTION DEVICE

Background of the Invention

The present invention relates to a small capacitance change detection device and, more particularly, to a small capacitance change detection device for detecting a surface shape having a small three-dimensional pattern of, e.g., the skin surface of a human finger or nose of an animal as a small change in capacitance.

As sensors for recognizing a surface shape having a small three-dimensional pattern, especially, devices aiming at fingerprint detection have been reported. As a technique of detecting a fingerprint pattern, a capacitive detection type sensor using the LSI manufacturing technology has been proposed. This is described in, e.g., "ISSCC DIGEST OF TECHNICAL PAPERS", FEBRUARY 1998 pp. 284–285.

A capacitive detection type sensor senses the three-dimensional pattern of the skin surface of a finger by detecting an electrostatic capacitance generated between the electrodes of small sense units two-dimensionally arrayed on an LSI chip and the skin of a finger in contact with the electrodes via an insulating film. Since the capacitance value changes depending on the three-dimensional pattern on the skin surface of a finger, the three-dimensional pattern of the skin surface of a finger can be sensed by detecting the small capacitance difference.

FIG. 54 shows the basic arrangement of a conventional small capacitance change detection device using this principle. This small capacitance change detection device has a detection element 310 formed from an electrostatic capacitance between an electrode and skin of a finger in contact with the electrode via an insulating film, signal generation circuit 320 for generating a voltage signal corresponding to the electrostatic capacitance value of the detection element 310, and output circuit 340 for converting the voltage signal from the signal generation circuit 320 and outputting a signal.

FIGS. 55A and 55B show the layout of the conventional small capacitance change detection device. This small capacitance change detection device has a plurality of detection elements 310, a plurality of signal generation circuits 320, and a plurality of output circuits 340. One detection element 310 and one signal generation circuit 320 construct a sense unit 301. The sense units 301 are two-dimensionally arrayed on an LSI chip to form a sensor array 302. The output circuits 340 are arranged near the sensor array 302 to form an output section 304.

Since the electrostatic capacitance value of each detection element 310 is determined depending on the distance between the electrode of the sense unit 301 and skin surface of a finger, the electrostatic capacitance value of the detection element 310 changes depending on the three-dimensional pattern of the skin surface of the finger. When a finger is depressed against the sensor array 302, each sense unit 301 outputs a voltage signal corresponding to the three-dimensional pattern of the skin surface of the finger. This voltage signal is converted into a desired signal reflecting the three-dimensional pattern of the skin surface of the finger, so the fingerprint pattern is detected.

The arrangement and operation of the conventional small capacitance change detection device shown in FIG. 54 will be described below in more detail.

FIG. 56 shows the circuit arrangement of the conventional small capacitance change detection device. Referring to FIG. 56, reference symbol Cf denotes an electrostatic capacitance formed between the electrode of the sense unit 301 and the skin surface of a finger in contact with the electrode via an insulating film. The electrode of the sense unit 301 is connected to the input side of a current source 321 of a current I through an NMOS transistor Q3. A node N1 between the electrode and transistor Q3 is connected to the input side of the output circuit 340. A power supply voltage VDD is applied to the node N1 through a PMOS transistor Q1. The node N1 has a parasitic capacitance Cp1. Signals $\overline{\text{PRE}}$ and RE are supplied to the gate terminals of the transistors Q1 and Q3, respectively.

The capacitance Cf forms the detection element 310. The current source 321 and transistor Q3 construct the signal generation circuit 320.

FIGS. 57A to 57C explain the operation of the small capacitance change detection device shown in FIG. 56.

First, the signal $\overline{\text{PRE}}$ of high level (VDD) is supplied to the gate terminal of the transistor Q1, and the signal RE of low level (GND) is supplied to the gate terminal of the transistor Q3. Hence, both the transistors Q1 and Q3 are OFF.

In this state, when the signal $\overline{\text{PRE}}$ changes from high level to low level, the transistor Q1 is turned on. Since the transistor Q3 is kept off, the node N1 is precharged to VDD.

After precharge, the signal $\overline{\text{PRE}}$ goes high, and simultaneously, the signal RE goes high. The transistor Q1 is turned off, and the transistor Q3 is turned on. Charges stored at the node N1 are removed from the current source 321. As a result, the potential at the node N1 lowers.

Letting $\Delta t$ be the period while the signal RE is at high level, a potential drop $\Delta V$ at the node N1 after the period $\Delta t$ elapses is given by $I\Delta t/(Cf+Cp1)$.

Since the current I, period $\alpha t$, and parasitic capacitance Cp1 are constant, the potential drop $\Delta V$ is determined by the capacitance Cf. Since the capacitance Cf is determined by the distance between the electrode of the sensor and the skin surface of a finger, the value of the capacitance Cf changes depending on the three-dimensional pattern of the skin surface of a finger. This means that the magnitude of the potential drop $\Delta V$ changes reflecting the three-dimensional pattern of the skin surface of a finger. This potential drop $\Delta V$ is supplied to the output circuit 340 as an input signal. The output circuit 340 identifies the magnitude of the potential drop $\Delta V$ and outputs a signal reflecting the three-dimensional pattern of the skin surface of a finger.

In the conventional small capacitance change detection device, however, when the parasitic capacitance Cp1 at the node N1 is large, the potential drop $\Delta V$ becomes small. When the circuit shown in FIG. 56 is arranged using the LSI manufacturing technology in practice, the parasitic capacitance Cp1 becomes larger than the capacitance Cf.

The potential drop $\Delta V$ can be made large by increasing the current I of the current source 321 or period $\Delta t$ of the signal RE at high level. However, when the current I is large, the sense units 301 with manufacturing variations are hard to control. For this reason, the current I is preferably relatively small to obtain high detection accuracy. Also, the period $\Delta t$ cannot be made so long from the viewpoint of the detection time.

Consequently, the potential drop $\Delta V$ as a signal to be input to the output circuit 340 becomes small, and the output varies due to noise margin or manufacturing variations, resulting in a decrease in surface shape detection accuracy.

Hence, as described above, a signal change reflecting the three-dimensional pattern of a skin surface of a finger decreases due to the influence of a parasitic element such as the parasitic capacitance Cp1 formed in the manufacturing process, and the detection accuracy of the small capacitance change detection device becomes low.

SUMMARY OF THE INVENTION

It is therefore an object of the present invention to accurately extract a small change in capacitance by a small capacitance change detection device.

It is another object of the present invention to increase the design margin of the output circuit of a small capacitance change detection device.

In order to achieve the above objects, according to the present invention, there is provided a small capacitance change detection device comprising a capacitance detection element for detecting a small capacitance change, a signal generation circuit having an output side connected to the capacitance detection element to control predetermined charges, a signal amplification circuit having an input side connected to a connection point between the output side of the signal generation circuit and the capacitance detection element, and an output circuit connected to an output side of the signal amplification circuit, the signal amplification circuit comprising a first transistor having one output terminal connected to the connection portion between the output side of the signal generation circuit and the capacitance detection element, a first voltage source connected to a control terminal of the first transistor, a second voltage source, and a third voltage source, wherein one of the second and third voltage sources is connected to the other output terminal of the first transistor via a first switch, a voltage to be applied from the second voltage source to the other output terminal of the first transistor is set to have a value not less than a value obtained by subtracting a threshold voltage of the first transistor from a voltage of the first voltage source that is applied to the control terminal of the first transistor while a voltage to be applied from the third voltage source to the other output terminal of the first transistor is set to have a value not more than a value obtained by subtracting the threshold voltage of the first transistor from the voltage of the first voltage source that is applied to the control terminal of the first transistor, and the output circuit is connected to a connection point between the other output terminal of the first transistor and the first switch and, after a voltage of one of the second and third voltage sources is applied to the connection point in an ON state of the first switch, receives the voltage at the connection point on the basis of an OFF state of the first switch and charge control by the signal generation circuit after the first switch is turned off.

BRIEF DESCRIPTION OF THE DRAWINGS

FIG. 4 is a circuit diagram of the sense unit shown in FIG. 2;

FIGS. 5A to 5C are timing charts showing the operation of the sense unit shown in FIG. 4;

FIG. 8 is a circuit diagram of the sense unit shown in FIG. 7;

FIGS. 9A to 9C are timing charts showing the operation of the sense unit shown in FIG. 8;

FIG. 12 is a circuit diagram of a sense unit according to the fifth embodiment of the present invention;

FIGS. 18A and 18B are a sectional view and equivalent circuit diagram, respectively, showing a surface shape recognition sensor according to the 10th embodiment of the present invention;

FIG. 19 is a plan view of the surface shape recognition sensor;

FIG. 22 is a block diagram showing the 11th embodiment of the present invention;

FIGS. 23A to 23C are timing charts showing the operation of the device shown in FIG. 22;

FIG. 26 is a graph showing the characteristics of the device shown in FIG. 22;

FIG. 27 is a block diagram showing the 12th embodiment of the present invention;

FIG. 34 is a circuit diagram of the device shown in FIG. 33;

FIG. 40 is a graph showing operation waveforms by the circuit arrangement shown in FIG. 39;

FIG. 41 is a circuit diagram of a variable threshold circuit according to the 19th embodiment of the present invention;

FIG. 44 is a circuit diagram of a variable threshold circuit according to the 21st embodiment of the present invention;

FIG. 45 is a circuit diagram of a variable threshold circuit according to the 24th embodiment of the present invention;

FIGS. 47A to 47C are timing charts showing the operation of the device shown in FIG. 46;

FIG. 48 is a graph showing comparison of a signal change reflecting the three-dimensional pattern of the surface shape of a measurement object between the device in FIG. 46 and conventional device;

FIGS. 50A to 50C are timing charts showing the operation of the device shown in FIG. 49;

FIG. 51 is a graph showing comparison of a signal change reflecting the three-dimensional pattern of the surface shape of a measurement object between the device in FIG. 49 and conventional device;

DESCRIPTION OF THE PREFERRED EMBODIMENTS

Embodiments of the present invention will be described below in detail with reference to the accompanying drawings.

First Embodiment

Figure 1:
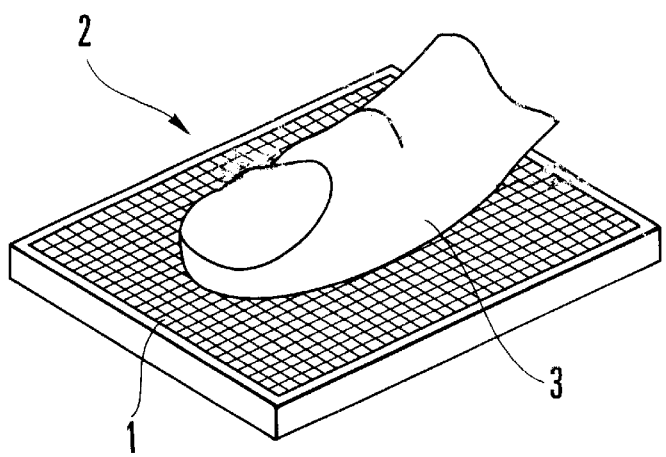
FIG. 1 is a perspective view showing a small capacitance change detection device according to the first embodiment of the present invention.

FIG. 1 shows a small capacitance change detection device according to the first embodiment of the present invention. This device has sense units 1 as constituent units, as shown in FIG. 1. The sense units 1 are arrayed in a matrix on an LSI chip to form a sensor array 2.

Figure 2:
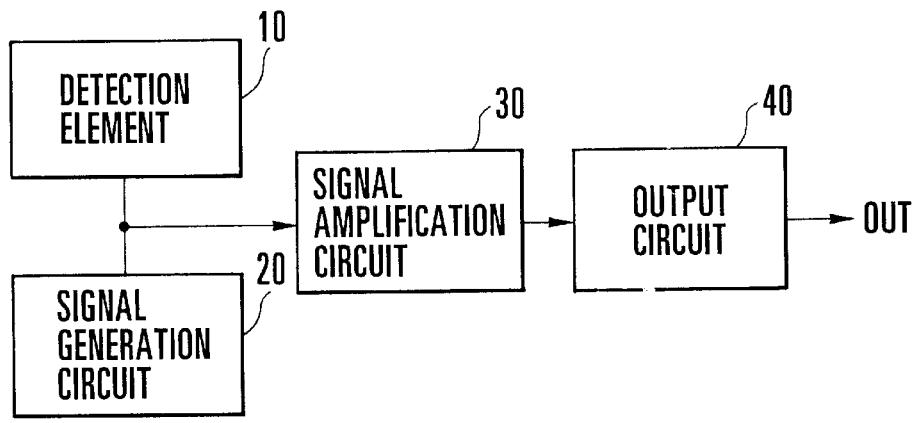
FIG. 2 is a block diagram showing the arrangement of a sense unit of the device shown in FIG. 1.

FIG. 2 shows the arrangement of each sense unit 1 shown in FIG. 1. The sense unit 1 comprises a detection element 10 whose quantity of electricity changes in accordance with contact of a recognition object such as a human finger 3, first signal generation circuit 20 for generating a signal corresponding to the quantity of electricity of the detection element 10, signal amplification circuit 30 for amplifying the level of the signal from the signal generation circuit 20 and outputting the signal, and output circuit 40 for converting the output signal from the signal amplification circuit 30 into a desired signal and outputting the signal, as shown in FIG. 2.

FIG. 2 shows the small capacitance change detection device using the detection element 10 comprising an electrostatic capacitance formed between the sensor electrode of the sense unit 1 and skin surface of the finger 3. In this case, the node between the detection element 10 and signal generation circuit is connected to the input side of the signal amplification circuit 30, and the output circuit 40 is connected to the output side of the signal amplification circuit 30.

Figure 3:
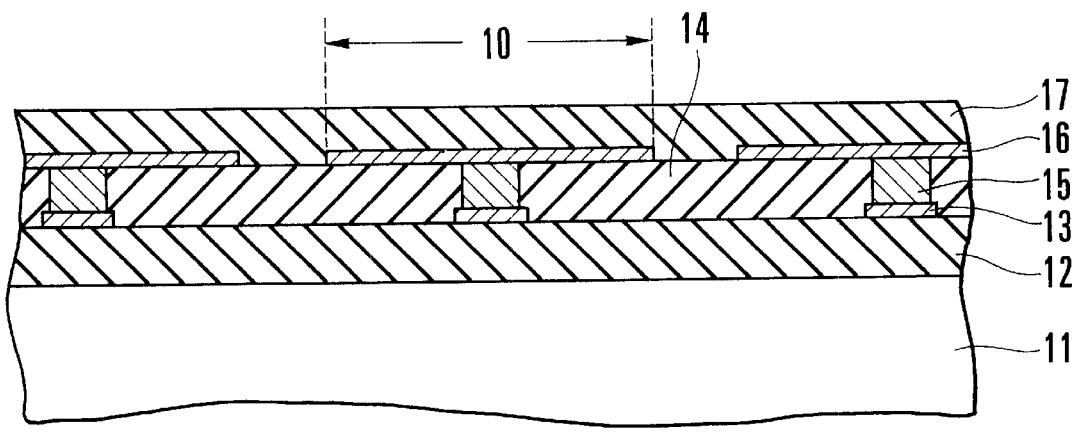
FIG. 3 is a sectional view showing the arrangement of the detection element of the device shown in FIG. 1.

FIG. 3 shows the arrangement of the detection element 10 shown in FIG. 2. An insulating underlayer 12 is formed on a semiconductor substrate 11 having an LSI or the like. Interconnections 13 are formed on the insulating underlayer 12. An interlevel insulating layer 14 is formed on the interconnections 13 and insulating underlayer 12. Sensor electrodes 16 each having, e.g., a rectangular shape are formed on the interlevel insulating layer 14. The sensor electrodes 16 are connected to the interconnections 13 via plugs 15 in through holes formed in the interlevel insulating layer 14. A passivation film 17 is formed on the interlevel insulating layer 14 to cover the sensor electrodes 16.

Although not illustrated, the signal generation circuit 20 and signal amplification circuit 30 shown in FIG. 2 are connected to the interconnections 13.

In this arrangement, when the finger 3 for a target fingerprint is depressed against the sensor array 2 and comes into contact with the passivation film 17, the skin surface of the finger 3 in contact with the passivation film 17 on the sensor electrodes 16 functions as an electrode, so an electrostatic capacitance is formed between the skin surface and sensor electrodes 16.

The skin surface at a finger tip is formed by ridge and valley portions. For this reason, when the finger 3 is brought into contact with the passivation film 17, the distance between the skin surface as an electrode and sensor electrode 16 changes between the valley and ridge portions of the skin surface. This difference in distance is detected as a capacitance difference.

In each sense unit 1, a signal corresponding to the capacitance of the detection element 10 is output from the signal generation circuit 20. This signal is amplified in its level by the signal amplification circuit 30, converted into a desired signal by the output circuit 40, and output from the sense unit 1.

The signals output from the sense units 1 reflect the ridge and valley portions of the skin surface. Hence, the fingerprint pattern can be detected on the basis of these signals.

The small capacitance change detection device shown in FIG. 1 may be formed on an LSI chip which integrates a storage section storing fingerprint data for collation and a recognition processing section for comparing and collating fingerprint data prepared in the storage section with a fingerprint pattern detected by a surface shape recognition sensor circuit.

When the these components are formed on one LSI chip, information is hardly be altered in data transmission, and confidentiality can be improved.

The sense unit 1 shown in FIG. 2 will be described next in more detail.

FIG. 4 shows the sense unit 1. Referring to FIG. 4, reference symbol Cf denotes an electrostatic capacitance formed between the sensor electrode 16 in FIG. 3 and the skin surface of the finger 3. The sensor electrode 16 forming the capacitance Cf is connected to the drain terminal of an NMOS transistor Q3a. The source terminal of the transistor Q3a is connected to the input side of a current source 21a of a current I. The source terminal of an NMOS transistor Q2a is connected to a node N1a between the sensor electrode 16 and transistor Q3a. The drain terminal of the transistor Q2a is connected to the drain terminal of a PMOS transistor Q1a having a source terminal applied with a power supply voltage VDD and the gate terminal of an NMOS transistor Q4a having a drain terminal applied with the power supply voltage VDD and source terminal connected to ground through a resistance Ra. The source terminal of the transistor Q4a is connected to an inverter gate 41.

Signals $\overline{PRE}$ and RE are supplied to the gate terminals of the transistors Q1a and Q3a, respectively. A bias voltage VG is applied from a constant voltage source to the gate terminal of the transistor Q2a. Letting Vth be the gate-source threshold voltage for turning off the transistor Q2a, the voltages VDD and VG are set such that VDD≧VG'−Vth is satisfied.

The nodes N1a and N2a have parasitic capacitances Cp1a and Cp2a, respectively.

The capacitance Cf constructs the detection element 10. The current source 21a and transistor Q3a construct the signal generation circuit 20. The transistors Q1a and Q2a construct the signal amplification circuit 30. The transistor Q4a, resistance Ra, and inverter gate 41 construct the output circuit 40. The small capacitance change detection device shown in FIG. 4 is different from the conventional device in that the transistor Q2a is inserted between the nodes N1a and N2a.

FIGS. 5A to 5C explain operation of the sense unit 1 shown in FIG. 4. FIG. 5A shows the potential change in the signal $\overline{PRE}$ for controlling the transistor Q1a. FIG. 5B shows the potential change in the signal RE for controlling the transistor Q3a. FIG. 5C shows potential changes at the nodes N1a and N2a.

Referring to FIG. 4, the potentials at the nodes N1a and N2a are reset by a reset circuit (not shown) in advance and set at low level (GND) in the initial state, as shown in FIG. 5C. This reset circuit can be realized by, e.g., an NMOS transistor.

In this state, first, the signal $\overline{PRE}$ of high level (VDD) is supplied to the gate terminal of the transistor Q1a, and the signal RE of low level (GND) is supplied to the gate terminal of the transistor Q3a. Hence, both the transistors Q1a and Q3a are OFF.

In this state, when the signal $\overline{PRE}$ changes from high level to low level, the transistor Q1a is turned on. Since the transistor Q3a is kept off, and the signal generation circuit 20 is stopped, the node N2a is precharged to VDD.

The node N1a is charged until the gate-source voltage of the transistor Q2a reaches the threshold voltage Vth to turn off the transistor Q2a. Hence, the node N1a is precharged to VG−Vth.

After precharge, when the signal $\overline{PRE}$ goes high, the transistor Q1a is turned off. Simultaneously, the signal RE goes high to turn on the transistor Q3a, so the signal generation circuit 20 changes to an operative state. Charges stored at the node N1a are removed from the current source 21a to slightly lower the potential at the node N1a. The gate-source voltage of the transistor Q2a becomes higher than the threshold voltage Vth to turn on the transistor Q2a. With this operation, charges at the node N2a are also removed to start lowering the potential at the node N2a.

The parasitic capacitance Cp2a is mainly formed from the parasitic capacitances of the drain terminals of the transistors Q1a and Q2a and the parasitic capacitance of the gate terminal of the transistor Q4a. The parasitic capacitance Cp2a can be made considerably smaller than the parasitic capacitance Cp1 of the conventional device by the actual layout.

For this reason, when potential drop at the node N2a begins, as described above, the potential at the node N2a abruptly lowers. After the potential at the node N2a equals that at the node N1a, the potential drop at the node N2a becomes moderate.

Letting Δt be the period while the signal RE is at high level, a potential drop ΔV at the node N1a after the period Δt is given by $$\Delta V = VDD - (VG - Vth) + I\Delta t / (Cf + Cp1a) \quad (1)$$

The parasitic capacitance Cp2a is sufficiently smaller than the parasitic capacitance Cp1a.

In the small capacitance change detection device shown in FIG. 4, the magnitude of the potential drop ΔV can be made larger than that in the conventional device by VDD−(VG−Vth). For this reason, even when the parasitic capacitance Cp1a at the node N1a is large, the potential drop ΔV becomes large.

In the output circuit 40, the current flowing between the source and drain of the transistor Q4a changes depending on the potential drop ΔV as an input signal. This current change is converted into a voltage change by the resistance Ra.

The inverter gate 41 converts a signal into a digital signal using a predetermined logic threshold value. More specifically, when the input voltage value to the inverter gate 41 is smaller than the threshold value, the inverter gate 41 outputs a signal representing that a valley portion is in contact with the sense unit 1. Conversely, when the input voltage value to the inverter gate 41 is larger than the threshold value, the inverter gate 41 outputs a signal representing that a ridge portion is in contact with the sense unit 1.

When the potential drop ΔV at the node N2a becomes larger by VDD−(VG−Vth), the threshold value setting width of the inverter gate 41 increases. Since the threshold value can be set to prevent the inverter gate 41 from erroneously operating due to noise, the detection accuracy of the device can be improved.

The sense unit 1 shown in FIG. 4 is constituted by the detection element 10, signal generation circuit 20, signal amplification circuit 30, and output circuit 40. Since the signal generation circuit 20 and signal amplification circuit 30 are arranged near the corresponding detection element 10, the parasitic element such that the parasitic capacitance Cp1a connected to the detection element 10 becomes small.

Additionally, since the output circuit 40 is arranged near the corresponding signal amplification circuit 30, the parasitic capacitance Cp2a between the signal amplification circuit 30 and output circuit 40 becomes small.

Since the parasitic elements that are formed in the manufacturing process and contribute to signal attenuation can be suppressed, the input signal (ΔV) to the output circuit 40 can be made larger.

Another element may be used in place of the inverter gate 41, as needed. For example, when an analog signal corresponding to the quantity of electricity of the detection element 10 is to be output from the output circuit 40, an analog amplification circuit is applied. To convert a signal corresponding to the quantity of electricity of the detection element 10 into a digital value, an A/D converter is used. When data is sampled using, e.g., a latch circuit controlled by a clock signal, the signal amount can be made to correspond to the time axis.

The detection element 10 may be the capacitance Cf which has a pair of sensor electrodes opposing each other via an insulating film and whose value changes when the upper electrode displaces in the vertical direction in accordance with the ridges and valley portions of the skin surface of a finger.

Figure 6:
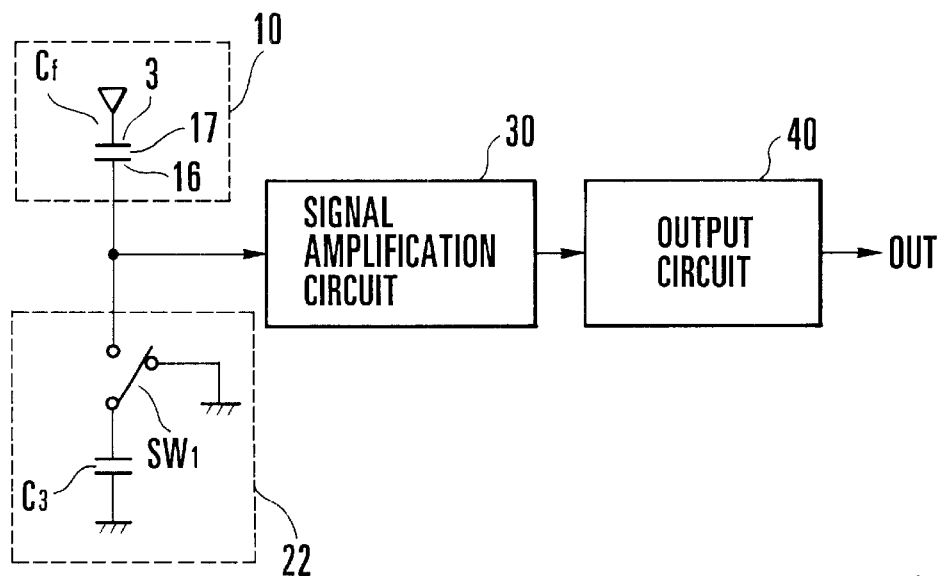
FIG. 6 is a circuit diagram showing another arrangement of the sense unit shown in FIG. 2.

In place of the signal generation circuit 20 using the current source 21a, a first signal generation circuit 22 constructed by using a capacitance Cs as shown in FIG. 6 may be used. In this signal generation circuit 22, one fixed terminal of a switch SW1 is connected to the detection element 10, the other fixed terminal is connected to ground, and the movable terminal is connected to the capacitance Cs.

In the signal generation circuit 22, the switch SW1 connects the capacitance Cs to ground in the ON state of the transistor Q1a in FIG. 4 to remove charges from the capacitance Cs in advance. In the OFF state of the transistor Q1a, the switch SW1 connects the capacitance Cs to the detection element 10 to store a predetermined amount of charges in the capacitance Cs, thereby generating a signal corresponding to the amount of electricity of the detection element 10.

Second Embodiment

Figure 7:
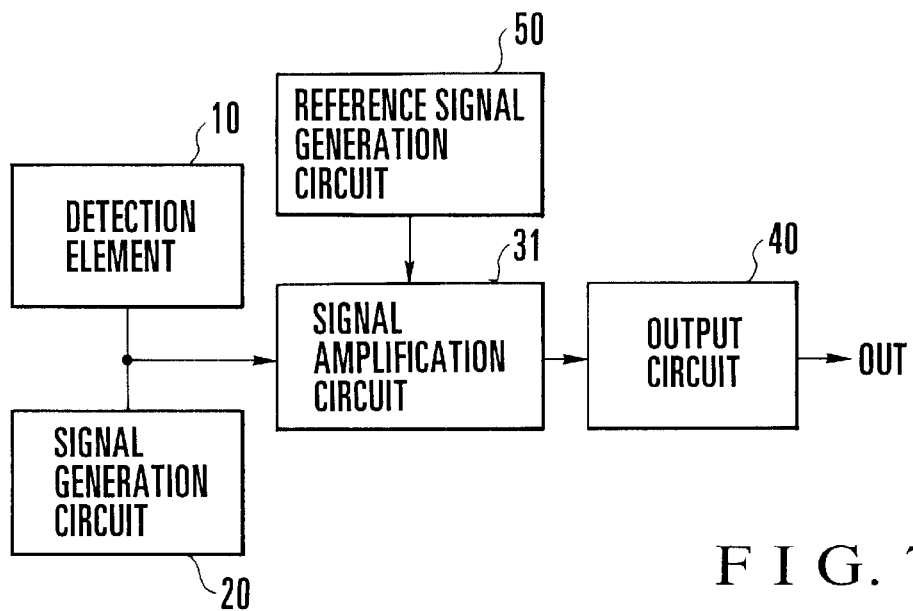
FIGS. 7 is a block diagram of a sense unit according to the second embodiment of the present invention.

FIG. 7 shows a sense unit 1 constructing a small capacitance change detection device according to the second embodiment of the present invention. The same reference numerals as in FIG. 2 denote the same parts in FIG. 7, and a detailed description thereof will be omitted.

The sense unit 1 shown in FIG. 7 is different from the sense unit 1 shown in FIG. 2 in that the sense unit 1 has a reference signal generation circuit 50 for generating a reference signal, and a signal amplification circuit 31 has a means for changing the gain on the basis of the level of the signal from a signal generation circuit 20 and that of the reference signal.

FIG. 8 shows the sense unit 1 shown in FIG. 7. The same reference numerals as in FIG. 4 denote the same parts in FIG. 8, and a detailed description thereof will be omitted.

The sense unit 1 shown in FIG. 8 is formed by adding a reference element 51, second signal generation circuit 52, NMOS transistor Q2b, and PMOS transistor Q1b to the sense unit 1 shown in FIG. 4.

The reference element 51 is a simulated detection element 10. In the sense unit 1 shown in FIG. 8, since the detection element 10 is formed by a capacitance Cf, the reference element 51 is formed by a capacitance Cr.

The capacitance Cr is used as a threshold value for determining whether a ridge or valley portion of the skin surface of a finger is in contact with the sense unit 1. The value of the capacitance Cr is set between the capacitance Cf formed when a ridge portion of the skin surface of a finger is in contact with the sense unit 1 and that formed when a valley portion of the skin surface of a finger is in contact with the sense unit 1. The capacitance Cr effectively functions as a threshold value even when it is set to equal the value of the capacitance Cf formed when a valley portion of the skin surface of a finger is in contact.

The capacitance Cr is formed by an element or semiconductor element formed using interconnections. For example, the capacitance Cr can be realized by a MIM (metal-Insulator-Metal) capacitance or PIP (Polysilicon-Insulator-Polysilicon) capacitance formed by inserting an insulating film between interconnections, or a MOS capacitance.

The signal generation circuit 52 generates a reference signal corresponding to the capacitance Cr and has the same circuit arrangement as that of the signal generation circuit 20. More specifically, the signal generation circuit 52 comprises a current source 21b and NMOS transistor Q3b, which have the same characteristics as those of a current source 21a and transistor Q3a of the signal generation circuit 20, respectively.

The reference signal generation circuit 50 is constructed by the reference element 51 and signal generation circuit 52. The reference signal generated by the reference signal generation circuit 50 has the same level as that of a signal generated by the signal generation circuit 20 when the detection element 10 has a capacitance set as a threshold value.

A node N1b between the reference element 51 and signal generation circuit 52 is connected to the source terminal of the NMOS transistor Q2b. The drain terminal of the transistor Q2b is connected to the drain terminal of the PMOS transistor Q1b with a source terminal applied with a power supply voltage VDD.

In the sense unit 1 shown in FIG. 4, the gate terminal of the transistor Q2a is connected to the constant voltage source. In the sense unit 1 shown in FIG. 8, however, the gate terminal of a transistor Q2a is connected to the drain terminal of the transistor Q2b. The gate terminal of the transistor Q2b is connected to the drain terminal of the transistor Q2a.

The PMOS transistors Q1b and Q2b have the same characteristics as those of the transistors Q1a and Q2a, respectively.

Signals $\overline{PRE}$ and RE are supplied to the gate terminals of the PMOS transistors Q1b and Q3b, respectively.

The nodes N1b and N2b have parasitic capacitances Cp1b and Cp2b, respectively.

The transistors Q1a and Q1b construct a second switch means. The second switch means and transistors Q2a and Q2b construct the signal amplification circuit 31.

FIGS. 9A to 9C explain operation of the sense unit 1 shown in FIG. 8. FIG. 9A shows the potential change in the signal $\overline{PRE}$ for controlling the transistors Q1a and Q1b. FIG. 9B shows the potential change in the signal RE for controlling the transistors Q3a and Q3b. FIG. 9C shows potential changes at the node N2a.

Referring to FIG. 8, the potentials at the nodes N1a, N2a, N1b, and N2b are reset by a reset circuit (not shown) in advance and set at low level (GND) in the initial state, as shown in FIG. 9C. This reset circuit can be realized by, e.g., an NMOS transistor.

In this state, first, the signal $\overline{PRE}$ of high level (VDD) is supplied to the gate terminals of the transistors Q1a and Q1b, and the signal RE of low level (GND) is supplied to the gate terminals of the transistors Q3a and Q3b. Hence, none of the transistors Q1a, Q1b, Q3a, and Q3b are ON.

In this state, when the signal $\overline{PRE}$ changes from high level to low level, the transistors Q1a and Q1b are turned on. Since the transistors Q3a and Q3b are kept off, and the signal generation circuits 20 and 52 are stopped, the nodes N2a and N2b is precharged to VDD.

The nodes N1a and N1b are charged until the gate-source voltages of the transistors Q2a and Q2b reach the threshold voltage Vth to turn off the transistors Q2a and Q2b. Since the voltage VDD is applied to the gate terminals of the transistors Q2a and Q2b, the nodes N1a and N1b are precharged to VDD−Vth.

After precharge, when the signal $\overline{\text{PRE}}$ goes high, the transistors Q1a and Q1b are turned off. Simultaneously, the signal RE goes high to turn on the transistors Q3a and Q3b, so the signal generation circuits 20 and 52 change to an operative state. Charges stored at the nodes N1a and N1b are removed from the current sources 21a and 21b to slightly lower the potentials at the node N1a and N1b. The gate-source voltages of the transistors Q2a and Q2b become slightly higher than the threshold voltage Vth to turn on the transistors Q2a and Q2b. With this operation, charges at the nodes N2a and N2b are also removed to start lowering the potentials at the nodes N2a and N2b.

When capacitance Cf>capacitance Cr, the potential at the node N1b is lower than that at the node N1a. Since the ON resistance of the transistor Q2b is lower than that of the transistor Q2a, the potential at the node N2b lowers more quickly than that at the node N2a.

The potential drop at the node N2b is input to the gate terminal of the NMOS transistor Q2a to increase the ON resistance of the transistor Q2a. For this reason, the potential drop ΔV at the node N2a is suppressed.

Since the potential at the node N2a is input to the gate terminal of the transistor Q2b, the change in ON resistance of the transistor Q2b is small. Consequently, the potential at the node N2b further lowers, and the ON resistance of the transistor Q2a further increases.

Since the transistors Q2a and Q2b are cross-connected, these operations are augmented to suppress the potential drop ΔV at the node N2a.

Conversely, when capacitance Cf<capacitance Cr, the potential changes at the nodes N2a and N2b are reversed. That is, the potential at the node N2b does not largely change from the initial precharge potential VDD. For this reason, the potential at the node N2a largely lowers, as in the sense unit 1 shown in FIG. 4.

When the value of the capacitance Cr is set within the above-described range, the gain of the signal amplification circuit 31 can be changed using this threshold value. When a ridge portion of the skin surface of a finger is in contact, a signal (ΔV) of high level is input to the output circuit 40. When a valley portion of the skin surface of a finger is in contact, a signal (ΔV) of low level is input. Hence, the output circuit 40 can clearly determine the ridge and valley portions of the skin surface of a finger.

In the sense unit 1 shown in FIG. 8, a potential drop caused when charges are removed by the leakage current at the node N2a can be canceled by a potential change due to the leakage current at the node N2b. For this reason, any erroneous operation due to the leakage current can be prevented.

In the sense unit 1 shown in FIG. 8, the output circuit 40 is connected to the node N2a. However, the output circuit 40 may be connected to the node N2b. In this case, although the polarity of an output from the output circuit 40 is inverted, the same effect as that when the output circuit 40 is connected to the node N2a can be obtained.

Third Embodiment

Figure 10:
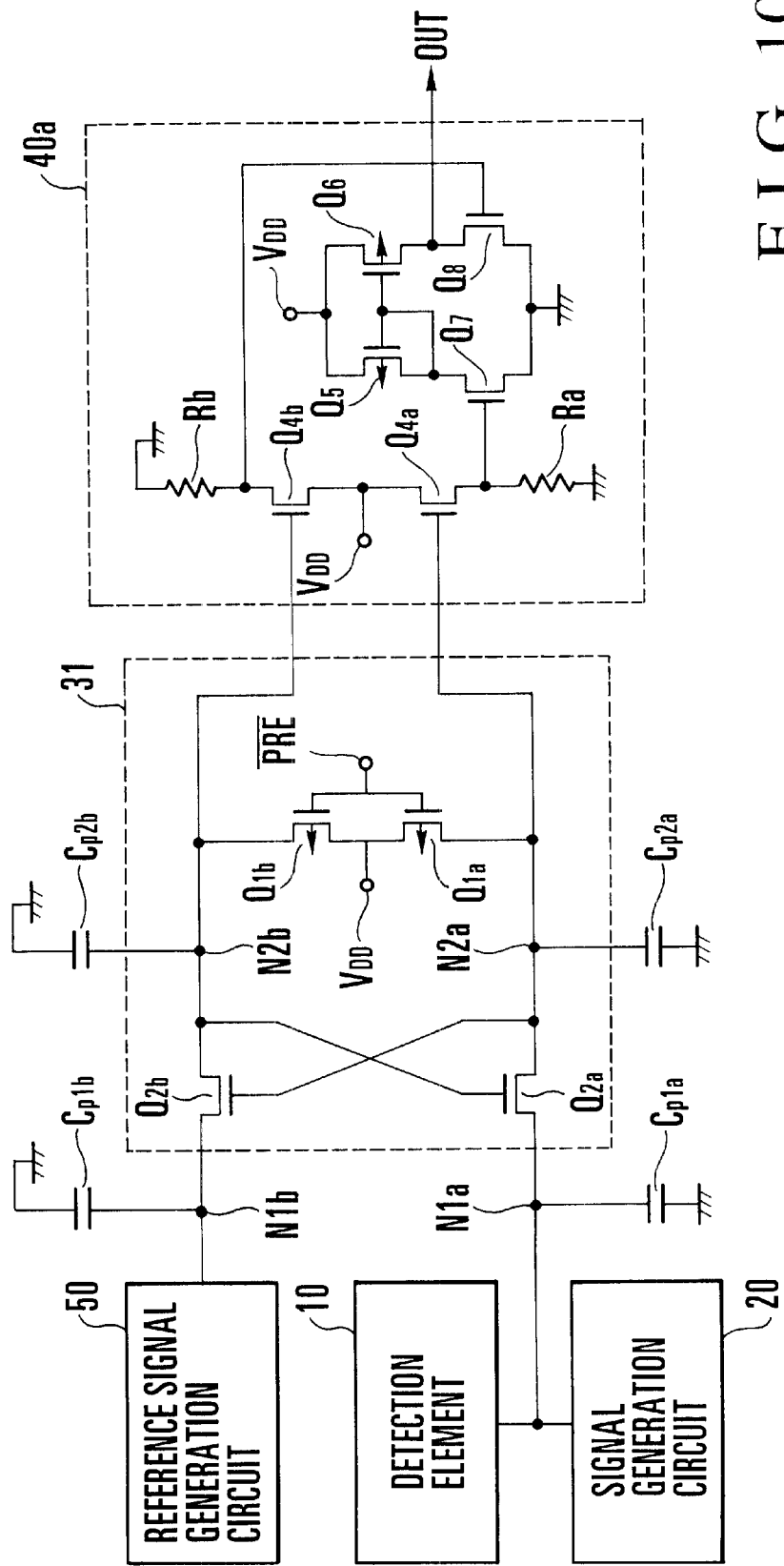
FIG. 10 is a circuit diagram of a sense unit according to the third embodiment of the present invention.

FIG. 10 shows a sense unit 1 constructing a small capacitance change detection device according to the third embodiment of the present invention. The same reference numerals as in FIG. 8 denote the same parts in FIG. 10, and a detailed description thereof will be omitted.

The sense unit 1 shown in FIG. 10 is different from the sense unit 1 shown in FIG. 8 in that an output circuit 40a for receiving potential drops ΔV at nodes N2a and N2b as complementary signals is used in place of an output circuit 40.

The output circuit 40a can be realized using a differential voltage amplification circuit. The output circuit 40a shown in FIG. 10 comprises an NMOS transistor Q4a and resistance Ra, an NMOS transistor Q4b and resistance Rb which have the same characteristics as that of the NMOS transistor Q4a and resistance Ra, and PMOS transistors Q5 and Q6 and NMOS transistors Q7 and Q8, which form a current mirror amplification circuit.

The operation of the sense unit 1 shown in FIG. 10 is basically the same as that of the sense unit 1 shown in FIG. 8. However, when complementary signals are input to the output circuit 40a, the noise margin for power supply variation and the like can be increased.

Fourth Embodiment

Figure 11:
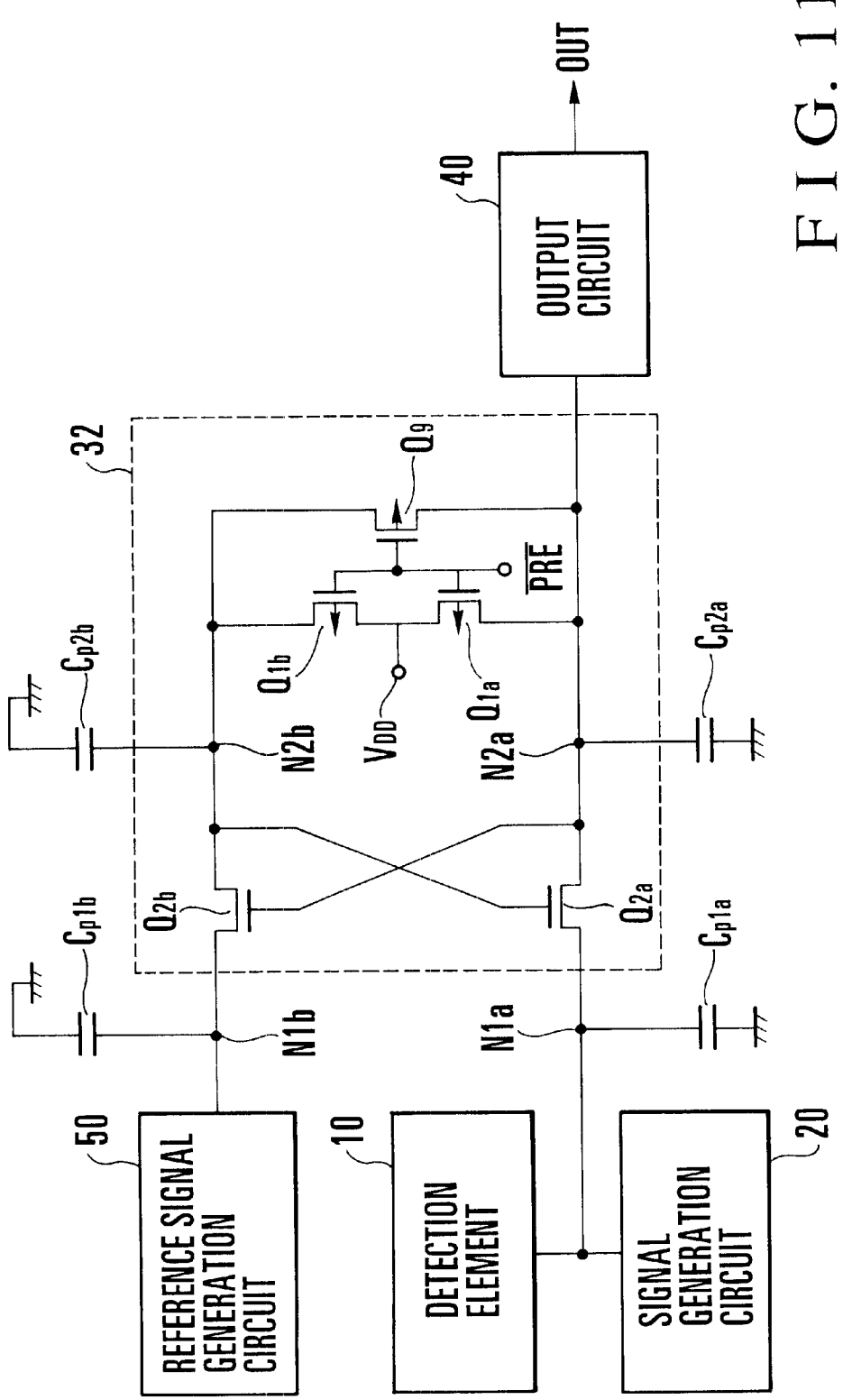
FIG. 11 is a circuit diagram of a sense unit according to the fourth embodiment of the present invention.

FIG. 11 shows a sense unit 1 constructing a small capacitance change detection device according to the fourth embodiment of the present invention. The same reference numerals as in FIG. 8 denote the same parts in FIG. 11, and a detailed description thereof will be omitted.

The sense unit 1 shown in FIG. 11 is different from the sense unit 1 shown in FIG. 8 in that a signal amplification circuit 32 having a switch means connected between nodes N2a and N2b is used in place of a signal amplification circuit 31.

The switch means is formed from a PMOS transistor Q9 having source and drain terminals connected between the nodes N2a and N2b and gate terminal to which a signal $\overline{\text{PRE}}$ is supplied.

In the sense unit 1 shown in FIG. 8, when the characteristics of the transistors Q1a and Q1b vary, a potential difference may be generated between the nodes N2a and N2b in precharging the nodes N2a and N2b to the power supply voltage VDD. When the nodes N2a and N2b are not precharged to the same potential, the potential drop rates at the nodes N2a and N2b change.

The operation of the sense unit 1 shown in FIG. 11 is basically the same as that of the sense unit 1 shown in FIG. 8. However, in the sense unit 1 shown in FIG. 11, when signal generation circuits 20 and 52 stop, the nodes N2a and N2b can be precharged to the same potential by short-circuiting the nodes N2a and N2b by the transistor Q9. In addition, during signal detection, i.e., when the signal generation circuits 20 and 52 are operating, the nodes N2a and N2b are opened by the transistor Q9.

With this arrangement, the changes in potential drop rates at the nodes N2a and N2b can be suppressed, and the surface shape detection accuracy can be prevented from lowering.

In the sense unit 1 shown in FIG. 11, an output circuit 40 is connected to the node N2a. However, the output circuit 40 may be connected to the node N2b. In this case, although the polarity of an output from the output circuit 40 is inverted, the same effect as that when the output circuit 40 is connected to the node N2a can be obtained.

Fifth Embodiment

FIG. 12 shows a sense unit 1 constructing a small capacitance change detection device according to the fifth embodiment of the present invention. The same reference numerals as in FIGS. 10 and 11 denote the same parts in FIG. 12, and a detailed description thereof will be omitted.

The sense unit 1 shown in FIG. 12 is different from the sense unit 1 shown in FIG. 10 in that a signal amplification circuit 32 shown in FIG. 11 is used in place of a signal amplification circuit 31.

In the sense unit 1 shown in FIG. 12, when nodes N2a and N2b are precharged to a power supply voltage VDD, the potential difference between the nodes N2a and N2b due to variations in characteristics of transistors Q1a and Q1b can be eliminated. For this reason, unlike the sense unit 1 shown in FIG. 10, an offset voltage generated by complementary inputs to the differential amplification circuit due to this potential difference, or a decrease in detection accuracy due to changes in potential drop speeds at the nodes N2a and N2b can be prevented.

Sixth Embodiment

Figure 13:
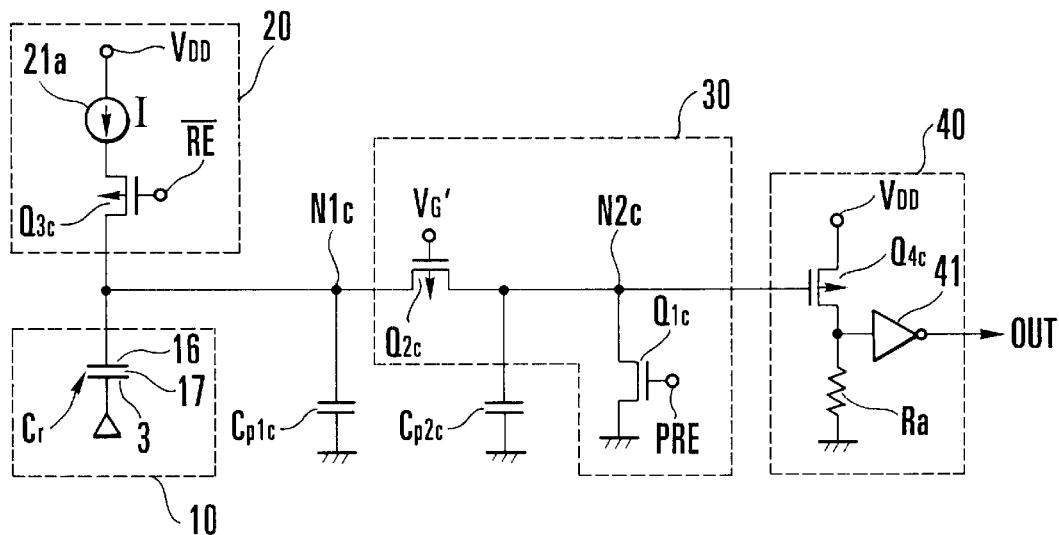
FIG. 13 is a circuit diagram of a sense unit according to the sixth embodiment of the present invention.

FIG. 13 shows a sense unit 1 constructing a small capacitance change detection device according to the sixth embodiment of the present invention. The same reference numerals as in FIG. 4 denote the same parts in FIG. 13, and a detailed description thereof will be omitted.

The sense unit 1 shown in FIG. 13 is constructed using transistors Q1c, Q2c, Q3c, and Q4c with polarities different from those of the transistors Q1a to Q1a in FIG. 4. Referring to FIG. 13, the transistor Q1c is an NMOS transistor, and the transistors Q2c to Q4c are PMOS transistors. Signals $\overline{PRE}$ and $\overline{RE}$ obtained by inverting the polarities of signals $\overline{PRE}$ and RE are supplied to the transistors Q1c and Q3c. A power supply voltage VDD is applied to the input side of a current source 21a. The source terminal of the transistor Q1c is connected to ground. Reference symbols Cp1c and Cp2c denote parasitic capacitances.

Figure 14A:
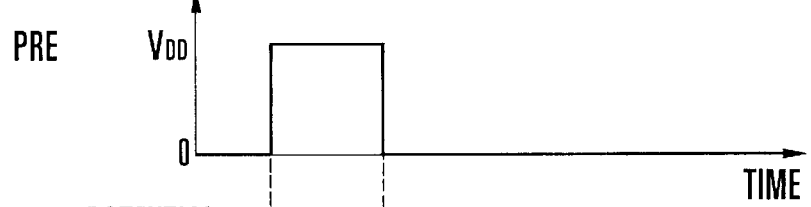
FIGS. 14A to 14C are timing charts showing the operation of the sense unit shown in FIG. 13.
Figure 14B:
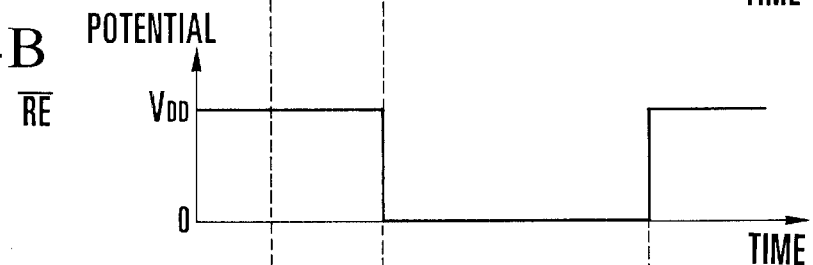
Figure 14C:
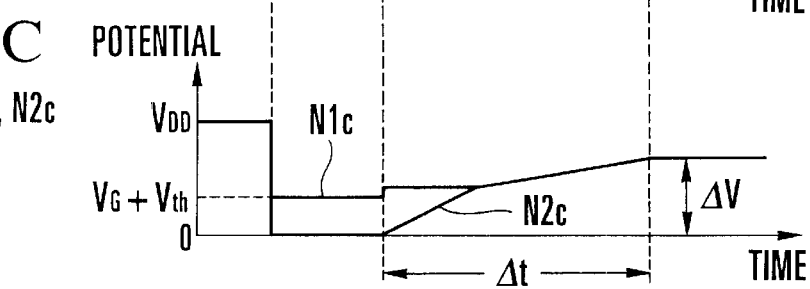

FIGS. 14A to 14C explain the operation of the sense unit 1 shown in FIG. 13. The operation of the sense unit 1 is the same as that of the sense unit 1 shown in FIG. 4 except that the polarities of signals are inverted, and the direction in which the signal ($\Delta V$) changes is reversed, and the same effect as that of the sense unit 1 shown in FIG. 4 can be obtained. Referring to FIG. 13, the potentials at the nodes N1c and N2c are reset by a reset circuit (not shown) in advance and set at high level (VDD) in the initial state, as shown in FIG. 14C. This reset circuit can be realized by, e.g., a PMOS transistor.

A potential rise $\Delta V$ at the node N2c after a period $\Delta t$ elapses is given by VG+Vth+I$\Delta$t/(Cf+Cp1c).

For the sense units 1 shown in FIGS. 8 and 10 to 12 as well, the same effect as described above can be obtained by using transistors with polarities different from those of the transistors Q1b to Q4b and Q9.

Seventh Embodiment

Figure 15A:
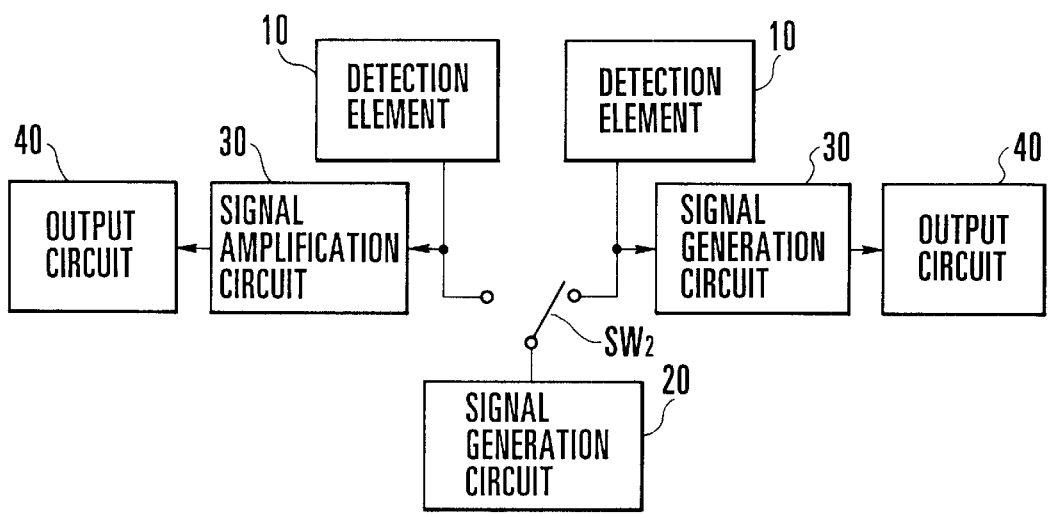
FIGS. 15A to 15C are block diagrams showing the seventh embodiment of the present invention.
Figure 15B:
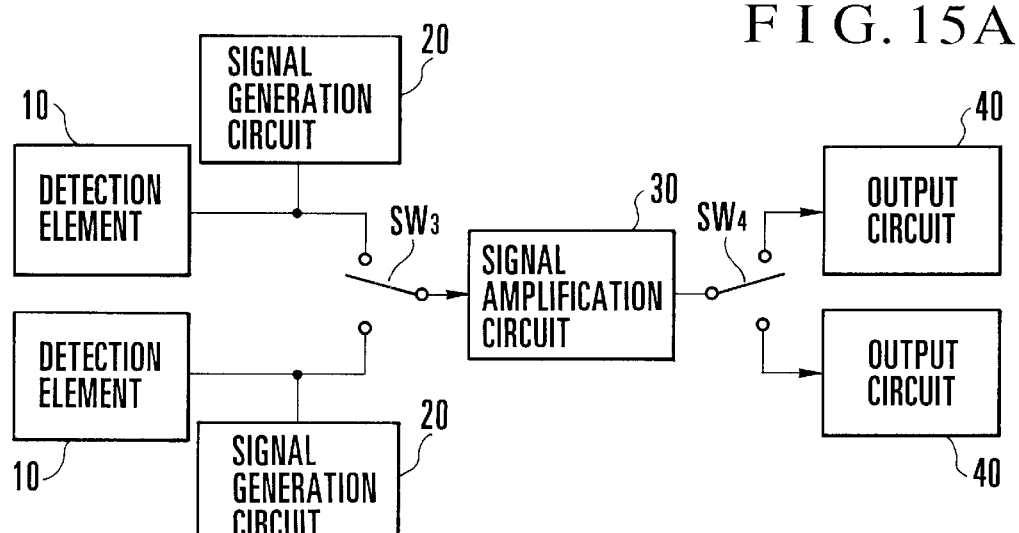
Figure 15C:
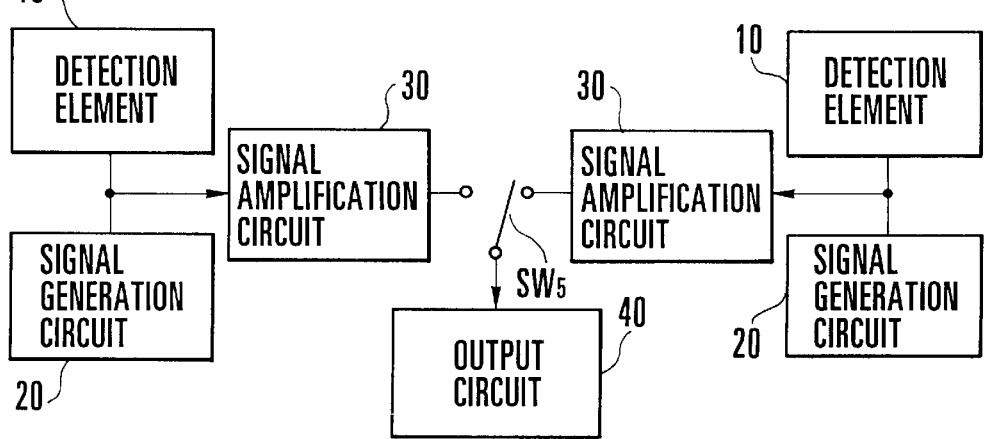

FIGS. 15A to 15C show a small capacitance change detection device according to the seventh embodiment of the present invention. The same reference numerals as in FIG. 2 denote the same parts in FIGS. 15A to 15C, and a detailed description thereof will be omitted.

In the small capacitance change detection device shown in FIG. 2, a signal generation circuit 20, signal amplification circuit 30, and output circuit 40 are arranged for each detection element 10 to form a sense unit 1. A plurality of sense units 1 are two-dimensionally arrayed to form a sensor array 2. In this case, detection can be parallelly processed, and detection processing at high speed is possible.

Unlike this device, at least one of the signal generation circuit 20, signal amplification circuit 30, and output circuit 40 may be shared by a plurality of detection elements 10.

To share the signal generation circuit 20, one signal generation circuit 20 is selectively connected to one of the plurality of detection elements 10 by a switch SW2, as shown in FIG. 15A.

To share the signal amplification circuit 30, one signal amplification circuit 30 is selectively connected to one of the plurality of signal generation circuits 20 and one of the plurality of output circuits 40 by switches SW3 and SW4, as shown in FIG. 15B. The switches SW3 and SW4 operate in synchronism with each other.

To share the output circuit 40, one output circuit 40 is selectively connected to one of the plurality of signal amplification circuits 30 by a switch SW5, as shown in FIG. 15C.

When at least one of the signal generation circuit 20, signal amplification circuit 30, and output circuit 40 is shared by the plurality of detection elements 10, the circuit scale or operating current can be reduced.

When the plurality of detection elements 10 arranged close to each other share the signal generation circuit 20, signal amplification circuit 30, and output circuit 40, the influence of parasitic elements formed in the manufacturing process becomes small.

In the sense units 1 shown in FIGS. 8 and 10 to 12 as well, at least one of the signal generation circuit 20, signal amplification circuit 31 or 32, and output circuit 40 or 42 can be shared by a plurality of detection elements 10.

Eighth Embodiment

Figure 16:
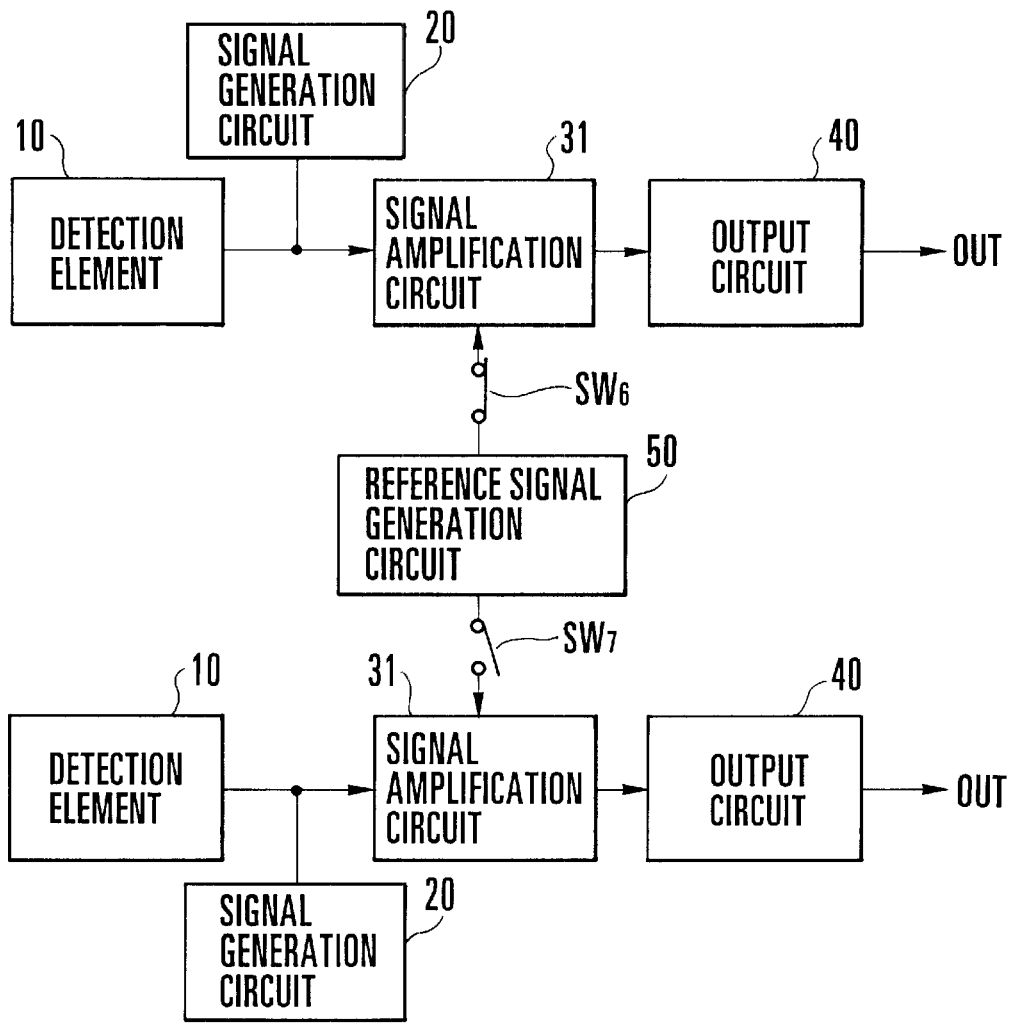
FIG. 16 is a block diagram showing the eighth embodiment of the present invention.

FIG. 16 shows a small capacitance change detection device according to the eighth embodiment of the present invention. The same reference numerals as in FIG. 7 denote the same parts in FIG. 16, and a detailed description thereof will be omitted.

A reference signal generation circuit 50 shown in FIG. 7 can be shared by a plurality of signal amplification circuits 31. In this case, as shown in FIG. 16, one signal amplification circuit 31 is selectively connected to one of the plurality of signal amplification circuits 31 by switches SW6 and SW7. With this arrangement, the circuit scale or operating current can be reduced.

In the sense units 1 shown in FIGS. 10 to 12 as well, the reference signal generation circuit 50 can be shared by a plurality of signal amplification circuits 31 or 32.

Ninth Embodiment

Figure 17A:
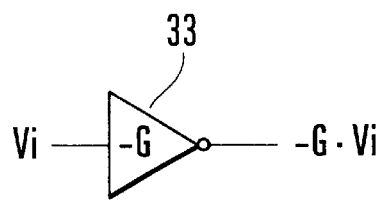
FIGS. 17A and 17B are circuit diagrams of signal amplification circuits according to the ninth embodiment of the present invention.
Figure 17B:
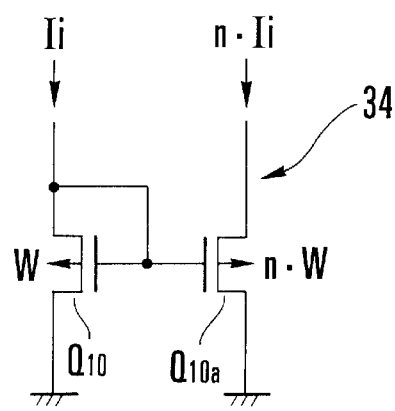

FIGS. 17A and 17B show other implementations of a signal amplification circuit 30 shown in FIG. 2.

As shown in FIG. 17A, the signal amplification circuit 30 can be realized by an inverting amplifier 33 for amplifying a voltage signal. Reference symbol G denotes a voltage gain.

As shown in FIG. 17B, the signal amplification circuit 30 can also be realized by a current mirror circuit 34 for amplifying a current signal. Reference symbol n denotes a current gain. FIG. 19B shows the current mirror circuit 34 for amplifying a current using a gate width W of PMOS transistors Q10 and Q11. However, the present invention is not limited to this.

A differential signal amplification circuit 31 shown in FIG. 7 can also be realized by a current mirror circuit.

The present invention can be applied to recognize not only a human fingerprint but also a surface shape having a fine three-dimensional pattern of, e.g., nose of an animal.

10th Embodiment

FIGS. 18A and 18B shows a small capacitance change detection device according to the 10th embodiment of the present invention. FIG. 18A shows the main part of a surface shape recognition sensor constructing the device. FIG. 8B shows an equivalent circuit.

This surface shape recognition sensor comprises a detection element 10 shown in FIG. 2 and a reference element 51 of a reference signal generation circuit 50 shown in FIG. 7. As shown in FIG. 18A, a matrix-like support member 103 consisting of a conductive material is formed on a semiconductor substrate 101 via an insulating layer 102. A lower electrode 104 is formed on the insulating layer 102 at the center of each square (cell) surrounded by the support member 103 to be separated from the support member 103. An upper electrode 105 is formed on the support member 103.

The upper electrode 105 is separated from the lower electrode 104 by a predetermined distance. The lower electrode 104 and upper electrode 105 form a capacitance Cf. In this surface shape recognition sensor, a protective film 106 having a projecting portion 106a is formed on the upper electrode 105. The projecting portion 106a is formed in an area above the lower electrode 104.

A reference electrode 104a is formed on the insulating layer 102 to surround the lower electrode 104 while being separated from the lower electrode 104 and support member 103.

The difference between the capacitance Cf between the upper electrode 105 and lower electrode 104 and a capacitance Cr between the upper electrode 105 and reference electrode 104a is detected by a sensor circuit 110. The equivalent circuit of the capacitances Cf and Cr and sensor circuit 110 is shown in FIG. 18B.

As shown in FIG. 19, the support member 103 is formed in a matrix. The lower electrode 104 and reference electrode 104a are formed at the central portion of each cell to form a matrix. That is, the surface shape recognition sensor is formed from a plurality of sensor elements each having the lower electrode 104, reference electrode 104a, and upper electrode 105 formed on these electrodes.

One sensor circuit 110 is prepared in correspondence with one lower electrode 104 and one reference electrode 104a. One sensor circuit 110 may be prepared in correspondence with a plurality of lower electrodes 104 and reference electrodes 104a. The sensor circuit 110 may be integrated under the insulating layer 102 on the semiconductor substrate 101 or formed in an area of the semiconductor substrate 101, where no sensor is arranged. The sensor circuit 110 may be prepared outside the semiconductor substrate 101. Note that an interconnection structure for connecting the electrodes to the sensor circuit is formed on the semiconductor substrate 101.

The operation of the surface shape recognition sensor according to the 10th embodiment will be described next.

Figure 20:
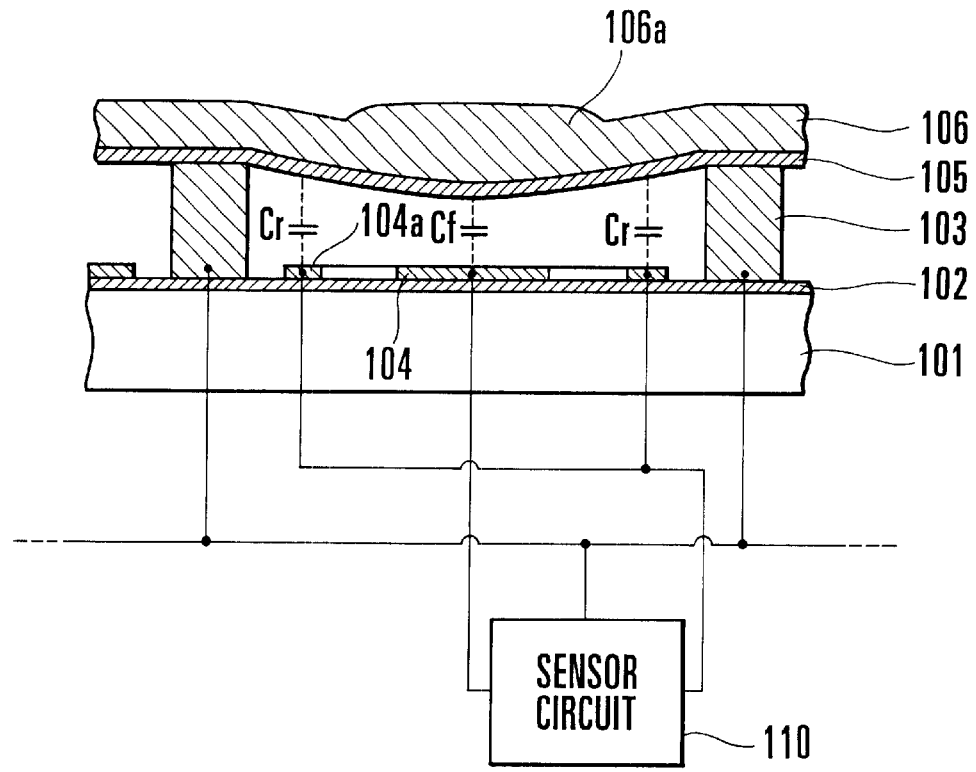
FIG. 20 is a sectional view showing deformation of the surface shape recognition sensor.

As shown in FIG. 20, when the projecting portion 106a comes into contact with an object, the protective film 106 deforms and simultaneously the upper electrode 105 also deforms. As a consequence, the distance between the lower electrode 104 and upper electrode 105 changes to change the capacitance Cf therebetween. At the same time, the distance between the reference electrode 104a and upper electrode 105 changes to change the capacitance Cr therebetween.

In the above-described sense unit 1 shown in FIG. 8, since the detection element 10 is formed from the capacitance Cf, and the reference element 51 in the reference signal generation circuit 50 is formed from the capacitance Cr, a signal based on the capacitance Cr is output from the reference signal generation circuit 50 as a reference signal.

As is apparent from FIG. 20, the change amount of the upper electrode 105 is small near the support member 103. That is, the change in distance between the reference electrode 104a and upper electrode 105 is smaller than that between the lower electrode 104 and upper electrode 105.

Figure 21:
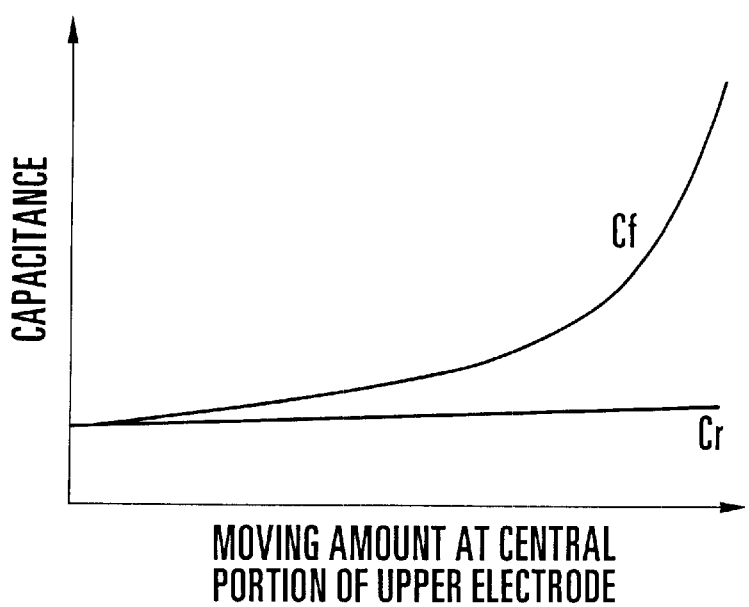
FIG. 21 is a graph showing a capacitance Cf and capacitance Cr of the surface shape recognition sensor.

Hence, the capacitances Cf and Cr change as shown in FIG. 21 with respect to the amount of movement a portion (central portion of the upper electrode) of the upper electrode 105 under the projecting portion 106a in the direction of lower electrode 104 when the projecting portion 106a comes into contact with an object. In this case, the initial values of the capacitances Cf and Cr can be made equal by setting the surface area of the reference electrode 104a to be equal to that of the lower electrode 104, as shown in FIG. 21.

The relationship between the change in capacitance Cf and the change in capacitance Cr, which is shown in FIG. 21, does not depend on the height (thickness) of the support member 103. When the difference is detected by the sensor circuit 110, a constant detection result can be obtained even when the height of the support member 103 changes. In other words, when the magnitude of the capacitance Cf is detected using the capacitance Cr as a reference, the change in the absolute value does not affect the detection result by the sensor circuit 110.

The difference between capacitance changes is detected by the sensor circuit 110 as an electrical signal. When the detected value exceeds the threshold value, it can be determined that the projecting portion 106a deforms, and consequently, the three-dimensional pattern of the object can be detected.

The skin surface at a finger tip is formed by ridge and valley portions. When a finger is brought into contact with the protective film 106, the deformation amount of the projecting portion 106a changes between a case wherein the projecting portion 106a is in contact with a ridge portion of the skin surface of a finger and a case wherein the projecting portion 106a is in contact with a valley portion. This difference in deformation amount is detected as the difference in capacitance change.

Hence, when the distribution of detection results different in units of a plurality of sensor elements is determined and detected using the threshold value, the detection results represent the shape of ridge portions of the skin surface of a finger. That is, with the capacitive surface shape recognition sensor of the 10th embodiment, the fine ridge and valley portions of the skin surface can be detected.

According to the surface shape recognition sensor of the 10th embodiment, even when the height of the support member has a manufacturing variation, the variation does not adversely affect the detection result of the sensor circuit 110, so any recognition error of the object shape can be prevented.

Since variations are rarely generated between detection results of the plurality of sensor elements, the fingerprint pattern can be accurately detected.

According to the above 10th embodiment, in one sensor element, the reference electrode has a ring-like integral structure to surround the lower electrode. However, the present invention is not limited to this. The same effect as described above can be obtained even when a plurality of divided reference electrodes are arranged around the lower electrode.

The same effect as in the 10th embodiment can be obtained even when a rectangular reference electrode is formed at a portion between the support member and lower electrode in one sensor element. In this case, a plurality of reference electrodes may be prepared in correspondence with one lower electrode, and a plurality of capacitances between the upper electrode and the plurality of reference electrodes may be compared with the capacitance between the upper electrode and lower electrode.

In the 10th embodiment, the protective film having a projecting portion is formed on the upper electrode. However, the present invention is not limited to this. Formation of a flat protective film on the upper electrode suffices. When a metal material having corrosion resistance is used for the upper electrode, no protective film need be formed on the upper electrode.

11th Embodiment

FIG. 22 shows a small capacitance change detection device according to the 11th embodiment of the present invention. FIG. 22 shows another arrangement of a signal generation circuit 20 shown in FIG. 2.

The signal generation circuit shown in FIG. 22 removes charges by charging/discharging the capacitance and is similar to the first signal generation circuit 22 shown in FIG. 6 in use of charge/discharge of the capacitance. However, unlike the first signal generation circuit 22 shown in FIG. 6, the amount of charges to be removed is controlled by a capacitance Cs and a driving voltage Vs. More specifically, the amount of charges to be removed is controlled by setting the driving voltage Vs shown in FIG. 22 at the power supply voltage level (VDD) or ground level (GND) through a switch SW11. The controllability of the capacitance Cs is higher than that of, e.g., the current value of a current source 21a shown in FIG. 8. The voltage can be easily and accurately controlled using the above-described power supply voltage, as compared to time control.

An optimum value for the capacitance value setting method will be described next.

As shown in FIGS. 23A to 23C, a potential P is set at high level to close the switch for precharge. After this, the potential P is set at low level to open the switch, and charges are removed using the driving capacitance Cs to generate an input signal to the side of a detection circuit 120 formed from the signal generation circuit and output circuit. Let Vp be the precharge potential, Cf be the detection capacitance, and Cp be the parasitic capacitance. A change amount $\Delta V$ of the input signal is given by $$\Delta V = \Delta Vs / \{1 + (Cf + Cp)/Cs\} \quad (2)$$

Figure 24:
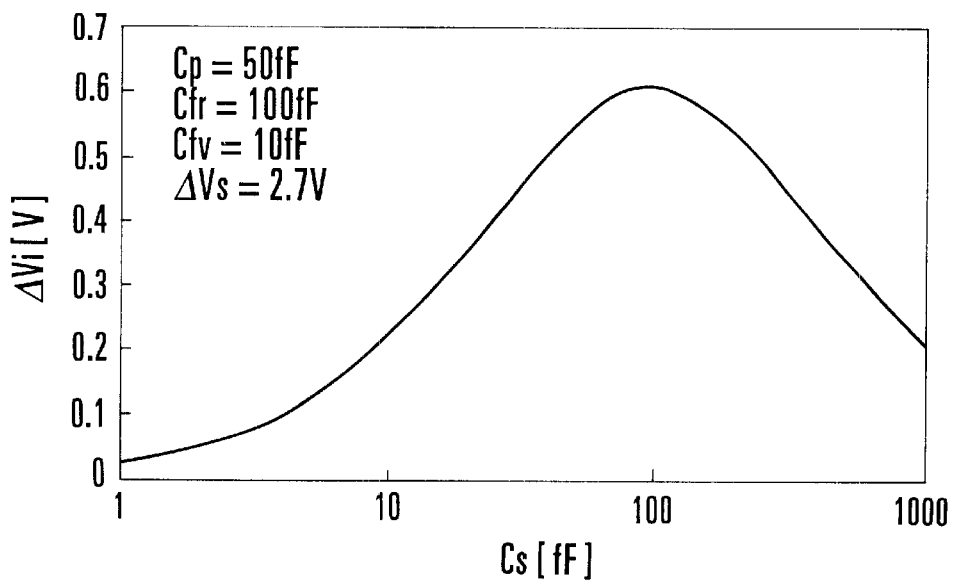
FIG. 24 is a graph showing the characteristics of the device shown in FIG. 22.

A dynamic range $\Delta Vi$ of this signal change amount is given by $$\Delta Vi = \Delta VMAX - \Delta VMIN \quad (3)$$

$$= \Delta Vs / \{1 + Cfv + Cp)/Cs\} -$$

$$\Delta Vs / \{1 + (Cfr + Cp)/Cs\}$$

where Cfv is the capacitance of a valley portion of the skin surface of a finger, and Cfr is the capacitance of a ridge portion of the skin surface of a finger. The dynamic range $\Delta Vi$ is preferably as large as possible because it corresponds to an input signal to the detection circuit 120. FIG. 24 shows the relationship between the dynamic range $\Delta Vi$ and capacitance Cs when Cp=50 fF, Cfv=10 fF, Cfr=100 fF, and $\Delta Vs$=2.7 V.

Referring to FIG. 24, there is a capacitance Cs at which the dynamic range $\Delta Vi$ is maximized. The capacitance Cs is about 95 fF. From the above equations, the dynamic range $\Delta Vi$ is maximized when $$Cs = \{(Cfv+Cp)(Cfr+cp)\}^{1/2} \quad (4)$$

Figure 25:
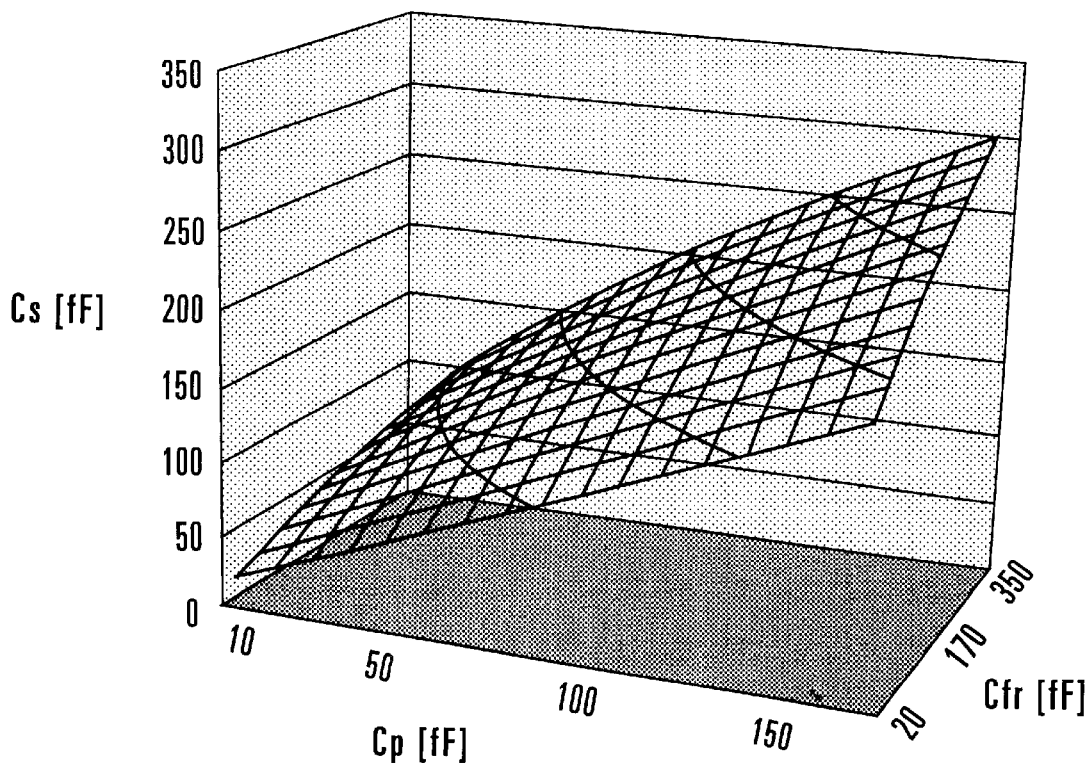
FIG. 25 is a graph showing the characteristics of the device shown in FIG. 22.

The capacitance Cs is selected to satisfy this condition. The size of a sensor electrode is limited on the basis of the fingerprint pattern and sensitivity of a sensor circuit and set to be about 20 to 100 μm square. At this time, the capacitance Cfr is about 20 to 350 fF, the capacitance Cfv is about 5 fF or less, and the parasitic capacitance Cp is about 10 to 170 fF. The capacitance Cfv is small and therefore may be fixed at 5 fF. FIG. 25 shows the optimum value of the capacitance Cs when the capacitances Cfr and Cp are changed.

In actual manufacturing, it can be considered that Cp=Cfv/3 and Cfr=Cfv/20. In this case, the optimum value of the capacitance Cs is about 0.7 Cfv. This relationship is shown in FIG. 26. The optimum value of the capacitance Cs is about 0.7 times the capacitance Cfv and falls within the range of about 14 to 245 fF on the basis of the range of the capacitance Cfv.

In the 11th embodiment of the present invention, charge removal is done using not a current source but charge/discharge of the capacitance. For this reason, it is unnecessary to accurately control the current amounts of internal current sources of a number of sensor cells and the charge removal time. Hence, the sensing accuracy of the detection circuit can be improved with a simple arrangement.

12th Embodiment

FIG. 27 shows a small capacitance change detection device according to the 12th embodiment of the present invention. This device has a voltage-time conversion circuit 141 as an output circuit 40 shown in FIG. 2.

Figure 28:
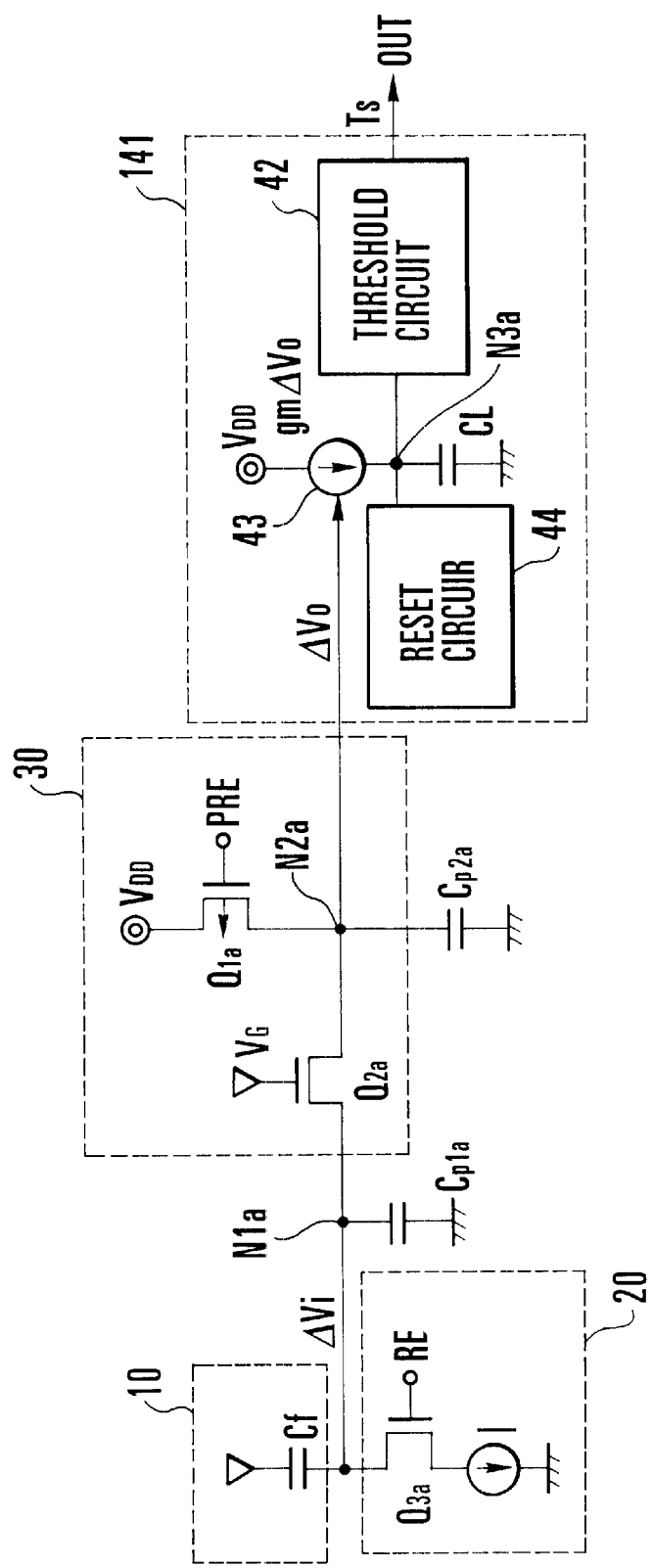
FIG. 28 is a circuit diagram of the device shown in FIG. 27.

FIG. 28 shows the circuit arrangement of the small capacitance change detection device shown in FIG. 27. This arrangement is different from the circuit shown in FIG. 4 in the voltage-time conversion circuit 141 is arranged in place of the output circuit 40.

As shown in FIG. 28, the voltage-time conversion circuit 141 comprises a variable current source 43 for converting an input signal $\Delta Vo$ into a current signal, load capacitance CL charged with the current from the variable current source 43, threshold circuit 42 which receives the potential at a node N3a and changes the signal to be output on the basis of a certain threshold voltage, and reset circuit 44 for resetting the potential at the node N3a.

FIGS. 29A to 29D show operations of various sections of the small capacitance change detection device shown in FIG. 28. The operation of the small capacitance change detection device will be described with reference to these timing charts.

Figure 29:
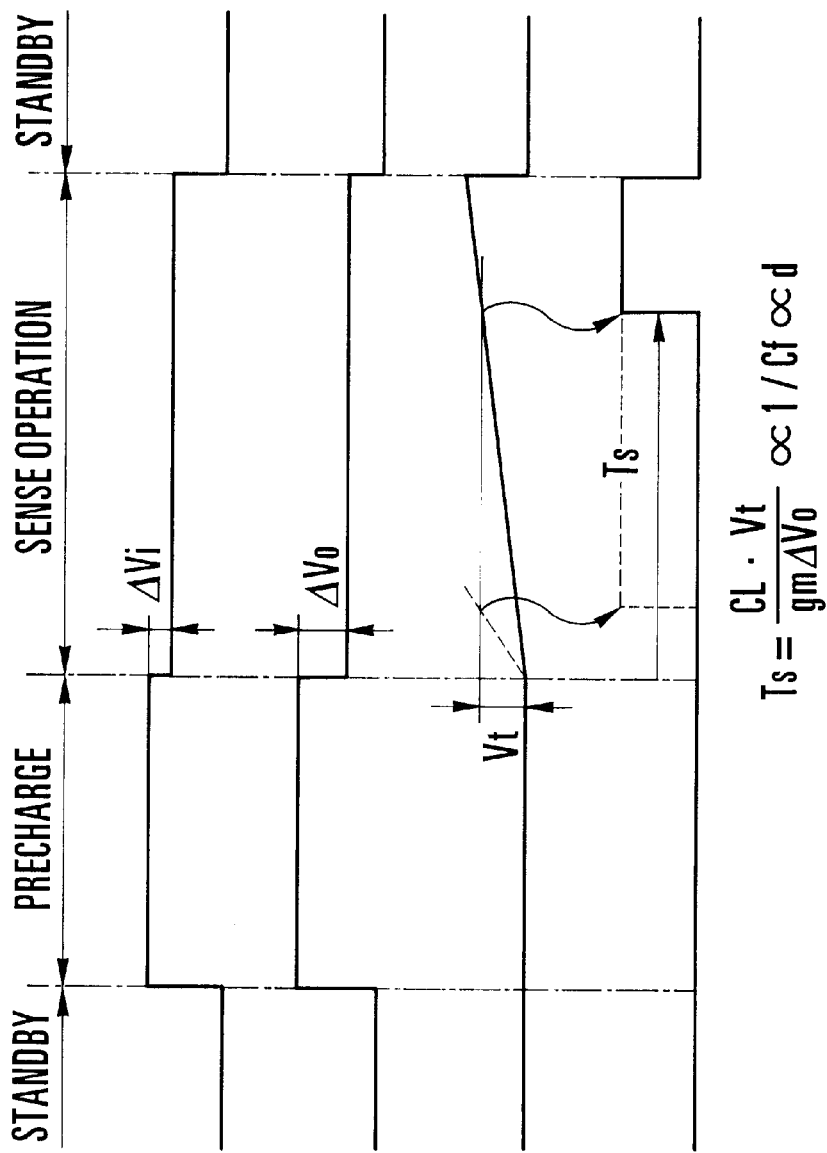
FIGS. 29A to 29D are timing charts showing the operation of the device shown in FIG. 27.

When a voltage signal $\Delta Vi$ corresponding to a capacitance Cf of a detection element 10 is output (FIG. 29A), the voltage signal $\Delta Vi$ is amplified to $\Delta Vo$ by a signal amplification circuit 30 and output to the voltage-time conversion circuit 141 (FIG. 29B). A current corresponding to the input signal $\Delta Vo$ flows from the variable current source 43 of the voltage-time conversion circuit 141 to charge the load capacitance CL. With this operation, the potential at the node N3a of the voltage-time conversion circuit 141 rises (FIG. 29C).

When the potential at the node N3a exceeds a threshold voltage Vt of the threshold circuit 42, the output voltage from an output signal OUT changes (FIG. 29D). The signal polarity is merely an example and is not limited to this. In this case, since the current amount of the variable current source 43 changes depending on the magnitude of the input signal ΔVo, the manner in which the potential increases at the node N3a changes. A time Ts until the output signal changes is given by $$Ts = CL \cdot Vt / gm \Delta Vo \tag{5}$$

where gm is the transconductance of the variable current source 43.

When the capacitance Cf is about 100 fF or less, the input signal ΔVo is approximately in proportion to the magnitude of the capacitance Cf, and the time Ts is in proportion to a distance d between the electrode of the detection element 10 and the skin surface of a finger. Hence, the signal corresponding to the distance from the skin surface of a finger can be represented by the time. The output dynamic range can be increased without being limited by the power supply voltage or linear region of an analog amplifier. The variable current source 43 can be realized by, e.g., a PMOS transistor. The threshold circuit 42 can be realized using an inverter circuit or a circuit such as a Schmidt trigger circuit having hysteresis in its threshold value. When a circuit such as a Schmidt trigger circuit having hysteresis in its threshold value is used, the output signal from the threshold circuit 42 can be prevented from changing due to a voltage variation by noise even when the potential at the node N3a moderately changes. When the polarities of signals or power supply are inverted, the polarities of MOS transistors are inverted. This arrangement is not illustrated because it is readily understood by the skilled in the art. For example, as the variable current source 43, an NMOS transistor can be used.

13th Embodiment

Figure 30:
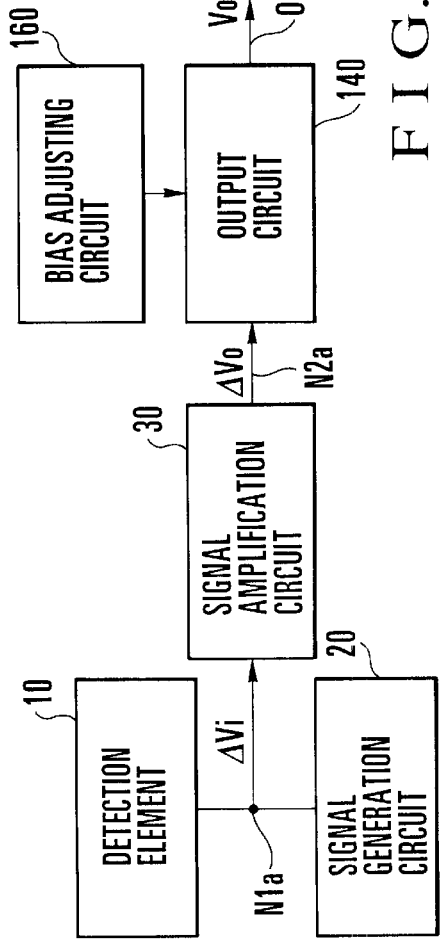
FIG. 30 is a block diagram showing the 13th embodiment of the present invention.

FIG. 30 shows a small capacitance change detection device according to the 13th embodiment of the present invention. An output circuit 40 shown in FIG. 2 is built by an output circuit 140 and bias adjusting circuit 160. In the device shown in FIG. 30, the output circuit 140 can be adjusted by the bias adjusting circuit 160.

Figure 31:
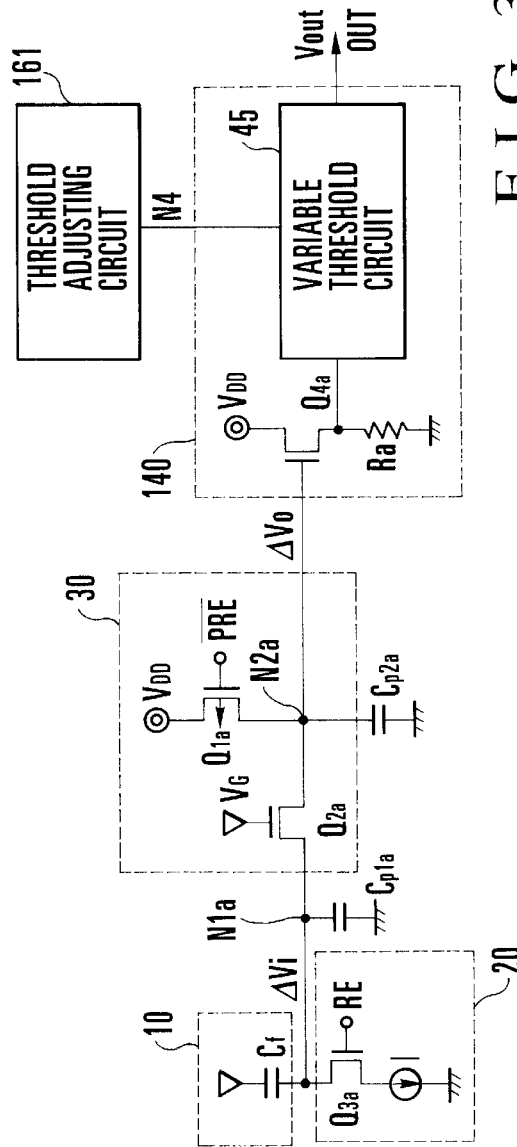
FIG. 31 is a circuit diagram of the device shown in FIG. 30.
Figure 32:
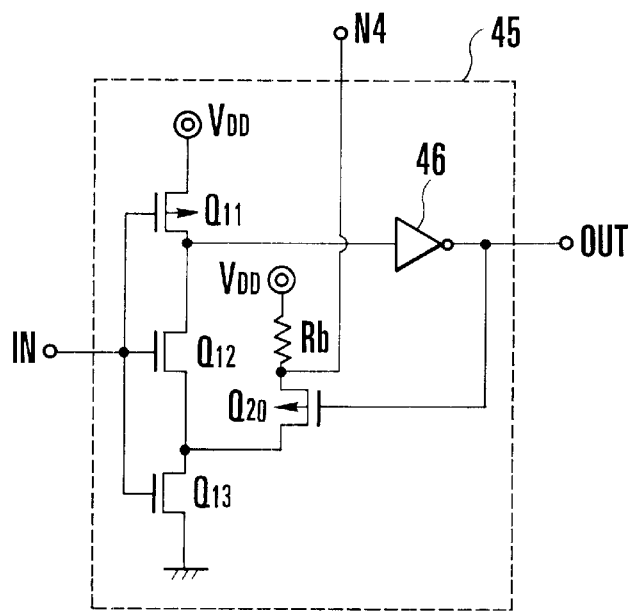
FIG. 32 is a circuit diagram of a variable threshold circuit arranged in the output circuit of the device shown in FIG. 31.

Referring to FIG. 31, the output circuit 140 has a variable threshold circuit 45, and the threshold voltage of the variable threshold circuit 45 is adjusted by a threshold adjusting circuit 161. The threshold adjusting circuit 161 is a specific example of the bias adjusting circuit 160 shown in FIG. 30. The variable threshold circuit 45 in the output circuit 140 can be realized by a Schmidt trigger circuit as shown in FIG. 32. When such a circuit is used as the variable threshold circuit 45, and nodes N4 of sense units 1 shown in FIG. 1 are connected to each other, the sense units function as the threshold adjusting circuits 161. With this arrangement, the threshold voltage of the variable threshold circuit 45 in the output circuit 140 changes depending on the states of output signals from the sense units 1. For example, assume that a voltage signal from an output circuit at a valley portion of the skin surface of a finger is larger than that from an output circuit at a ridge portion of skin surface of the finger. The contrast of the ridge and valley portions of the skin surface of the finger can be enhanced by adjusting the threshold voltage of the variable threshold circuit 45 such that the signal from the output circuit at the ridge portion is made smaller than the signal from the output circuit at the valley portion.

In the same circuit arrangement as described above, an analog amplifier can be used as the variable threshold circuit 45, and the threshold adjusting circuit 161 can be operated as the bias adjusting circuit of the analog amplifier. The contrast can be enhanced by adjusting the bias of the analog amplifier in accordance with the output signal states of the sense units. Hence, according to the 13th embodiment, the function of enhancing the contrast of the surface shape can be realized.

14th Embodiment

Figure 33:
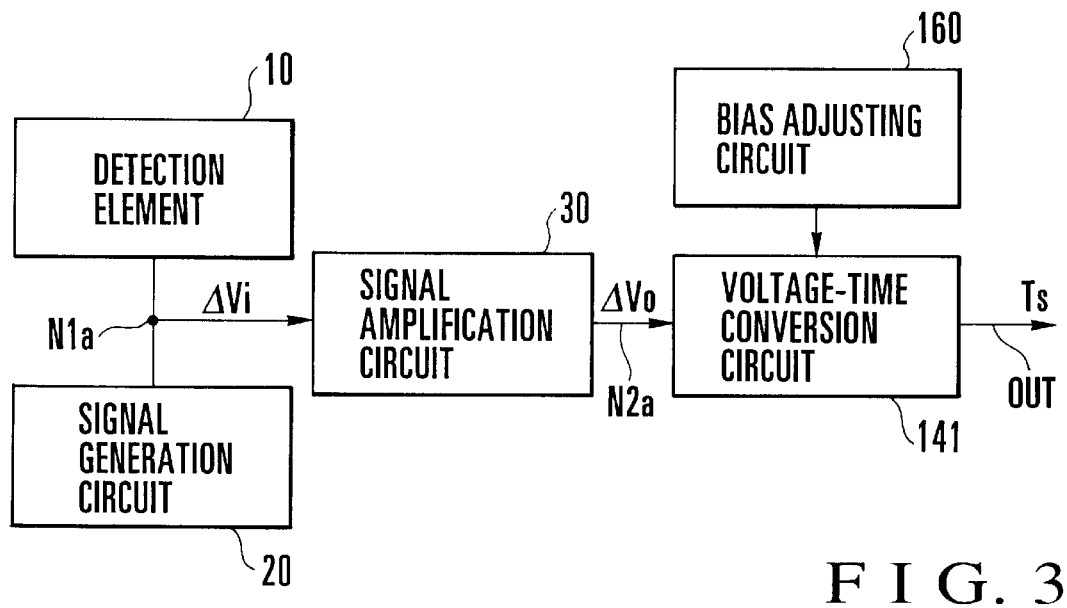
FIG. 33 is a block diagram showing the 14th embodiment of the present invention.

FIG. 33 shows a small capacitance change detection device according to the 14th embodiment of the present invention. An output circuit 40 shown in FIG. 20 is built by a voltage-time conversion circuit 141 and bias adjusting circuit 160.

In the 14th embodiment, the voltage-time conversion circuit 141 is used as the output circuit 40, and the voltage-time conversion circuit 141 is adjusted by the bias adjusting circuit 160.

Referring to FIG. 34, the voltage-time conversion circuit 141 shown in FIG. 33 has a variable threshold circuit 45, and the threshold voltage of the variable threshold circuit 45 can be adjusted by a threshold adjusting circuit 161. The threshold adjusting circuit 161 shown in FIG. 34 is a specific example of the bias adjusting circuit 160 shown in FIG. 33. The variable threshold circuit 45 can be realized by a Schmidt trigger circuit as shown in FIG. 32. When such a circuit is used as the variable threshold circuit, and nodes N4 of sense units 1 are connected to each other, the sense units function as threshold adjusting circuits. With this arrangement, the threshold voltage of the variable threshold circuit 45 in the voltage-time conversion circuit 141 changes depending on the states of output signals from the sense units 1.

For example, assume that an output signal Ts from a voltage-time conversion circuit at a valley portion of the skin surface of a finger is larger than the output signal Ts from a voltage-time conversion circuit at a ridge portion of skin surface of the finger. The contrast of the ridge and valley portions of the skin surface of the finger can be enhanced by adjusting the threshold voltage of the variable threshold circuit such that the signal from the voltage-time conversion circuit at the valley portion is made larger than the signal from the voltage-time conversion circuit at the ridge portion, i.e., the threshold voltage becomes high. Hence, according to the 14th embodiment, the function of increasing the output dynamic range and enhancing the contrast of the surface shape can be realized.

15th Embodiment

Figure 35:
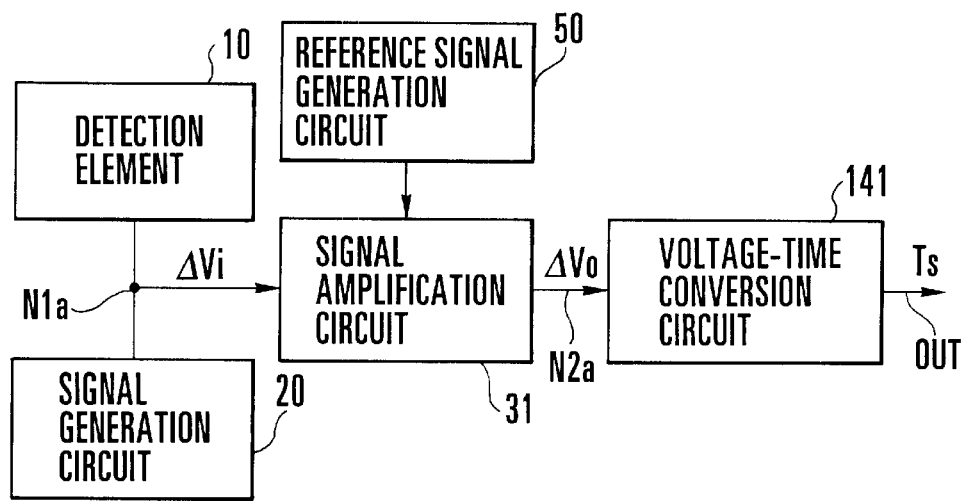
FIG. 35 is a block diagram showing the 15th embodiment of the present invention.

FIG. 35 shows a small capacitance change detection device according to the 15th embodiment of the present invention. An output circuit 40 shown in FIG. 7 is formed from a voltage-time conversion circuit 141. When the output circuit 40 is constructed as a voltage-time conversion circuit, the same effect as in the above-described 12th embodiment can be obtained.

16th Embodiment

Figure 36:
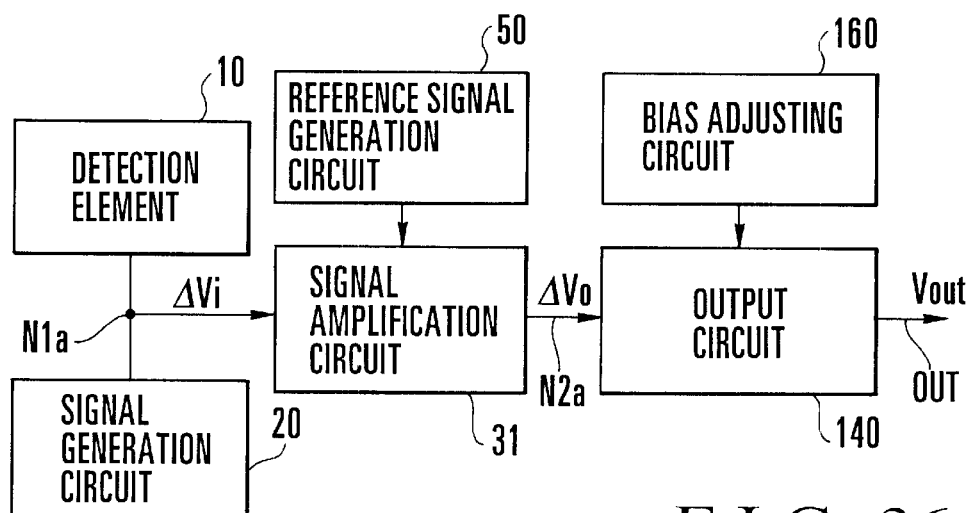
FIG. 36 is a block diagram showing the 16th embodiment of the present invention.

FIG. 36 shows a small capacitance change detection device according to the 16th embodiment of the present invention. An output circuit 40 shown in FIG. 7 is formed from an output circuit 140 shown in FIG. 30, and the output circuit 140 is adjusted by a bias adjusting circuit 160. With this arrangement, the same effect as in the above-described 13th embodiment can be obtained.

17th Embodiment

Figure 37:
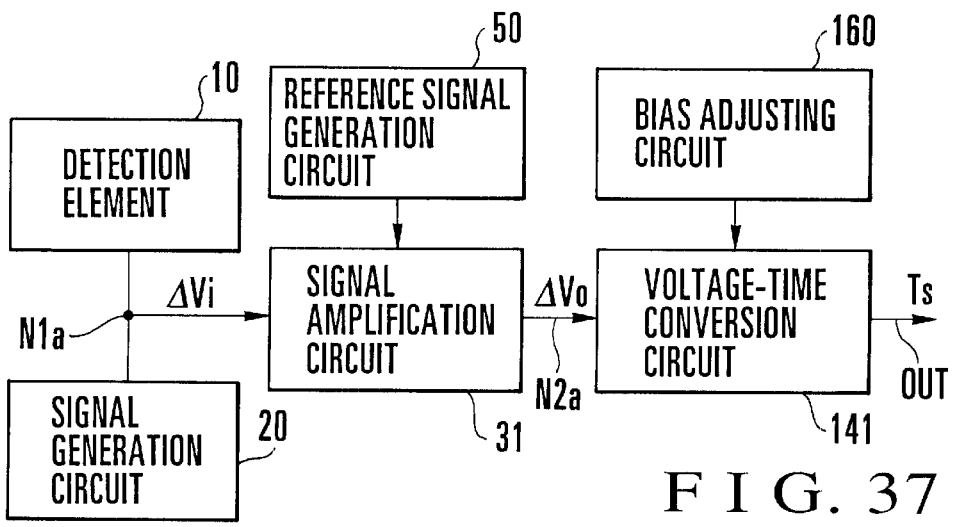
FIG. 37 is a block diagram showing the 17th embodiment of the present invention.

FIG. 37 shows a small capacitance change detection device according to the 17th embodiment of the present invention. An output circuit 40 shown in FIG. 7 is formed from a voltage-time conversion circuit 141 shown in FIG. 33, and the voltage-time conversion circuit 141 is adjusted by a bias adjusting circuit 160. With this arrangement, the same effect as in the above-described 14th embodiment can be obtained.

As described above, in the 12th to 17th embodiments, the output dynamic range of the device can be increased by converting the output signal into a signal in the direction of time. In addition, when the bias of the internal circuit of the output circuit is adjusted, the contrast can be enhanced. Furthermore, by combining these circuits, a wide dynamic range and high contrast can be simultaneously realized. When this device is applied to a fingerprint sensor using the LSI manufacturing technology, a highly accurate fingerprint image can be obtained even by an A/D converter with low resolving power because of the dynamic range increase and contrast enhancement function. Especially, application of this device in a low-voltage operative state allows obtaining a highly accurate fingerprint image.

18th Embodiment

Figure 38:
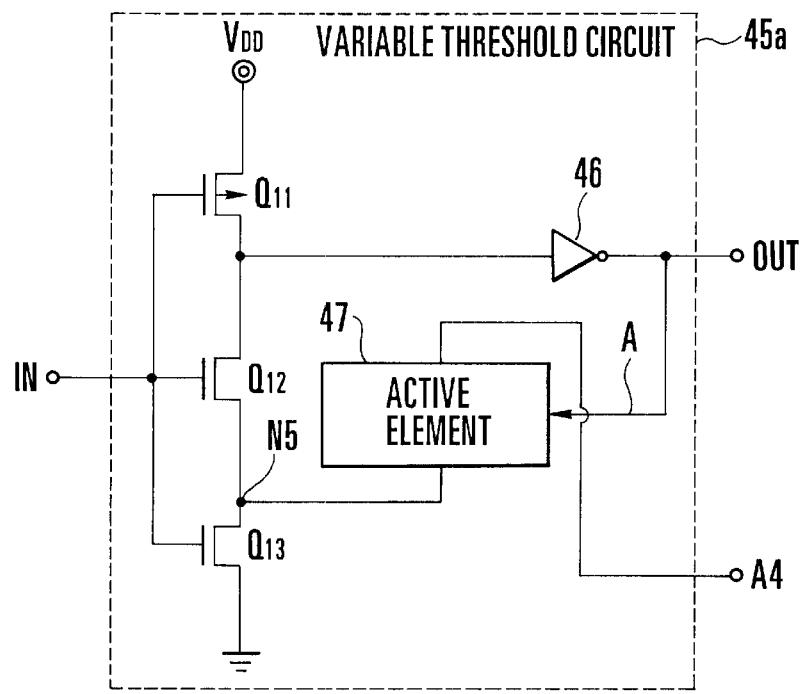
FIG. 38 is a circuit diagram of a variable threshold circuit according to the 18th embodiment of the present invention.

FIG. 38 shows the 18th embodiment of the present invention. FIG. 38 shows the circuit arrangement of a variable threshold circuit 45a arranged in an output circuit 140 shown in FIG. 31 as a variable threshold circuit shown in FIG. 32. The logic threshold value of this variable threshold circuit 45a can be adjusted or controlled after manufacturing.

The variable threshold circuit 45a shown in FIG. 38 or each of variable threshold circuits to be described later is constructed by a Schmidt trigger circuit.

Referring to FIG. 38, reference symbol Q11 denotes a PMOS transistor; and Q12 and Q13, NMOS transistors. Reference numeral 46 denotes an inverter gate. Reference symbol VDD denotes a power supply voltage; and N4 and N5, nodes. The conductivity of an active element 47 changes in accordance with the level of a signal indicated by an arrow A. The active element 47 is turned off when an output signal OUT goes high. In this case, the active element 47 can be realized by, e.g., a PMOS transistor.

In this variable threshold circuit 45a, the conductivity of the active element 47 is controlled by the output signal OUT. The variable threshold circuit 45a has the above-described elements. This is different from the conventional circuit in that the potential at the node N4 for connecting the active element 47 can be applied from an external element of the variable threshold circuit 45a. The potential at the node N4 is adjusted by a threshold adjusting circuit 161 shown in FIG. 31.

Referring to FIG. 38, when the potential at the node N4 is increased/decreased, the potential at the node N5 also increases/decreases accordingly. For this reason, by controlling the potential at the node N4, the logic threshold value for changing an input signal IN from low level to high level can be adjusted.

Figure 39:
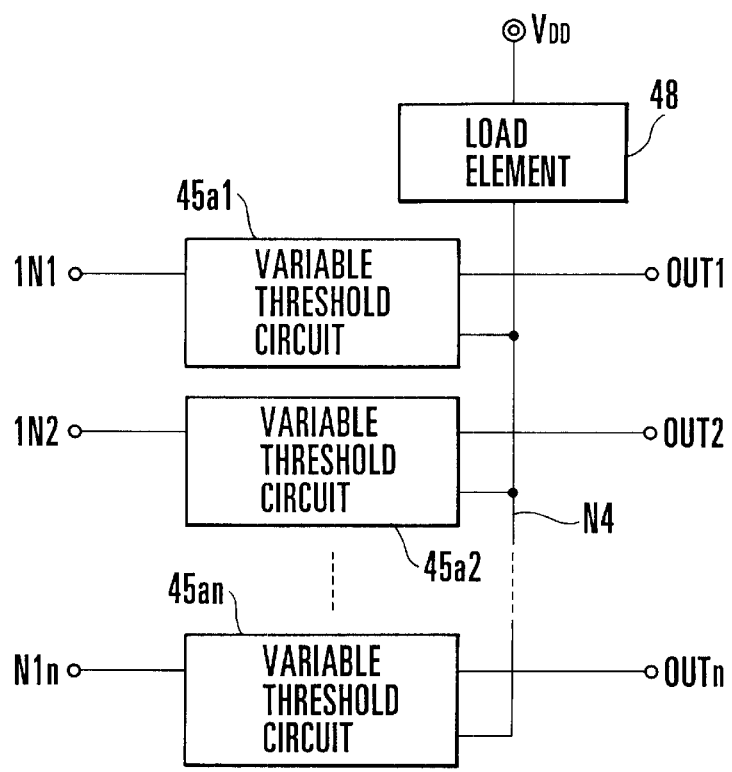
FIG. 39 is a block diagram showing a connection example of the variable threshold circuit shown in FIG. 38.

As shown in FIG. 39, when the nodes N4 of a plurality of variable threshold circuits $45a_1$ to $45a_n$ are connected, and a load element 48 is inserted between the nodes N4 and the power supply potential VDD, the logic threshold value can be dynamically changed in accordance with the input waveform.

The load element 48 can be realized by, e.g., a resistive element or a MOS transistor biased by a gate electrode potential. In FIG. 39, n variable threshold circuits $45a_1$ to $45a_n$ are connected. Input signals IN1, IN2, ..., INn and output signals OUT1, OUT2, ..., OUTn correspond to the variable threshold circuits $45a_1$ to $45a_n$, respectively.

Referring to FIG. 39, a case wherein the potential changes of the input signals have different slopes will be considered. For the descriptive convenience, assume that the input signal IN1 has the steepest slope, the input signal IN2 has a relatively moderate slope, and the input INn has the most moderate slope.

FIG. 40 shows operation waveforms when such input waveforms are input to the circuit as shown in FIG. 39.

Referring to FIG. 40, when all the input signals are at low level, all the variable threshold circuits $45a_1$ to $45a_n$ have a logic threshold value Vta. When the input signals begin to change, the potential of the input signal IN1 reaches the logic threshold value Vta first, so the output signal OUT1 output from the variable threshold circuit $45a_1$ first goes high. As a result, the active element 47 in the variable threshold circuit $45a_1$ controlled by the output signal OUT1 is turned off, and the potential at the node N4 shown in FIG. 39 slightly rises. Hence, the logic threshold value of all the variable threshold circuits $45a_1$ to $45a_n$ becomes slightly higher than Vta.

When the input signal IN2 exceeds the logic threshold value after change, the same operation as described above is performed. Finally, when the input signal INn exceeds the logic threshold value, the logic threshold value has increased to Vtb. Hence, the output timing of the output signal OUTn can be delayed as compared to the conventional output signal.

As is apparent from the above description, the logic threshold value of the variable threshold circuit 45a dynamically changes in accordance with the operation of the remaining variable threshold circuits. This effect can also be obtained for input waveforms which are the same but have different input timings. Hence, when the variable threshold circuit 45a is used, the logic threshold value can be changed in accordance with the input waveform.

19th Embodiment

FIG. 41 shows the 19th embodiment of the present invention.

The basic arrangement is the same as in the 18th embodiment. However, a variable threshold circuit 45b is different from the 18th embodiment in that a load element 49 is connected between a node N4 and power supply voltage VDD in the variable threshold circuit 45b. The load element 49 can be realized by, e.g., a resistive element or a MOS transistor biased by a gate electrode potential. With this arrangement, the initial value of the potential at the node N4 can be set on the basis of the ON resistance ratio of an active element 47 to a transistor Q13. After this, by changing the potential at the node N4, the logic threshold value of the variable threshold circuit 45b is adjusted as in the 18th embodiment.

Figure 42:
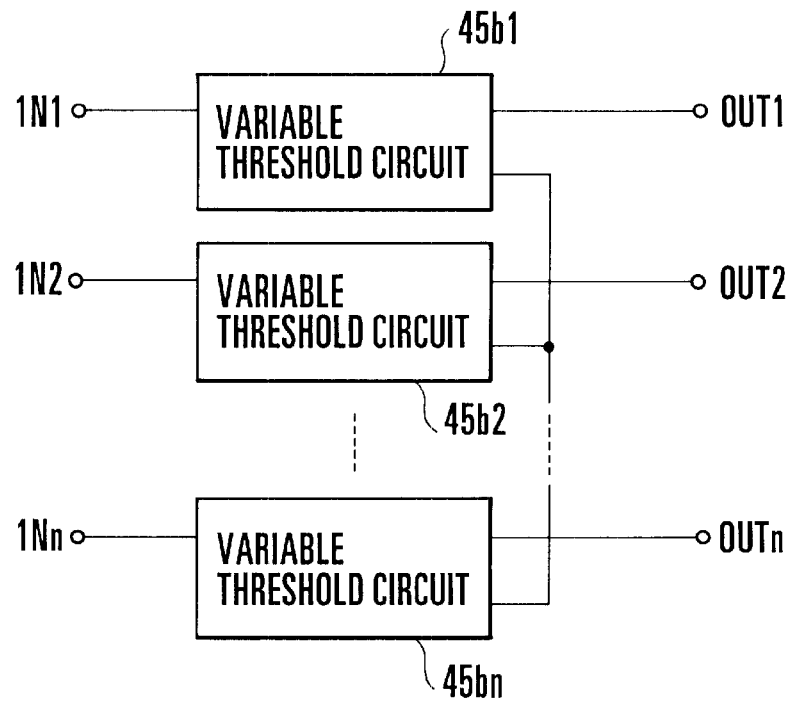
FIG. 42 is a block diagram showing a connection example of the variable threshold circuit shown in FIG. 41.

As shown in FIG. 42, when the nodes N4 of a plurality of variable threshold circuits $45b_1$ to $45b_n$ are connected, the logic threshold value can be dynamically changed in accordance with the input waveform. The operation principle and effect are the same as in the 18th embodiment shown in FIG. 39.

20th Embodiment

Figure 43:
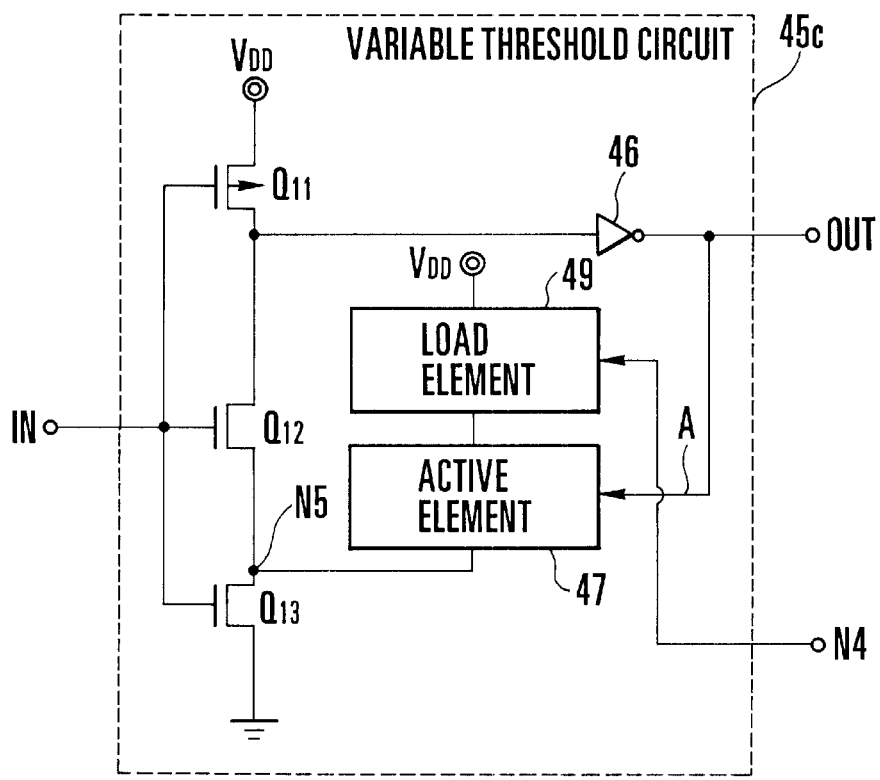
FIG. 43 is a circuit diagram of a variable threshold circuit according to the 20th embodiment of the present invention.

FIG. 43 shows the 20th embodiment of the present invention.

A variable threshold circuit 45c of the 20th embodiment shown in FIG. 43 is different from the variable threshold circuit 45b of the 19th embodiment shown in FIG. 41 in that the ON resistance of a load element 49 is controlled by the potential at a node N4. In the 20th embodiment, the ON resistance is changed by changing the potential at the node N4, and consequently, the logic threshold value of the variable threshold circuit 45c can be adjusted.

21st Embodiment

FIG. 44 shows the 21st embodiment of the present invention.

For a variable threshold circuit 45d of the 21st embodiment shown in FIG. 44, the polarity of a MOS transistor of the variable threshold circuit 45a of the 18th embodiment shown in FIG. 38 is inverted (Q12 →Q15), a power supply potential VDD is replaced with ground GND, and a node N6 is arranged in place of the node N4.

In the variable threshold circuit 45d of the 21st embodiment, the logic threshold value can be adjusted by controlling the potential at the node N6 when the input waveform changes from high level to low level.

22nd Embodiment

In the 22nd embodiment of the present invention, the polarity of the MOS transistor Q12 in the variable threshold circuit 45b of the 19th embodiment shown in FIG. 41 is inverted, a power supply potential VDD is replaced with ground GND, and a node N6 is arranged in place of the node N4, as in conversion from FIG. 38 to FIG. 44. The 22nd embodiment is not illustrated because it can be easily estimated from the figure (FIG. 41) of the 19th embodiment.

In the variable threshold circuit of the 22nd embodiment, the logic threshold value can be adjusted by controlling the potential at the node N6 when the input waveform changes from high level to low level, as in the variable threshold circuit 45d of the 21st embodiment shown in FIG. 44.

23rd Embodiment

In the 23rd embodiment of the present invention, the polarity of the MOS transistor Q12 in the variable threshold circuit 45c of the 20th embodiment shown in FIG. 43 is inverted, a power supply potential VDD is replaced with ground GND, and a node N6 is arranged in place of the node N4, as in conversion from FIG. 38 to FIG. 44. The 23rd embodiment is not illustrated because it can be easily estimated from the figure (FIG. 43) of the 20th embodiment.

In the variable threshold circuit of the 23rd embodiment, the logic threshold value can be adjusted by controlling the potential at the node N6 when the input waveform changes from high level to low level, as in the variable threshold circuit 45d of the 21st embodiment shown in FIG. 44.

24th Embodiment

FIG. 45 shows the 24th embodiment of the present invention. A variable threshold circuit 45e of the 24th embodiment is formed by combining the variable threshold circuit 45a of the 18th embodiment shown in FIG. 38 and variable threshold circuit 45d of the 21st embodiment shown in FIG. 44 into one circuit.

In the variable threshold circuit 45e of the 24th embodiment, the logic threshold value can be adjusted when the input waveform changes from low level to high level, as in the variable threshold circuit 45a of the 18th embodiment shown in FIG. 38. In addition, when the input waveform changes from high level to low level, the logic threshold value can be adjusted, as in the variable threshold circuit 45d of the 21st embodiment shown in FIG. 44.

25th Embodiment

In the 25th embodiment of the present invention, the variable threshold circuit 45b of the 19th embodiment shown in FIG. 41 and the above-described 22nd embodiment are combined into one circuit. The 25th embodiment is not illustrated because it can be easily estimated from the figure (FIG. 41) of the 19th embodiment and the above-described 22nd embodiment.

In the variable threshold circuit of the 25th embodiment, when the input waveform changes from low level to high level, the logic threshold value can be adjusted, as in the variable threshold circuit 45b of the 19th embodiment shown in FIG. 41. When the input waveform changes from high level to low level, the logic threshold value can be adjusted, as in the 22nd embodiment.

26th Embodiment

In the 26th embodiment of the present invention, the variable threshold circuit 45c of the 20th embodiment shown in FIG. 43 and the variable threshold circuit of the 23rd embodiment are combined into one circuit. The 26th embodiment is not illustrated because it can be easily estimated from the figure (FIG. 43) of the 20th embodiment and the above-described 23rd embodiment.

In the variable threshold circuit of the 26th embodiment, when the input waveform changes from low level to high level, the logic threshold value can be adjusted, as in the 20th embodiment shown in FIG. 43. When the input waveform changes from high level to low level, the logic threshold value can be adjusted, as in the 23rd embodiment.

In the above variable threshold circuits, a signal having the same polarity as that of an input signal is output. When one inverter circuit is added to the output side, a variable threshold circuit for outputting the inverted signal of the input signal IN can be formed. When the inverter gate 46 is omitted, or the inverter gate 46 is replaced with a buffer circuit, a variable threshold circuit for outputting the inverted signal of the input signal IN can be obtained. In this case, the active element 47 is turned off when the output signal OUT goes low. The active element 47 can be realized by, e.g., an NMOS transistor.

As described above, in the variable threshold circuits of the 18th to 26th embodiments, the logic threshold value can be changed after manufacturing the circuit. When the input level deviates from the design value due to the manufacturing variation in the circuit, the input level can be adjusted by changing the logic threshold value. In addition, when input waveforms have different slops or different input timings, the waveforms can be shaped while dynamically changing the logic threshold value. As a consequence, when the input waveform changes due to the manufacturing variation in the circuit or in accordance with the operation condition, a desired waveform shaping output can be obtained.

When the nodes N4 or N6 of the variable threshold circuits of each of the 18th to 26th embodiments are connected to connect the sense units 1 shown in FIG. 1 to each other, each sense unit functions as a variable threshold circuit. When the voltage value from the output circuit at the valley portion of the skin surface of a finger is larger than that at a ridge portion, the threshold voltage changes such that the voltage signal from the output circuit at the ridge portion is made smaller by the voltage signal from the output circuit at the valley portion, and the contrast of the ridge and valley portions of the skin surface of a finger can be increased.

27th Embodiment

Figure 46:
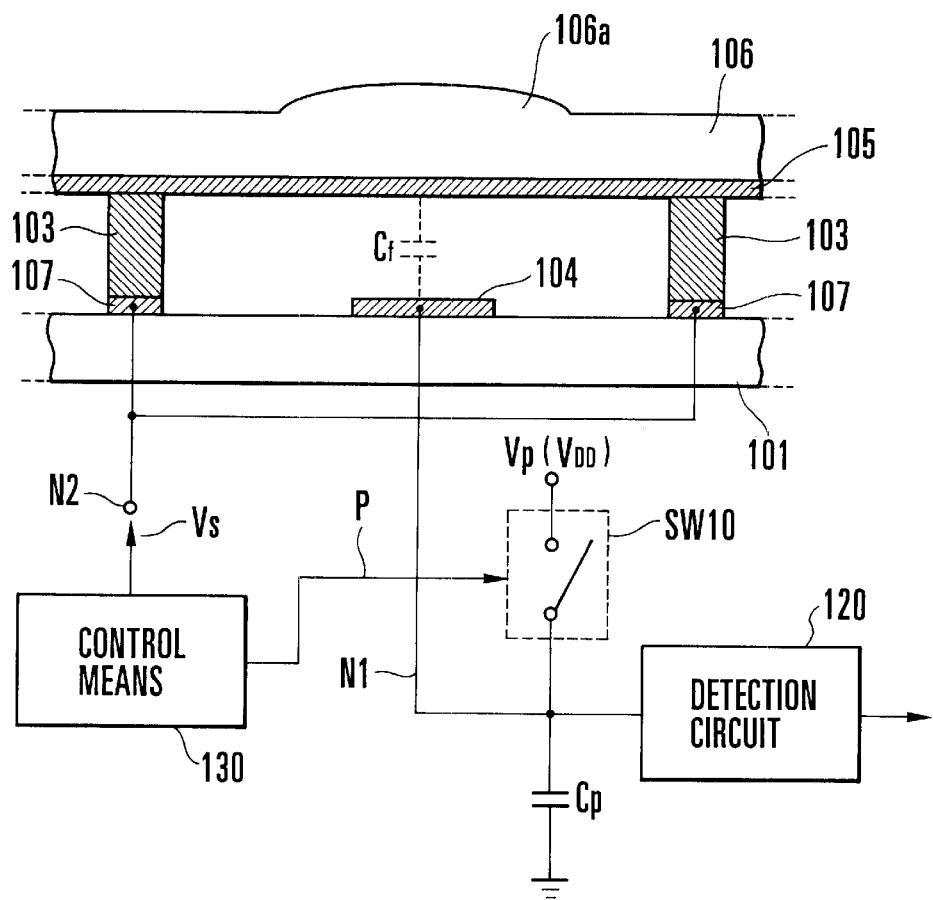
FIG. 46 is a view showing the 27th embodiment of the present invention.

FIG. 46 shows a small capacitance change detection device according to the 27th embodiment of the present invention. FIG. 46 shows a section of one sensor element (detection element 10 shown in FIG. 2) in a sensor array two-dimensionally arrayed on a semiconductor substrate and the arrangement of a signal generation circuit 20 shown in FIG. 2.

Referring to FIG. 46, reference numeral 104 denotes a lower electrode; 107, a metal film; 103, a support member; 105, an upper electrode; 101, a semiconductor substrate; 106, a protective film; and 120, a detection circuit. Reference symbol SW10 denotes a switch. The sensor elements are isolated by the support member 103. Referring to FIG. 46, a capacitance Cf is formed between the upper electrode 105 and lower electrode 104. The capacitance Cf reflects the three-dimensional pattern of the surface shape of a measurement object such as a finger 3 in FIG. 1, which is placed on the protective film 106. Reference symbol Cp denotes a parasitic capacitance; and Vp, an external potential applied to a node N1 (corresponding to a node N1a in FIG. 4) in FIG. 46. Reference symbol P denotes a control signal of the switch SW10. The switch SW10 can be realized by, e.g., a MOS transistor. The detection circuit 120 corresponds to a signal amplification circuit 30 and output circuit 40 shown in FIG. 2. Reference numeral 130 denotes a control means.

The operation of the small capacitance change detection device shown in FIG. 46 will be described with reference to the timing charts shown in FIGS. 47A to 47C.

At time ① in FIG. 47B, the control means 130 sets a voltage Vs at a node N2 to a constant potential and applies the voltage Vs to the upper electrode 105 through the metal film 107 and support member 103 as a conductive member. Next, at time ② in FIG. 47A, the control means 130 sets the control signal P at high level to turn on the switch SW10 to precharge the node N1 shown in FIG. 46 with the external voltage Vp, thereby charging the capacitance Cf. After the node N1 is precharged, at time ③ in FIG. 47A, the control means 130 sets the control signal P at low level to turn off the switch SW10 and also changes the voltage Vs at the node N2 by ΔVs from the constant potential, as shown in FIG. 47B.

When the change amount of the voltage Vs is ΔVs, the potential at the node N1 changes due to capacitive coupling by the capacitance Cf, so the change amount of the potential at the node N1 is represented by $$Cf/(Cf+Cp)*\Delta Vs \quad (6)$$

Letting Cf0 be the value of capacitance Cf when the surface has a valley portion, and Cf1 be the value of capacitance Cf when the surface has a ridge portion (in this case, Cf0<Cf1), the change amount difference ΔV due to the difference in surface shape is given by $$\Delta V=(Cf1/(Cf1+Cp)-Cf0/(Cf0+Cp))*\Delta Vs \quad (7)$$

The ridge and valley portions of the surface shape are detected by detecting the change amount difference ΔV due to the difference in surface shape by the detection circuit 120 and determining it.

As described above, the signal generation circuit changes the potential of the upper electrode 105 of the capacitance Cf in accordance with the detection timing to increase the voltage change corresponding to the change in capacitance Cf, thereby increasing the detection sensitivity.

FIG. 48 shows a case wherein the magnitude of the change amount difference ΔV due to the difference in surface shape is compared with that of the prior art.

Referring to FIG. 48, the abscissa represents the ratio of Cp to Cf0. As is apparent from FIG. 48, the change amount difference ΔV due to the difference in surface shape is larger in the device of the present invention. Hence, as compared to the conventional device, the signal change difference reflecting the ridge and valley portions of the surface shape can be made larger. As is apparent from FIG. 48, when the parasitic capacitance Cp is small, the change amount difference ΔV due to the difference in surface shape becomes large.

In the 27th embodiment shown in FIG. 46, the potential at the node N1 is set by the switch SW10. This is merely an example, and the potential can be set by another setting means. For example, the potential can be set by the transistor Q1a shown in FIG. 4.

In the signal generation circuit of the 27th embodiment, since a signal reflecting the three-dimensional pattern of the surface shape of an object to be measured is generated using capacitive coupling by the capacitance Cf, the signal change difference reflecting the three-dimensional pattern of the surface shape can be made larger than that of the prior art. In addition, since the capacitance Cs provided in the conventional device can be omitted, the parasitic capacitance Cp need not be estimated in designing, and cumbersome design of an appropriate capacitance Cs based on the estimated parasitic capacitance Cp is unnecessary. As a result, in this device, the fingerprint pattern detection accuracy can be prevented from lowering due to the manufacturing variation or power supply noise in the detection circuit 120, and a detection disable state can be prevented.

28th Embodiment

Figure 49:
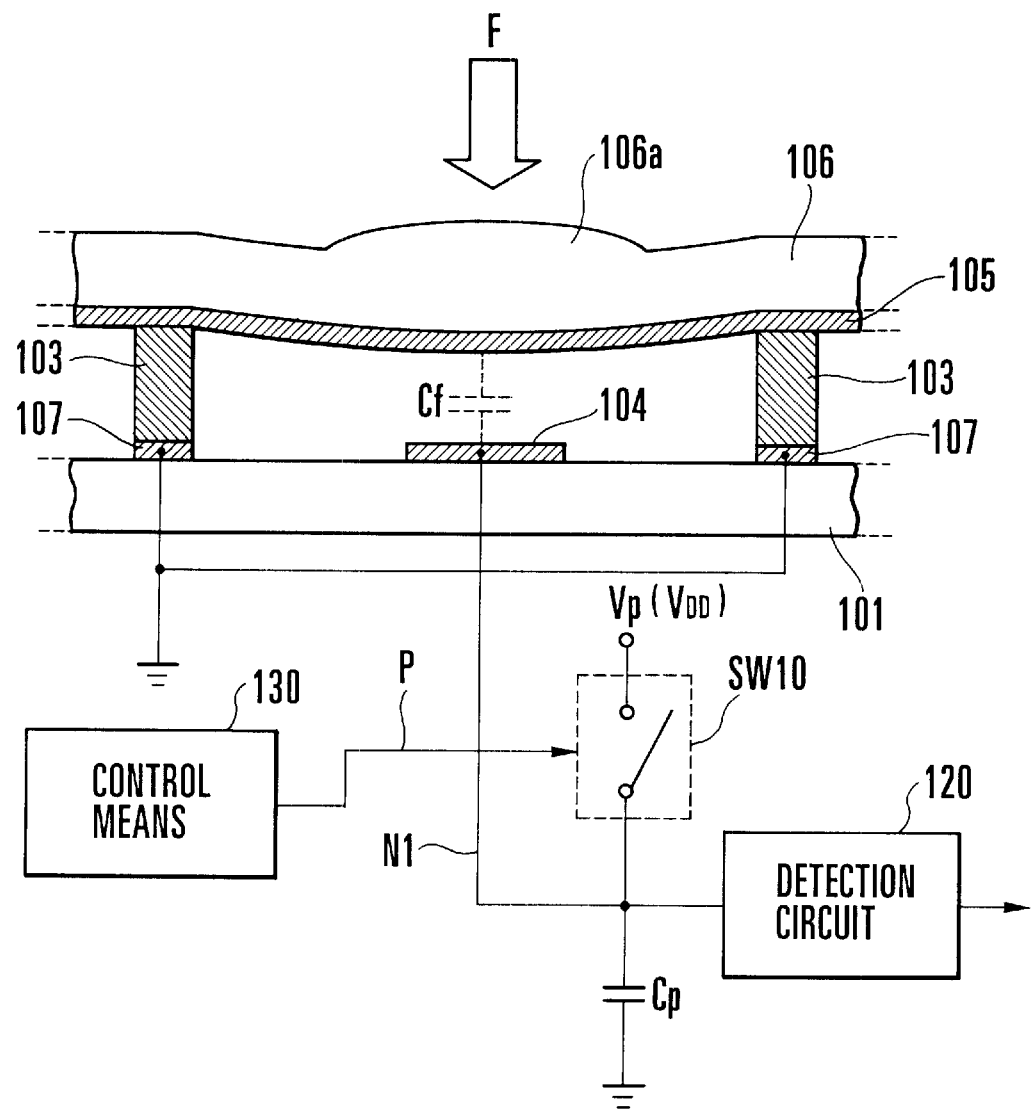
FIG. 49 is a view showing the 28th embodiment of the present invention.

FIG. 49 shows a small capacitance change detection device according to the 28th embodiment of the present invention. FIG. 49 shows a section of one sensor element (detection element 10 shown in FIG. 2) in a sensor array two-dimensionally arrayed on a semiconductor substrate and the arrangement of a signal generation circuit 20 shown in FIG. 2.

The same reference numerals as in the small capacitance change detection device shown in FIG. 46 denote the same parts in FIG. 49, and a detailed description thereof will be omitted.

In the small capacitance change detection device shown in FIG. 46, a voltage Vs of an upper electrode 105 different from a lower electrode 104 connected to a node N1 of a capacitance Cf is controlled by a control means 130. In the small capacitance change detection device shown in FIG. 49, the potential of the upper electrode 105 is fixed (in this embodiment, ground potential GND).

The operation of the small capacitance change detection device shown in FIG. 49 will be described with reference to the timing charts in FIGS. 50A to 50C.

Before a measurement object such as a finger 3 comes into contact with the two-dimensionally arrayed sensor array (i.e., in the non-contact state shown in FIG. 50B), at time ① in FIG. 50A, the control means 130 sets a control signal P at high level to turn on a switch SW10 to precharge the node N1 shown in FIG. 49 with an external voltage Vp, thereby charging the capacitance Cf. After the node N1 is precharged, at time ② in FIG. 50A, the control means 130 sets the control signal P at low level to turn off the switch SW10.

As shown in FIG. 50B, when the object to be measured partially comes into contact with the sensor, the value of the capacitance Cf changes, and consequently, the potential at the node N1 is changed by redistributing charges.

Letting Cfi be the initial value of capacitance Cf, Cf0 be the value of capacitance Cf when the surface of the object to be measured has a valley portion, and Cf1 be the value of capacitance Cf when the surface of the object to be measured has a ridge portion (in this case, Cf0<Cf1), the change amount difference ΔV due to the difference in surface shape is given by $$\Delta V=((Cf1-Cfi)/(Cf1+Cp)-(Cf0-Cfi)/(Cf0+Cp))*Vp \qquad (8)$$

The three-dimensional pattern of the surface shape of the objet to be measured is detected by detecting the change amount difference ΔV due to the difference in surface shape by a detection circuit 120 and determining it.

In the signal generation circuit of the present invention, the capacitance Cf is precharged, and then, the object to be measured is brought into contact with the capacitance Cf to increase the voltage change corresponding to the change in capacitance Cf, thereby increasing the detection sensitivity.

FIG. 51 shows a case wherein the magnitude of the change amount difference ΔV due to the difference in surface shape is compared with that of the prior art.

Referring to FIG. 51, the abscissa represents the ratio of Cp to Cf0. As is apparent from FIG. 51, the change amount difference ΔV due to the difference in surface shape is larger in the device of the present invention. Hence, as compared to the conventional device, the signal change difference reflecting the three-dimensional pattern of the surface shape can be made larger. As is apparent from FIG. 51, when the parasitic capacitance Cp is small, the change amount difference ΔV due to the difference in surface shape becomes large.

In the 28th embodiment shown in FIG. 49, the potential at the node N1 is set by the switch SW10. This is merely an example, and the potential can be set by another setting means. For example, the potential can be set by the transistor Q1a shown in FIG. 4.

In the signal generation circuit of the 28th embodiment, since a signal reflecting the ridge and valley portions of the surface shape of an object to be measured is generated directly using the change in value of capacitance Cf when the object to be measured is in contact, the signal change difference reflecting the three-dimensional pattern of the surface shape can be made larger than that of the prior art. In addition, since the capacitance Cs provided in the conventional device can be omitted, the parasitic capacitance Cp need not be estimated in designing, and cumbersome design of an appropriate capacitance Cs based on the estimated parasitic capacitance Cp is unnecessary. As a result, in this device, the fingerprint pattern detection accuracy can be prevented from lowering due to the manufacturing variation or power supply noise in the detection circuit 120, and a detection disable state can be prevented. Furthermore, since signal generation can be started in synchronism with contact of the object to be measured, the signal generation timing signal need not be used.

29th Embodiment

Figure 52A:
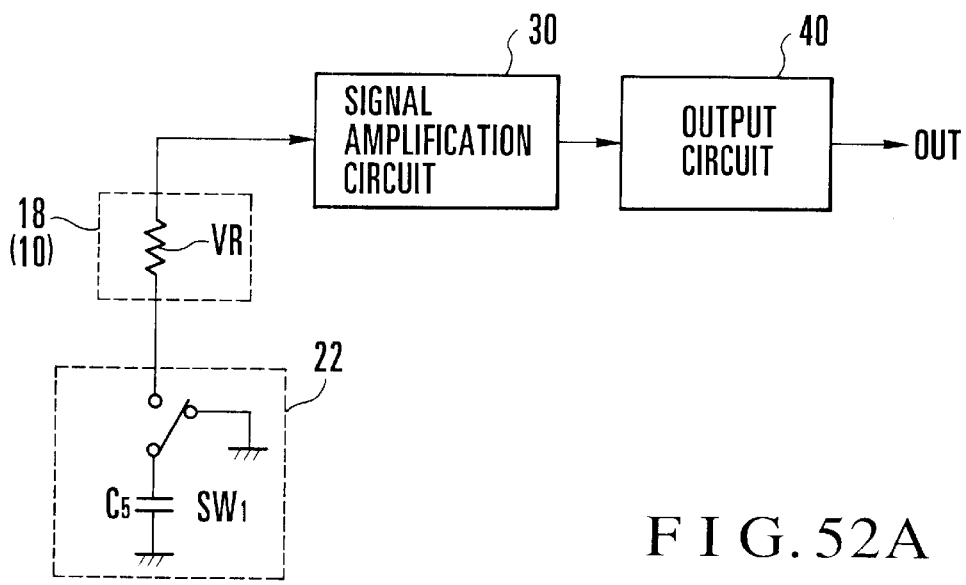
FIG. 52 is a block diagram of a sense unit according to the 29th embodiment of the present invention.
Figure 52B:
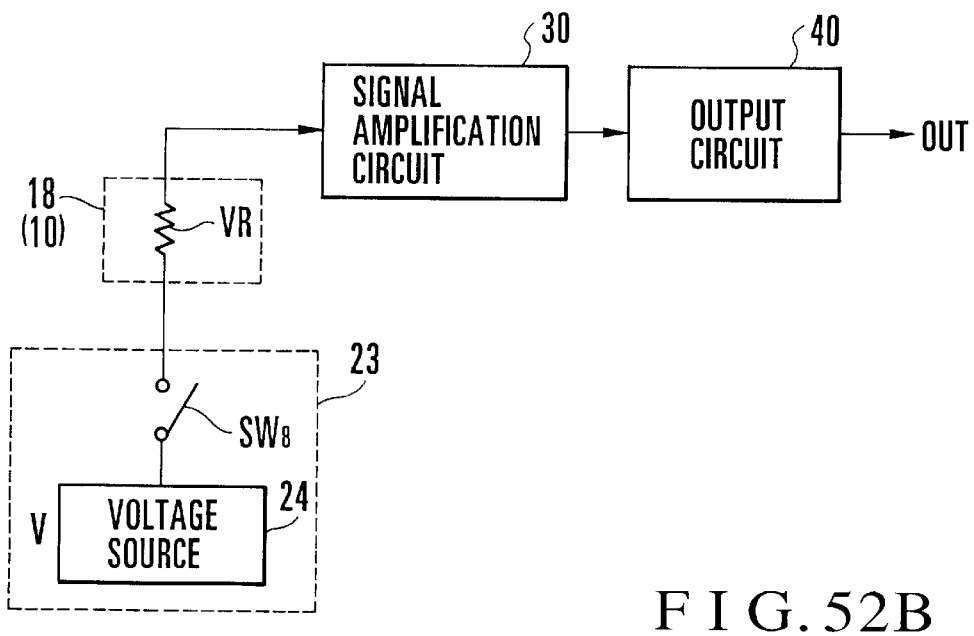

FIGS. 52A and 52B show a small capacitance change detection device according to the 29th embodiment of the present invention. FIGS. 52A and 52B show arrangements of a sense unit 1 of this device. The same reference numerals as in FIG. 4 denote the same parts in FIGS. 52A and 52B, and a detailed description thereof will be omitted.

In the sense unit 1 shown in FIG. 4, a detection element 10 formed from an electrostatic capacitance Cf between a sensor electrode 16 and the skin surface of a finger 3 is used. Instead, the sense unit 1 can also be constructed using a detection element 18 formed from a variable resistive element VR with elastic characteristics.

In this case, as shown in FIG. 52A, a first signal generation circuit 22, detection element 18, signal amplification circuit 30, and output circuit 40 are connected in series in the order named to construct the sense unit 1. The signal generation circuit 22 is formed from a capacitance Cs shown in FIG. 6. The signal amplification circuit 30 corresponds to the charge transfer signal amplification circuit 30 shown in FIG. 4.

The resistance value of the variable resistive element VR changes in accordance with deformation when an object such as the finger 3 to be recognized is in contact. The speed of removing charges stored by precharge by the capacitance Cs changes in accordance with the change in resistance value of the variable resistive element VR. When this change is detected as a voltage signal, the ridge and valley portions of the skin surface of a finger can be detected. The remaining operations are basically the same as those of the sense unit 1 shown in FIG. 4.

As shown in FIG. 52B, a first signal generation circuit 23 constructed by a voltage source 24 and switch SW8 may be used in place of the signal generation circuit 22. The switch SW8 is connected between the variable resistive element VR and voltage source 24.

A voltage V of the voltage source 24 is set to have an arbitrary positive or negative value such that a current flows from the signal amplification circuit 30 to the signal generation circuit 23.

The ridge and valley portions of the skin surface of a finger can also be detected using the capacitance Cf instead of the detection element 18 shown in FIGS. 52A and 52B. In this case, the first signal generation circuit, detection element (capacitance Cf) 10, signal amplification circuit 30, and output circuit 40 are connected in series in the order named.

Figure 53A:
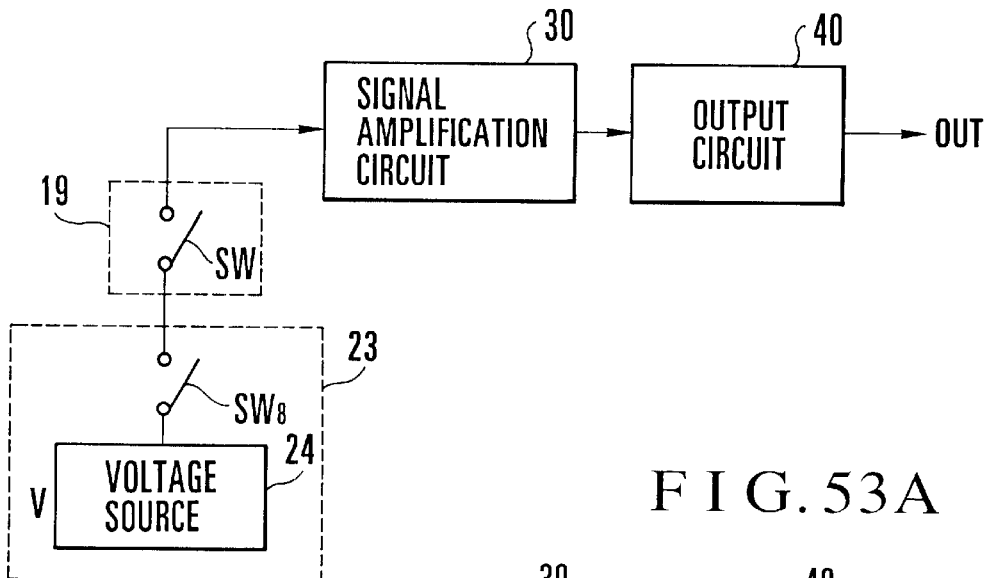
FIGS. 53A to 53C are block diagrams showing other arrangements of the sense unit shown in FIG. 52.
Figure 53B:
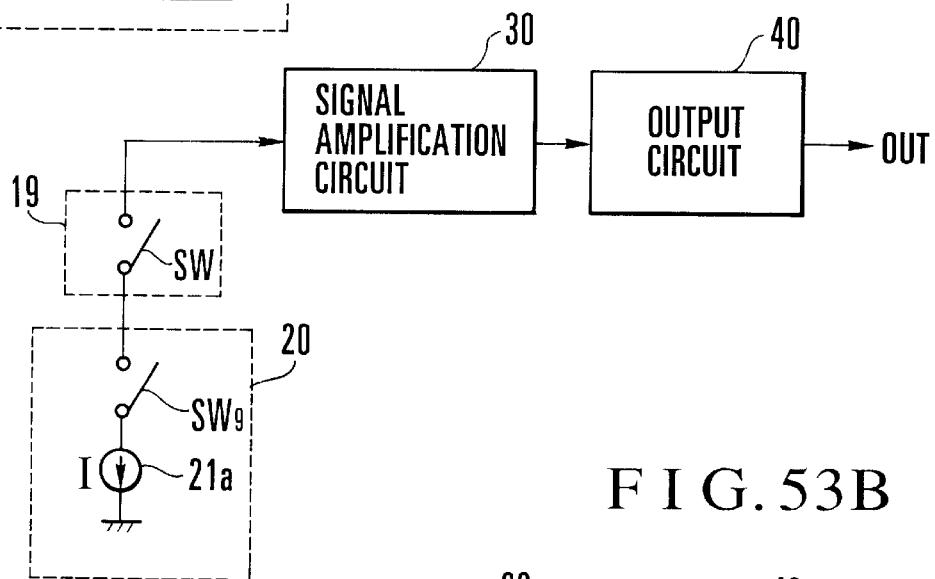
Figure 53C:
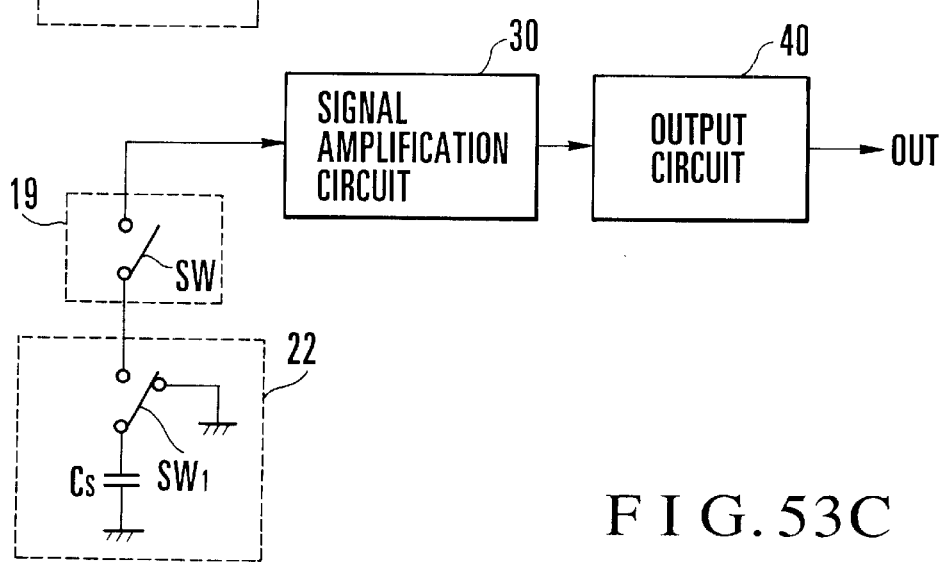
Figure 54:
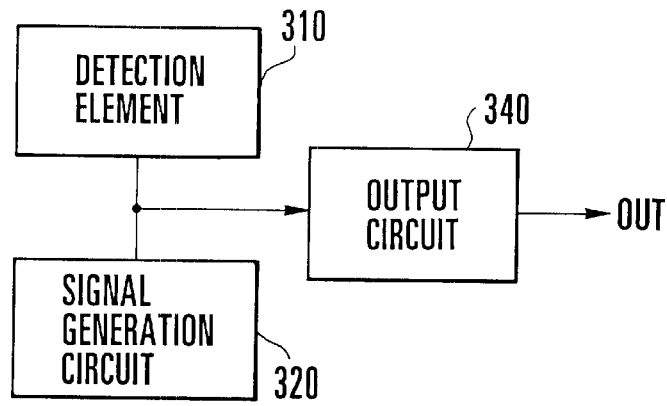
FIG. 54 is a block diagram showing a conventional device.
Figure 55A:
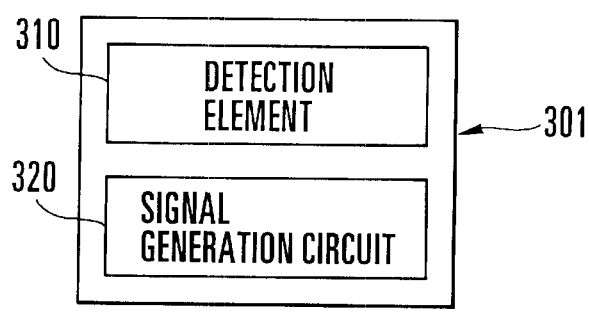
FIGS. 55A and 55B are views showing the layout of the device shown in FIG. 54.
Figure 55B:
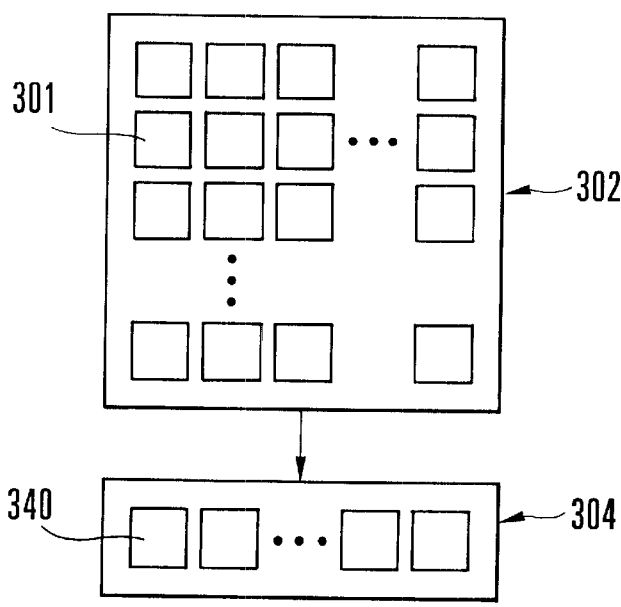
Figure 56:
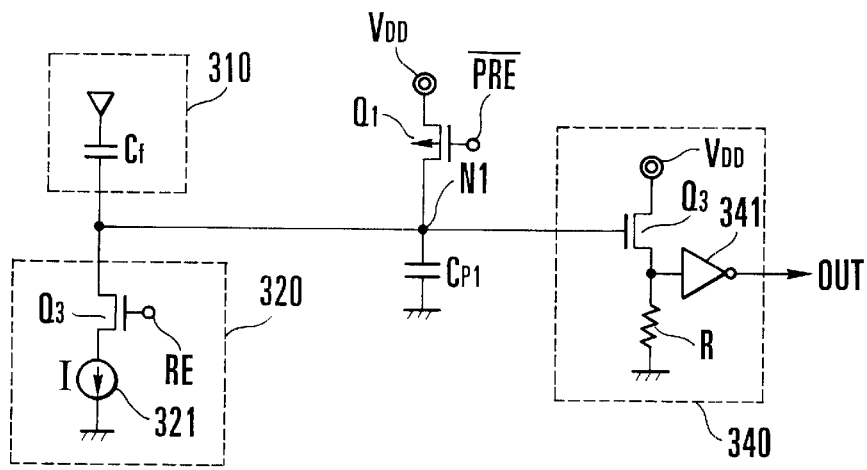
FIG. 56 is a circuit diagram of the device shown in FIG. 54.
Figure 57A:
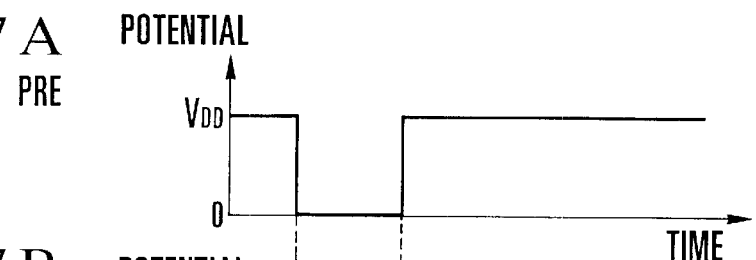
FIGS. 57A to 57C are timing charts showing the operation of the device shown in FIG. 56.
Figure 57B:
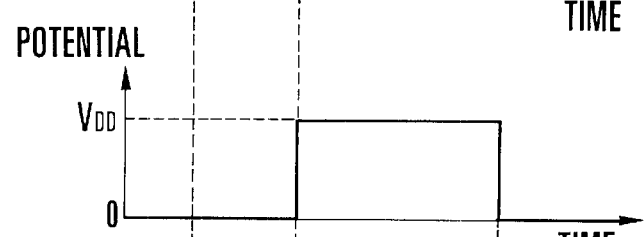
Figure 57C:
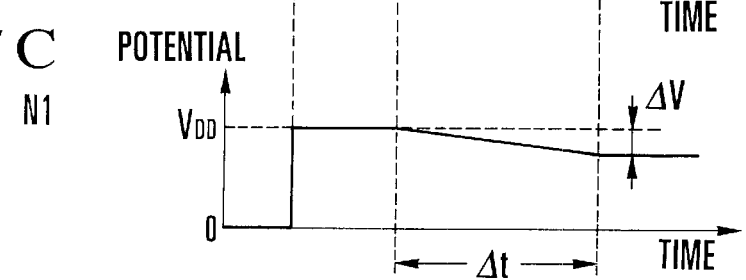

FIGS. 53A to 53C show other arrangements of the sense unit 1 shown in FIGS. 52A and 52B. As shown in FIG. 53A, as a detection element 19, a switch element SW formed using the micromachine technology may be used. In this case, the signal generation circuit 23, detection element 19, signal amplification circuit 30, and output circuit 40 are connected in series in the order named to construct the sense unit 1.

The switch element SW opens/closes the circuit on the basis of contact of the object such as the finger 3 to be recognized. More specifically, when the switch element SW is depressed by a ridge portion of the skin surface of a finger, the signal generation circuit 23 and signal amplification circuit 30 are connected, and charges stored by precharge are removed by the voltage source 24. With this operation, the potential on the input side of the output circuit 40 lowers. Conversely, when the switch element SW is depressed by a valley portion of the skin surface of a finger, the first signal generation circuit 23 and signal amplification circuit 30 are kept disconnected, and the potential on the input side of the output circuit 40 does not lower.

On the basis of this potential drop, the ridge and valley portions of the skin surface of a finger can be detected. The remaining operations are basically the same as those of the sense unit 1 shown in FIG. 4.

As shown in FIG. 53B or 53C, a signal generation circuit 20 including a current source 21a or signal generation circuit 22 including a capacitance Cs may be used.

The detection element 18 or 19 shown in FIGS. 52A and 52B or 53A to 53C can be applied to any one of the sense units 1 shown in FIGS. 8 and 10 to 13 together with a corresponding one of the signal generation circuits 20, 22, and 23. In the sense unit 1 shown in FIG. 13, however, the signal generation circuit 20, 22, or 23 need be set such that a current flows from the signal generation circuit 20, 22, or 23 to the signal amplification circuit 30.

As has been described above, according to the present invention, a small capacitance change detection device comprises a capacitance detection element, a signal generation circuit connected to the capacitance detection element to control predetermined charges, a signal amplification circuit connected to the connection portion between the signal generation circuit and capacitance detection element, and an output circuit. The signal amplification circuit has a transistor, a first voltage source connected to the control terminal of the transistor, a second voltage source, and a third voltage source. One of the second and third voltage sources is connected to the other output side of the transistor via a first switch. When the second voltage source is connected to the transistor, the voltage to be applied from the second voltage source to the other output side of the transistor is set to have a value equal to or larger than a value obtained by subtracting the threshold voltage of the transistor from the voltage of the first voltage source. When the third voltage source is connected to the transistor, the voltage to be applied from the third voltage source to the other output side of the transistor is set to have a value equal to or smaller than a value obtained by subtracting the threshold voltage of the transistor from the voltage of the first voltage source. The output circuit connected to the connection point between the other output side of the transistor and a first switch receives, after the voltage of the second or third voltage source is applied to the connection point in the ON state of the first switch, the voltage at the connection point on the basis of the OFF state of the first switch and charge control by the signal generation circuit after the first switch is turned off. With this arrangement, a small capacitance change detected by the capacitance detection element can be accurately extracted. Hence, the design margin of the output circuit can be increased.

What is claimed is:

1. A small capacitance change detection device comprising:
    a capacitance detection element for detecting a small capacitance change;
    a signal generation circuit having an output side connected to said capacitance detection element to control predetermined charges;
    a signal amplification circuit having an input side connected to a connection point between the output side of said signal generation circuit and said capacitance detection element; and
    an output circuit connected to an output side of said signal amplification circuit,
    said signal amplification circuit comprising
        a first transistor having one output terminal connected to the connection portion between the output side of said signal generation circuit and said capacitance detection element,
        a first voltage source connected to a control terminal of said first transistor,
        a second voltage source, and
        a third voltage source,
        wherein one of said second and third voltage sources is connected to the other output terminal of said first transistor via a first switch,
        a voltage to be applied from said second voltage source to the other output terminal of said first transistor is set to have a value not less than a value obtained by subtracting a threshold voltage of said first transistor from a voltage of said first voltage source that is applied to the control terminal of said first transistor while a voltage to be applied from said third voltage source to the other output terminal of said first transistor is set to have a value not more than a value obtained by subtracting the threshold voltage of said first transistor from the voltage of said first voltage source that is applied to the control terminal of said first transistor, and
        said output circuit is connected to a connection point between the other output terminal of said first transistor and said first switch and, after a voltage of one of said second and third voltage sources is applied to the connection point in an ON state of said first switch, receives the voltage at the connection point on the basis of an OFF state of said first switch and charge control by said signal generation circuit after said first switch is turned off.

2. A device according to claim 1, wherein
said signal generation circuit and said signal amplification circuit are arranged near said capacitance detection element.

3. A device according to claim 2, wherein
said output circuit is arranged near said signal amplification circuit.

4. A device according to claim 1, wherein
said signal generation circuit is shared by a plurality of capacitance detection elements close to each other.

5. A device according to claim 1, wherein
said signal amplification circuit is shared by a plurality of capacitance detection elements close to each other.

6. A device according to claim 1, wherein
said output circuit is shared by a plurality of capacitance detection elements close to each other.

7. A device according to claim 1, wherein
said signal generation circuit, said signal amplification circuit, and said output circuit are arranged in units of capacitance detection elements.

8. A device according to claim 1, wherein
said device further comprises a reference signal generation circuit connected to the input side of said signal amplification circuit to generate a reference signal, and
said signal amplification circuit comprises a circuit having a gain changing means for changing a gain on the basis of comparison between a level of an output signal from said signal generation circuit and that of the reference signal.

9. A device according to claim 8, wherein
said gain changing means decreases the gain when the level of the output signal from said signal generation circuit is lower than that of the reference signal, and increases the gain when the level of the output signal from said signal generation circuit is higher than that of the reference signal.

10. A device according to claim 8, wherein
said gain changing means increases the gain when the level of the output signal from said signal generation circuit is lower than that of the reference signal, and decreases the gain when the level of the output signal from said signal generation circuit is higher than that of the reference signal.

11. A device according to claim 8, wherein
the reference signal has the same level as that of the signal output from said signal generation circuit in correspondence with a predetermined quantity of electricity of said capacitance detection element.

12. A device according to claim 8, wherein
said reference signal generation circuit comprises
a reference element having a predetermined quantity of electricity, and
a reference signal generation section for generating the reference signal corresponding to the predetermined quantity of electricity of said reference element, said reference signal generation section having the same arrangement as that of said signal generation circuit.

13. A device according to claim 12, wherein
said signal amplification circuit comprises a second transistor having one output terminal connected to a connection point between said reference element and said reference signal generation section, the other output terminal connected to said second voltage source via a second switch, and a control terminal connected to the connection point between the other output terminal of said first transistor and said first switch, and having the same characteristics as those of said first transistor, and
said second voltage source is connected to the control terminal of said first transistor via said second switch as the first voltage source.

14. A device according to claim 13, wherein
said output circuit comprises a differential output circuit having input sides connected to the other output terminal of said first transistor and the other output terminal of said second transistor, respectively.

15. A device according to claim 13, wherein
said signal amplification circuit comprises a third switch connected between the other output terminal of said first transistor and that of said second transistor to short-circuit the other output terminal of said first transistor to that of said second transistor in an inoperative state of said signal generation circuit and said reference signal generation section and disconnect the other output terminal of said first transistor from that of said second transistor in an operative state of said signal generation circuit and said reference signal generation section.

16. A device according to claim 8, wherein
said reference signal generation circuit is arranged near a corresponding signal amplification circuit.

17. A device according to claim 8, wherein
said reference signal generation circuit is shared by a plurality of signal amplification circuits close to each other.

18. A device according to claim 8, wherein
said reference signal generation circuit is arranged in units of signal amplification circuits.

19. A device according to claim 8, wherein
said device further comprises
a plurality of lower electrodes formed on a substrate to be insulated and isolated from each other,
an upper electrode formed to oppose said lower electrodes,
a support member formed on said substrate in units of lower electrodes to support said upper electrode, and
a reference electrode formed between each of said lower electrodes on said substrate and said support member to be separated from said lower electrode and said support member,
said upper electrode can deform in a direction of lower electrode using said support member as a fulcrum, and
said capacitance detection element detects a capacitance between said upper electrode and said lower electrode while said reference signal generation circuit detects a capacitance between said upper electrode and said reference electrode to output the reference signal.

20. A device according to claim 19, wherein
surfaces of said lower electrode and said reference electrode opposing said upper electrode have the same area.

21. A device according to claim 19, wherein
said reference electrode is formed to surround said lower electrode.

22. A device according to claim 19, wherein
said plurality of lower electrodes are formed in a matrix.

23. A device according to claim 19, wherein
said support member has a matrix shape, and said lower electrode is formed at a central portion of each square.

24. A device according to claim 1, wherein
said signal generation circuit comprises
a fourth switch connected to the connection portion, and
a current source connected to said fourth switch to remove predetermined charges at the connection portion on the basis of an ON state of said fourth switch.

25. A device according to claim 1, wherein
said signal generation circuit comprises
a fifth switch connected to the connection portion, and
a capacitive element having a capacitance value Cs, said capacitive element normally removing stored charges and, upon being connected to the connection portion through said fifth switch, charging the connection portion.

26. A device according to claim 1, wherein
said signal generation circuit comprises a capacitive element having a first terminal connected to the connection portion and a second terminal, said capacitive element having a capacitance value, and
said signal generation circuit sets the second terminal of said capacitive element at a first potential while said capacitance detection element is charged and then changes the second terminal to a second potential to make said capacitance detection element to generate a voltage signal.

27. A device according to claim 26, wherein
letting Cp be a parasitic capacitance value generated in the first terminal of said capacitive element, and Cfv and Cfr be maximum and minimum capacitance values of said capacitance detection element, respectively, the capacitance value Cs of said capacitive element is set to be $\{(Cfv+Cp)(Cfr+Cp)\}^{1/2}$.

28. A device according to claim 26, wherein
the capacitance value of said capacitive element is set to be not more than a maximum value of a capacitance value of said capacitance detection element.

29. A device according to claim 26, wherein
the capacitance value of said capacitive element has a range from 10 fF to 250 fF.

30. A device according to claim 1, wherein
said output circuit comprises a voltage-time conversion circuit for converting an input voltage signal into a time signal.

31. A device according to claim 30, further comprising a threshold adjusting circuit for adjusting a threshold voltage of said voltage-time conversion circuit.

32. A device according to claim 31, wherein
said voltage-time conversion circuit comprises a variable threshold circuit, and
said threshold adjusting circuit adjusts a threshold voltage of said variable threshold circuit.

33. A device according to claim 32, wherein
said variable threshold circuit comprises a Schmidt trigger circuit.

34. A device according to claim 32, wherein
said variable threshold circuit comprises an element for determining the threshold voltage value, and
said threshold adjusting circuit adjusts a potential of at least one of nodes of said element.

35. A device according to claim 34, wherein
said device further comprises, as elements for determining the threshold voltage value, a plurality of conductive elements for dividing a voltage, applied to the node, by an ON resistance ratio, and
said threshold adjusting circuit controls a value of the voltage to be applied to the node of said element and determines the threshold voltage value using the divided voltage divided by said plurality of conductive elements.

36. A device according to claim 34, further comprising at least one conductive element added between the node and a power supply voltage of said variable threshold circuit.

37. A device according to claim 34, wherein
said device further comprises, as elements for determining the threshold voltage value, a plurality of conductive elements for dividing a voltage, applied to the node, by an ON resistance ratio, and
said threshold adjusting circuit controls an ON resistance value of at least one of said conductive elements through the node and determines the threshold voltage value using the divided voltage divided by said plurality of conductive elements.

38. A device according to claim 34, wherein
the nodes for controlling the threshold voltage value from the outside of said variable threshold circuit are connected to connect a plurality of variable threshold circuits.

39. A device according to claim 38, further comprising a conductive element connected between the nodes connected to connect said plurality of variable threshold circuits and a power supply voltage of said variable threshold circuits.

40. A device according to claim 30, wherein
said voltage-time conversion circuit comprises
a variable current source whose current amount changes in accordance with the input voltage,
a capacitive element having a capacitance value charged/discharged on the basis of a current of said variable current source, and
a threshold circuit whose output voltage changes depending on whether the input voltage exceeds the threshold voltage.

41. A device according to claim 40, wherein
said threshold circuit comprises a Schmidt trigger circuit.

42. A device according to claim 1, wherein
said output circuit comprises
a first output circuit, and
a bias adjusting circuit for adjusting a threshold voltage of said first output circuit.

43. A device according to claim 42, wherein
said first output circuit has a variable threshold circuit, and
a threshold adjusting circuit for adjusting a threshold voltage of said variable threshold circuit is used as said bias adjusting circuit.

44. A device according to claim 43, wherein
said variable threshold circuit comprises a Schmidt trigger circuit.

45. A device according to claim 43, wherein
said variable threshold circuit comprises an element for determining the threshold voltage value, and
said threshold adjusting circuit adjusts a potential of at least one of nodes of said element.

46. A device according to claim 45, wherein
said device further comprises, as elements for determining the threshold voltage value, a plurality of conductive elements for dividing a voltage, applied to the node, by an ON resistance ratio, and
said threshold adjusting circuit controls a value of the voltage to be applied to the node of said element and determines the threshold voltage value using the divided voltage divided by said plurality of conductive elements.

47. A device according to claim 45, further comprising at least one conductive element added between the node and a power supply voltage of said variable threshold circuit.

48. A device according to claim 45, wherein
said device further comprises, as elements for determining the threshold voltage value, a plurality of conductive elements for dividing a voltage, applied to the node, by an ON resistance ratio, and
said threshold adjusting circuit controls an ON resistance value of at least one of said conductive elements through the node and determines the threshold voltage value using the divided voltage divided by said plurality of conductive elements.

49. A device according to claim 45, wherein
the nodes for controlling the threshold voltage value from the outside of said variable threshold circuit are connected to connect a plurality of variable threshold circuits.

50. A device according to claim 49, further comprising a conductive element connected between the nodes connected to connect said plurality of variable threshold circuits and a power supply voltage of said variable threshold circuits.

51. A device according to claim 1, wherein
said capacitance detection element detects a capacitance change corresponding to ridge and valley portions of a skin surface of a finger.

52. A small capacitance change detection device comprising:
a capacitance detection element for detecting a small capacitance change;
a signal generation circuit having an output side connected to said capacitance detection element to control predetermined charges;

an output circuit having an input side connected to a connection point between the output side of said signal generation circuit and said capacitance detection element;

a plurality of lower electrodes formed on a substrate to be insulated and isolated from each other;

an upper electrode formed to oppose said lower electrodes; and a support member formed on said substrate in units of lower electrodes to support said upper electrode, said signal generation circuit comprising setting means for setting a potential at the connection portion, and control means for controlling said upper electrode to a predetermined potential and operating said setting means to set a predetermined voltage at said lower electrode, then controlling said setting means in an inoperative state to disconnect an external voltage source from said lower electrode, and changing the potential of said upper electrode to a potential different from the predetermined potential, wherein said output circuit receives a voltage of said lower electrode based on a capacitance between said upper electrode and said lower electrode, which is generated from said capacitance detection element when said setting means is set in the inoperative state and the potential of said upper electrode changes to a potential different from the predetermined potential.

53. A device according to claim 52, wherein said setting means comprises a sixth switch connected between said external voltage source and the connection portion, and said control means controls said upper electrode to a predetermined potential and turns on said sixth switch to apply a voltage of said external voltage source to said lower electrode, then turns off said sixth switch, and changes the potential of said upper electrode changes to a potential different from the predetermined potential.

54. A device according to claim 52, wherein said control means individually controls potentials of a plurality of upper electrodes and lower electrodes.

55. A device according to claim 52, wherein said capacitance detection element detects a capacitance change corresponding to ridge and valley portions of a skin surface of a finger.

56. A small capacitance change detection device comprising:

a capacitance detection element for detecting a small capacitance change;

a signal generation circuit having an output side connected to said capacitance detection element to control predetermined charges;

an output circuit having an input side connected to a connection point between the output side of said signal generation circuit and said capacitance detection element;

a plurality of lower electrodes formed on a substrate to be insulated and isolated from each other;

an upper electrode formed to oppose said lower electrodes; and a support member formed on said substrate in units of lower electrodes to support said upper electrode, wherein said upper electrode can deform in a direction of lower electrode using said support member as a fulcrum and is held at a predetermined potential, said signal generation circuit comprises setting means for setting a potential at the connection portion, and control means for operating said setting means to set a predetermined voltage at said lower electrode and then controlling said setting means in an inoperative state to disconnect an external voltage source from said lower electrode, and said output circuit receives a voltage of said lower electrode based on a capacitance between said upper electrode and said lower electrode, which is generated when said capacitance detection element deforms after said setting means is set in the inoperative state.

57. A device according to claim 56, wherein said setting means comprises a sixth switch connected between said external voltage source and the connection portion, and said control means turns on said sixth switch to apply a voltage of said external voltage source to said lower electrode and then turns off said sixth switch.

58. A device according to claim 56, wherein said control means individually controls potentials of said plurality of lower electrodes.

59. A device according to claim 56, wherein said capacitance detection element detects a capacitance change corresponding to ridge and valley portions of a skin surface of a finger.

* * * * *